US009826215B2

(12) United States Patent
Yamazaki

(10) Patent No.: US 9,826,215 B2
(45) Date of Patent: Nov. 21, 2017

(54) STEREOSCOPIC IMAGE PICKUP UNIT, IMAGE PICKUP DEVICE, PICTURE PROCESSING METHOD, CONTROL METHOD, AND PROGRAM UTILIZING DIAPHRAGM TO FORM PAIR OF APERTURES

(71) Applicant: Sony Corporation, Tokyo (JP)

(72) Inventor: Tomohiro Yamazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/298,104

(22) Filed: Oct. 19, 2016

(65) Prior Publication Data

US 2017/0041588 A1    Feb. 9, 2017

Related U.S. Application Data

(63) Continuation of application No. 14/002,028, filed as application No. PCT/JP2012/057332 on Mar. 22, 2012, now Pat. No. 9,544,571.

(30) Foreign Application Priority Data

Mar. 29, 2011  (JP) ................................ 2011-071605
Mar. 29, 2011  (JP) ................................ 2011-071606

(51) Int. Cl.
*H04N 7/18*      (2006.01)
*H04N 13/02*     (2006.01)
(Continued)

(52) U.S. Cl.
CPC ........... *H04N 13/0225* (2013.01); *G03B 9/02* (2013.01); *G03B 35/10* (2013.01);
(Continued)

(58) Field of Classification Search
CPC ....................................................... G03B 9/02
(Continued)

(56) References Cited

U.S. PATENT DOCUMENTS 3,386,356 A  *  6/1968  Rentschler ............... G03B 7/16
                                                       396/147
3,981,565 A  *  9/1976  Karasawa .............. G02B 5/005
                                                       348/363

(Continued)

FOREIGN PATENT DOCUMENTS

EP      2 157 801 A2    2/2010
EP      2 244 484 A1   10/2010

(Continued)

OTHER PUBLICATIONS

European Patent Communication pursuant to Article 94(3) EPC issued Aug. 16, 2016 for corresponding European Application No. 12 764 074.6-1903.

(Continued)

*Primary Examiner* — Leron Beck
(74) *Attorney, Agent, or Firm* — Michael Best & Friedrich LLP

(57) ABSTRACT

An image pickup unit, an image pickup device, a picture processing method, a diaphragm control method, and program are capable of suppressing deterioration in quality of a stereoscopic picture. A parallax detection pixel receives object light by a plurality of photodetectors covered with one microlens, to generate a signal used for detecting parallax. G pixels, an R pixel, and a B pixel each receive the object light to generate a signal used for generating a planar picture. A parallax detection section detects parallax based on the signal generated by the parallax detection pixels. A 2D picture generation section generates a planar picture based on a signal generated by picture generation pixels. A 3D picture generation section adjusts a position of each (Continued)

object image included in the planar picture, based on the detected parallax, to generate a stereoscopic picture.

14 Claims, 33 Drawing Sheets

(51) Int. Cl.
    H01L 27/146    (2006.01)
    H04N 9/04     (2006.01)
    H04N 5/369    (2011.01)
    G03B 9/02     (2006.01)
    G03B 35/10    (2006.01)
    H04N 5/232    (2006.01)
    H04N 13/00    (2006.01)

(52) U.S. Cl.
    CPC .. *H01L 27/14621* (2013.01); *H01L 27/14625* (2013.01); *H01L 27/14627* (2013.01); *H04N 5/23212* (2013.01); *H04N 5/3696* (2013.01); *H04N 9/045* (2013.01); *H04N 13/0217* (2013.01); *H04N 2013/0081* (2013.01)

(58) Field of Classification Search
    USPC .......................................................... 348/48
    See application file for complete search history.

(56) References Cited

U.S. PATENT DOCUMENTS

| | | | | |
|---|---|---|---|---|
| 4,067,638 | A * | 1/1978 | Yano ................. | G03H 1/268 359/22 |
| 4,113,359 | A * | 9/1978 | Koike ................. | G03B 9/06 250/229 |
| 4,222,653 | A * | 9/1980 | Beiser ................. | G02B 27/2207 396/324 |
| 4,829,382 | A * | 5/1989 | Hess ................... | H04N 5/2351 348/364 |
| 5,831,775 | A * | 11/1998 | Matsui ............... | G02B 27/0068 359/684 |
| 6,028,306 | A * | 2/2000 | Hayashi ............. | G02B 21/0032 250/235 |
| 6,220,730 | B1 * | 4/2001 | Hewlett .............. | F21V 11/08 345/31 |
| 6,348,994 | B1 * | 2/2002 | Geier .................. | G02B 21/22 348/E13.007 |
| 6,396,873 | B1 * | 5/2002 | Goldstein ........... | G02B 21/22 250/201.7 |
| 6,533,473 | B1 * | 3/2003 | Edamitsu ............ | G03B 9/08 348/362 |
| 6,984,078 | B2 * | 1/2006 | Inoue .................. | G03B 9/02 348/342 |
| 7,118,227 | B2 * | 10/2006 | Sannohe ............. | G02B 5/005 348/771 |
| 7,250,973 | B2 * | 7/2007 | Dobashi ............. | H01L 27/14621 348/336 |
| 8,111,320 | B2 * | 2/2012 | Drazic ................ | G02B 27/0075 348/222.1 |
| 8,284,293 | B2 * | 10/2012 | Del Monte ......... | H01L 27/14627 348/335 |
| 8,648,948 | B2 * | 2/2014 | Rafferty ............. | H04N 5/35563 348/272 |
| 2001/0048474 | A1 * | 12/2001 | Yamazaki .......... | H04N 5/23212 348/207.99 |
| 2002/0024648 | A1 * | 2/2002 | Tani ................... | G03B 27/72 355/69 |
| 2003/0133028 | A1 * | 7/2003 | Morinaka ........... | H04N 9/045 348/273 |
| 2004/0066555 | A1 * | 4/2004 | Nomura .............. | G02B 27/2228 359/462 |
| 2005/0140820 | A1 | 6/2005 | Takeuchi et al. | |
| 2006/0023174 | A1 | 2/2006 | Kang et al. | |
| 2006/0050398 | A1 * | 3/2006 | Gurevich ............ | G02B 3/0056 359/622 |
| 2007/0109620 | A1 * | 5/2007 | Saishu ................ | G02B 27/2214 359/23 |
| 2007/0189396 | A1 * | 8/2007 | Kitahara ............. | H04N 19/597 375/240.26 |
| 2009/0219432 | A1 * | 9/2009 | Palum ................ | G02B 27/2214 348/340 |
| 2010/0046802 | A1 * | 2/2010 | Watanabe ........... | G01S 17/36 382/106 |
| 2010/0128152 | A1 * | 5/2010 | Hayasaka ........... | G02B 3/0056 348/280 |
| 2010/0183197 | A1 * | 7/2010 | Aikawa .............. | G01B 11/026 382/106 |
| 2010/0245546 | A1 * | 9/2010 | Kuroki ............... | G03B 35/10 348/49 |
| 2011/0149100 | A1 * | 6/2011 | Narabu ............... | G06T 1/0007 348/222.1 |
| 2012/0033120 | A1 * | 2/2012 | Nakamura .......... | H04N 5/23212 348/302 |
| 2013/0215343 | A1 * | 8/2013 | Lo ...................... | H04N 13/0404 349/15 |
| 2013/0222546 | A1 * | 8/2013 | Takahashi .......... | H01L 27/14623 348/46 |

FOREIGN PATENT DOCUMENTS

| | | |
|---|---|---|
| EP | 2 278 820 A2 | 1/2011 |
| JP | 2004-309868 | 11/2004 |
| JP | 2009-165115 | 7/2009 |
| JP | 2009-165613 A | 7/2009 |
| JP | 2010-041720 | 2/2010 |
| JP | 2010-050707 A | 3/2010 |
| JP | 2010-056865 A | 3/2010 |
| JP | 2010-252277 A | 11/2010 |
| JP | 2010-268443 A | 11/2010 |
| WO | WO-80/01209 A1 | 6/1980 |
| WO | WO-2010/071173 A1 | 6/2010 |
| WO | WO-2010/122702 A1 | 10/2010 |

OTHER PUBLICATIONS

International Search Report; International Application No. PCT/JP2012/057332; International Filing Date: Mar. 22, 2012; Completion of the International Search Report: dated Jun. 5, 2012. (PCT/ISA/2010).
Written Opinion of the Interntional Searching Authority; International Application No. PCT/JP2012/057332; International Filing Date: Mar. 22, 2012; dated Jun. 19, 2012. (Form PCT/ISA/220 and PCT/ISA/237).
European Patent Office Communication Pursuant to Rule 164 (1) dated Dec. 3, 2014 for corresponding European Application No. 12764074.6.
Extended European Search Report dated Apr. 10, 2015 for corresponding European Application No. 12764074.6.
Japanese Office Action dated Mar. 17, 2015 for corresponding Japanese Application No. 2011-071605.
Japanese Office Action dated Mar. 17, 2015 for corresponding Japanese Application No. 2011-071606.

* cited by examiner

[FIG. 1]
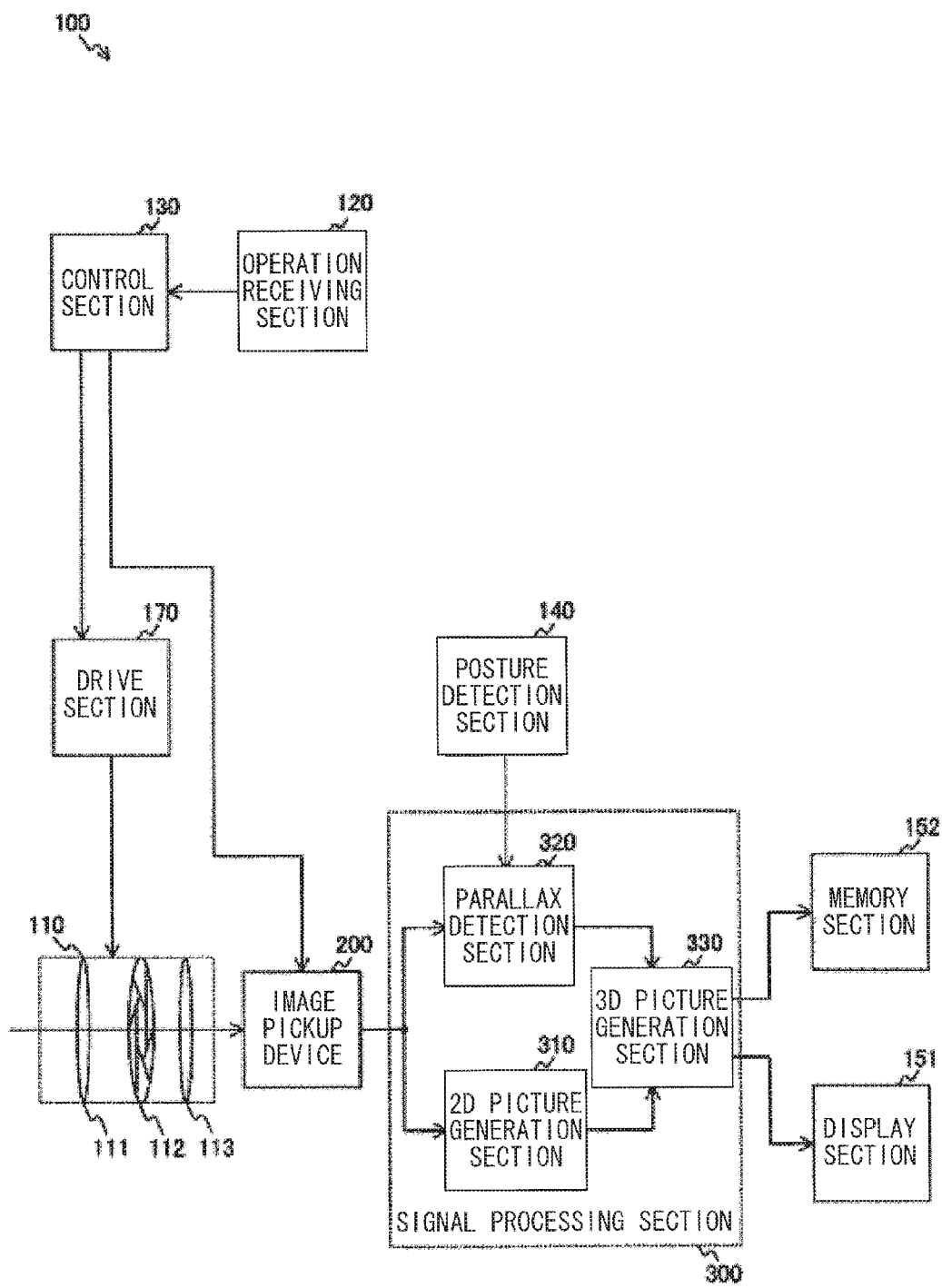

[FIG. 2]
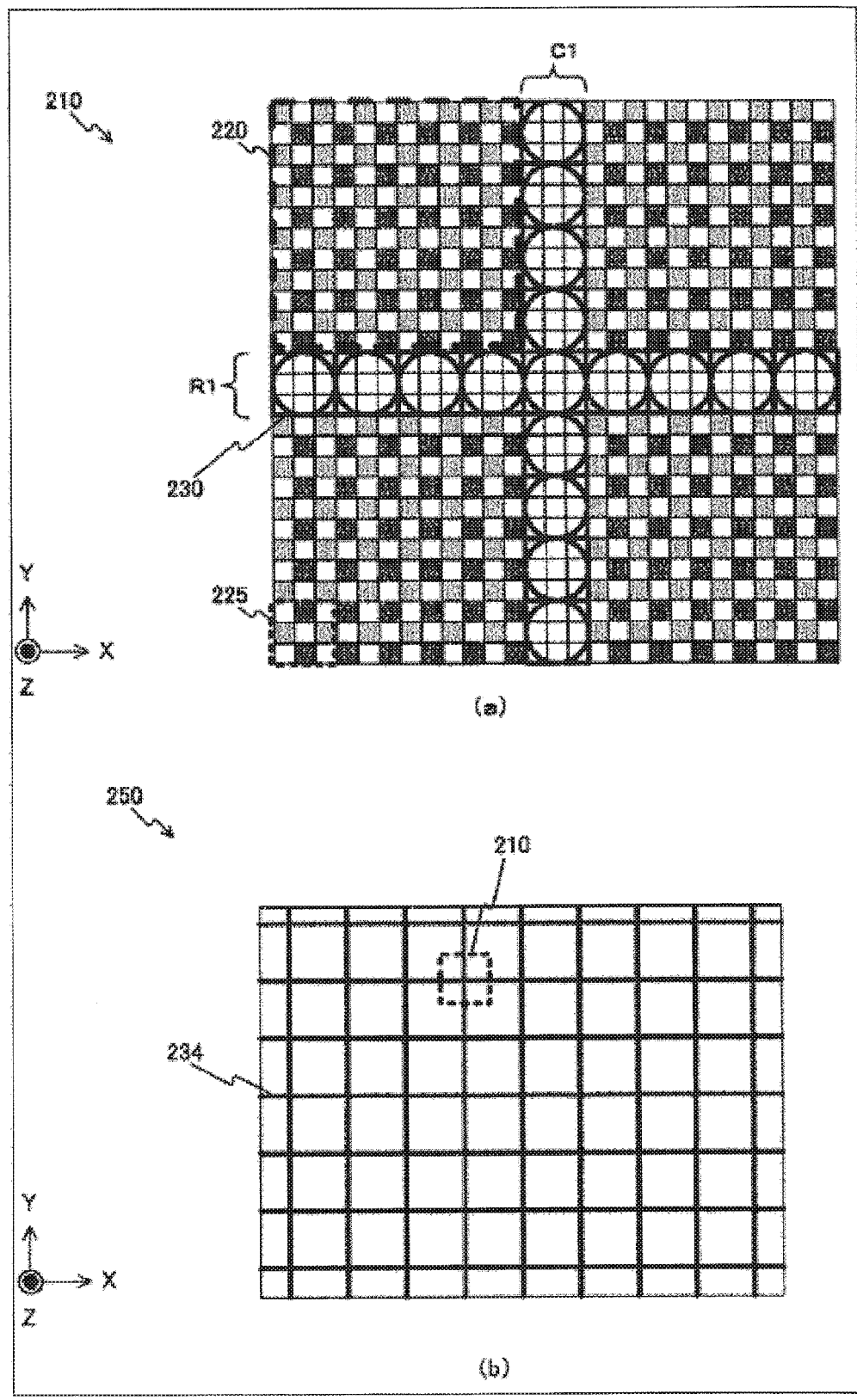

[FIG. 3]
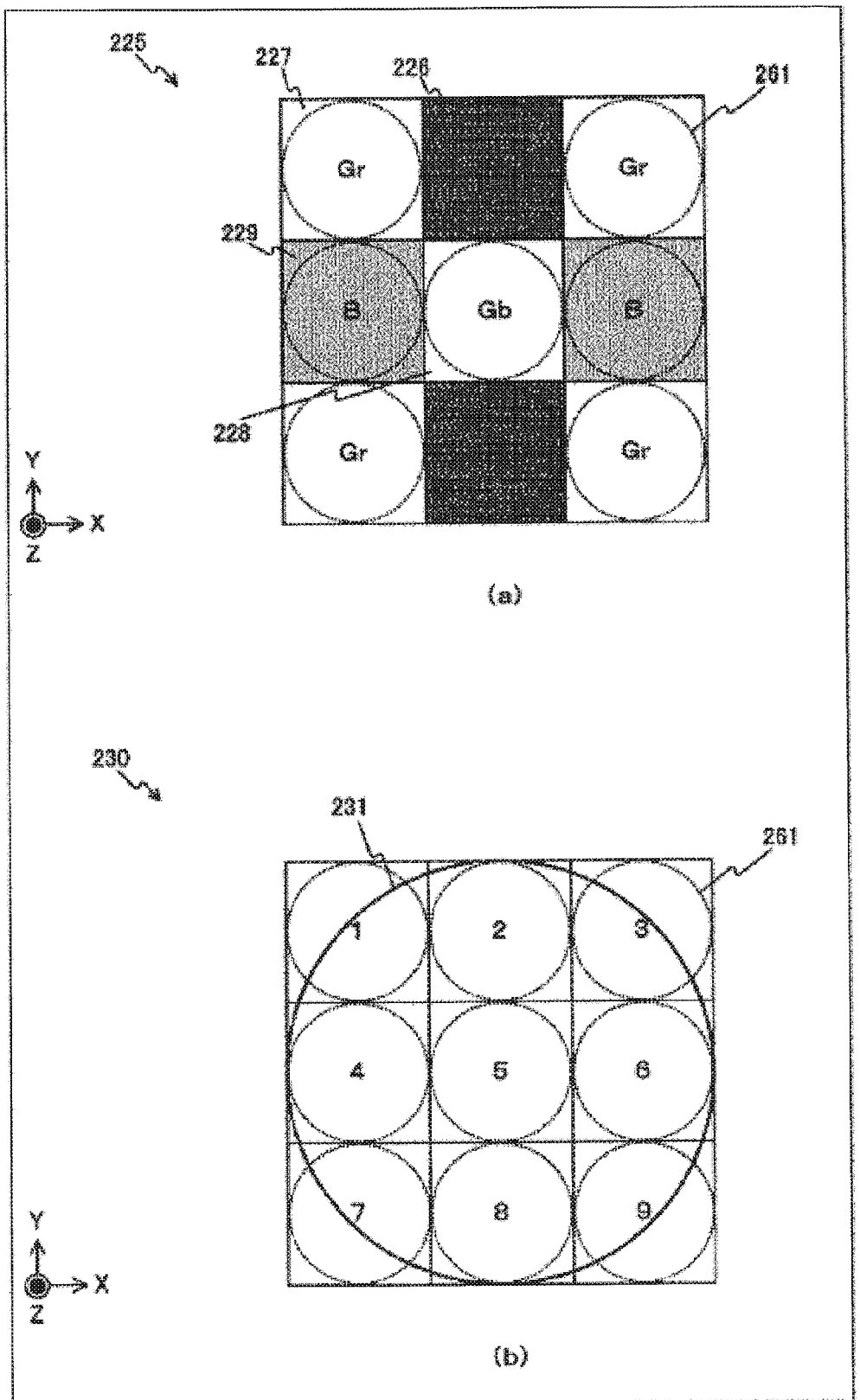

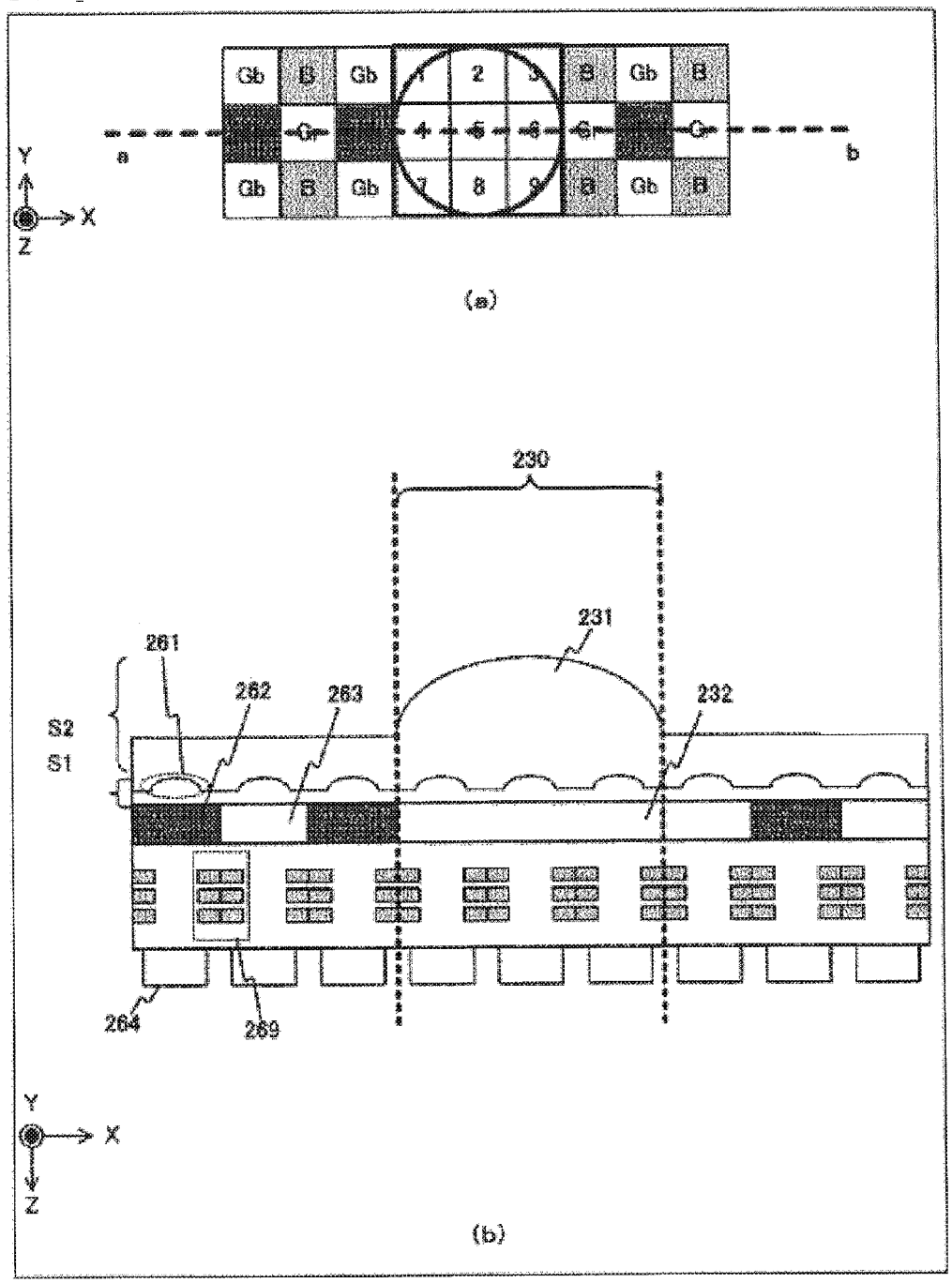
[FIG. 4]

[FIG. 5]
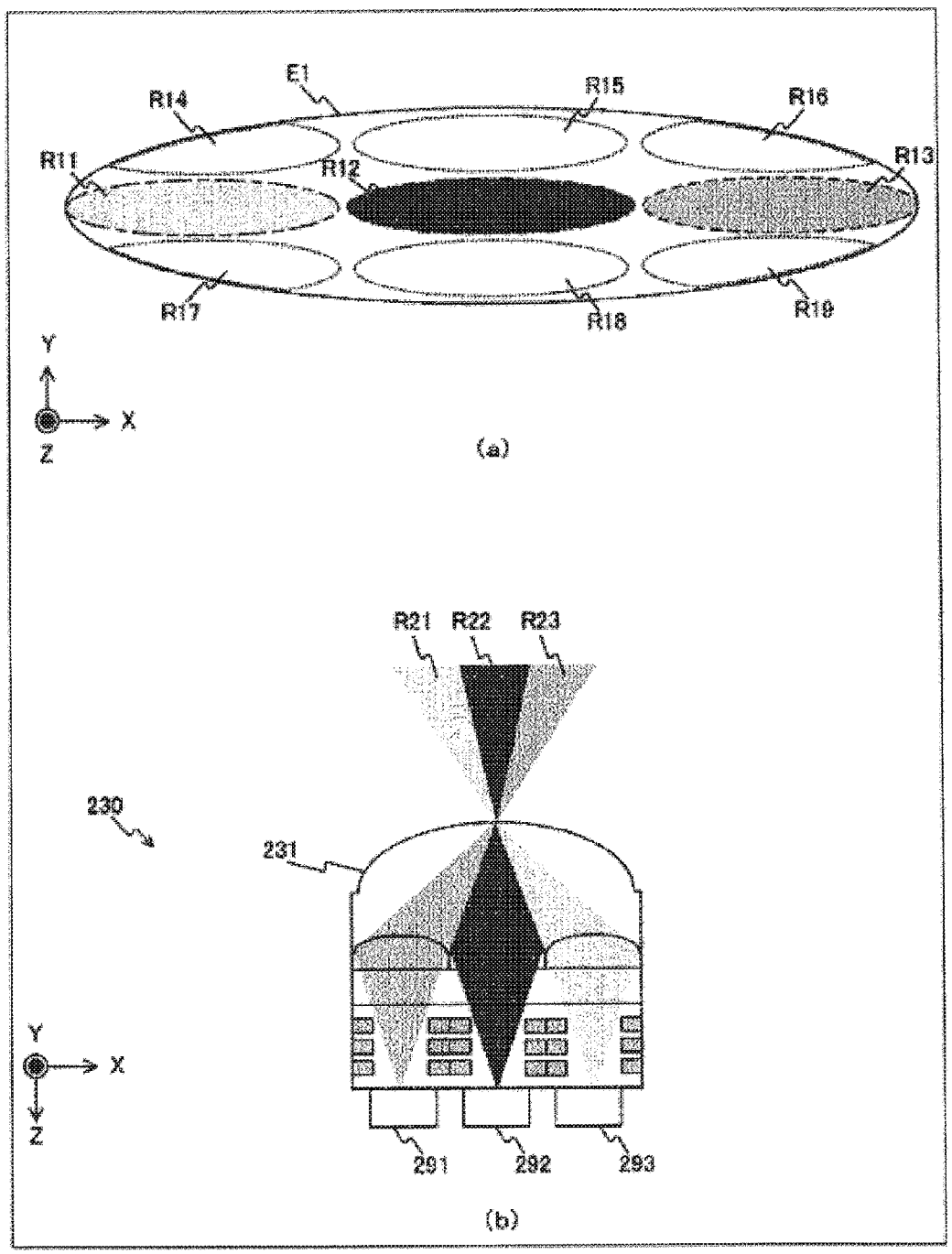

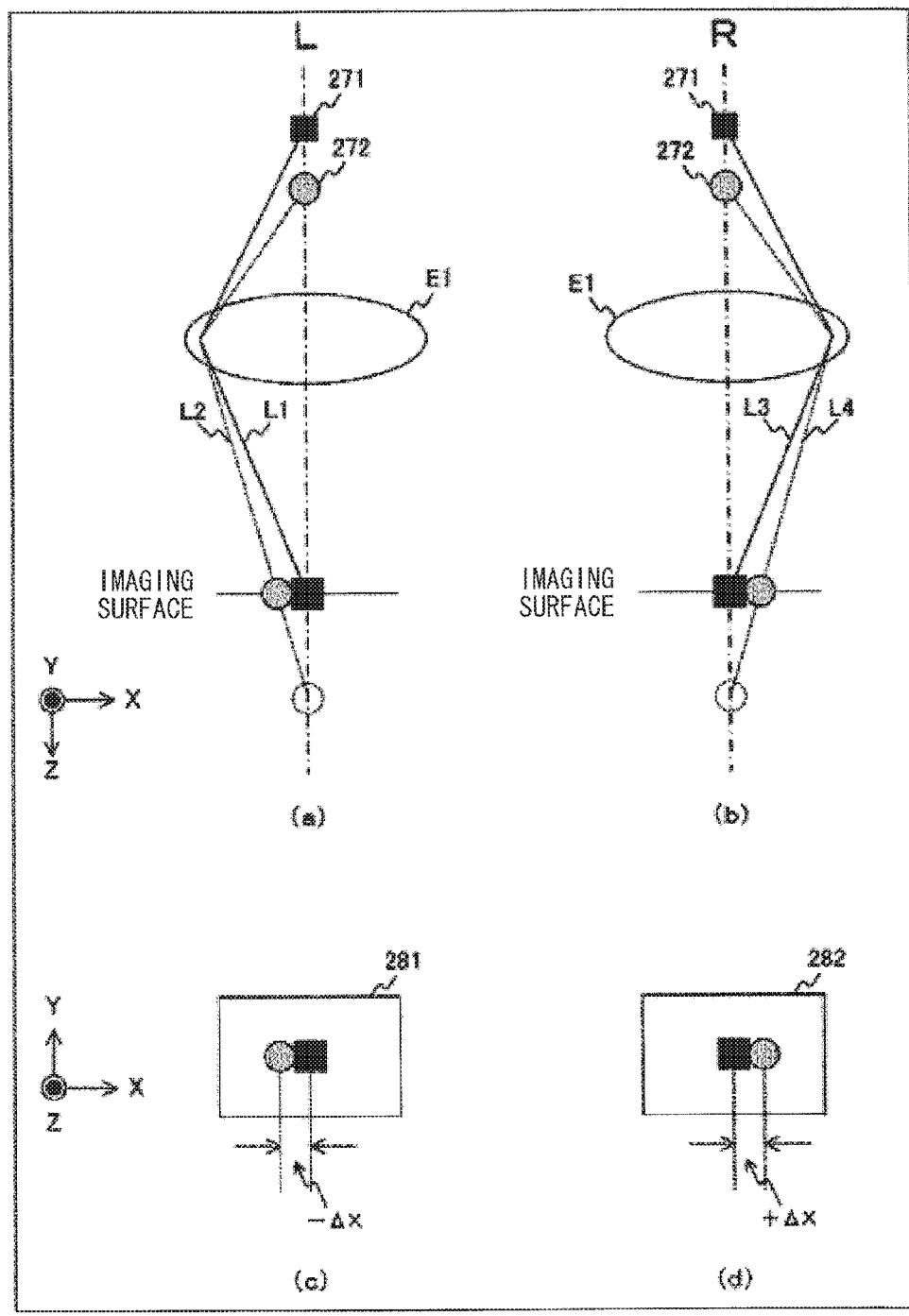

[ FIG. 7 ]
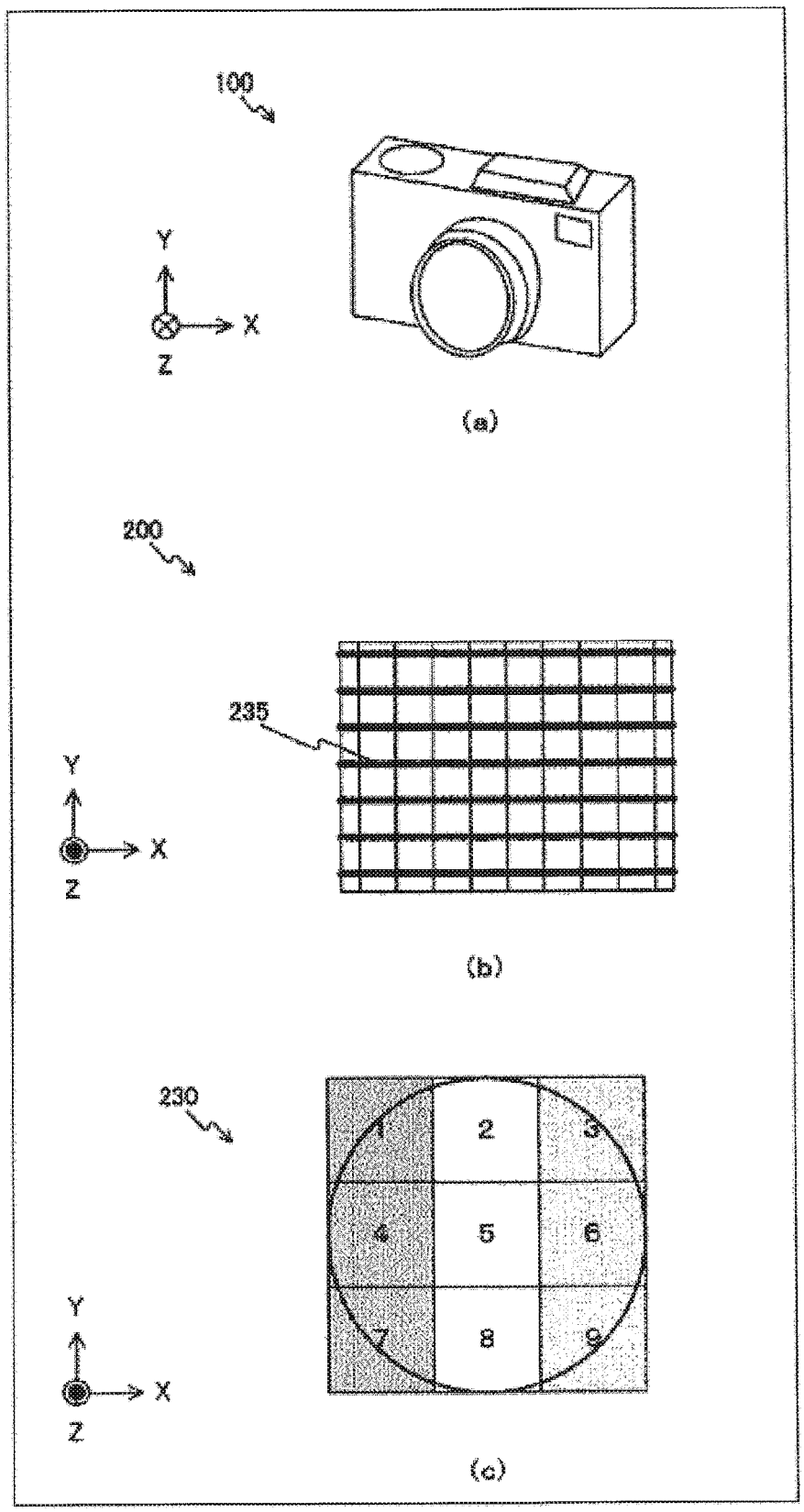

[ FIG. 8 ]
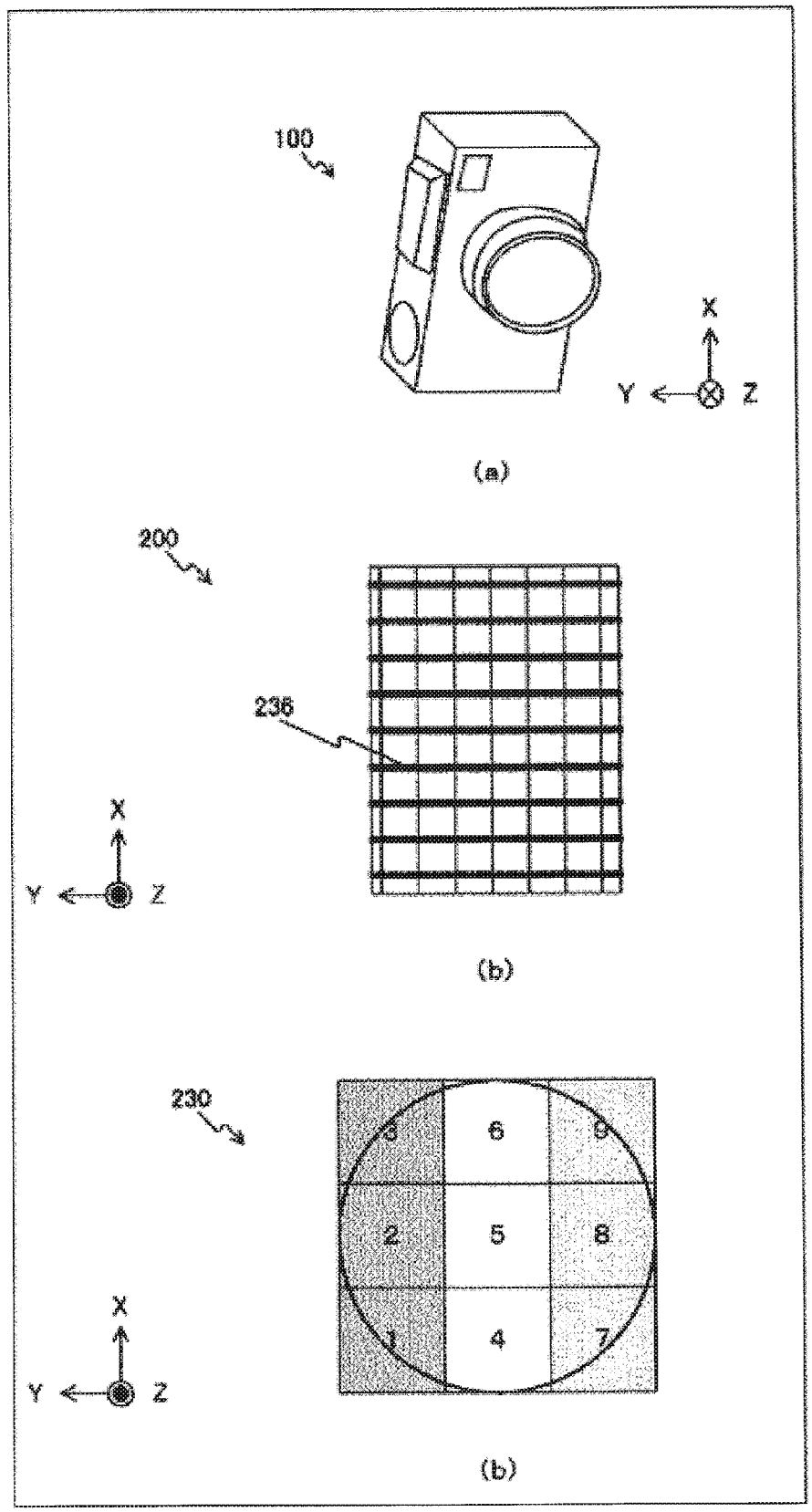

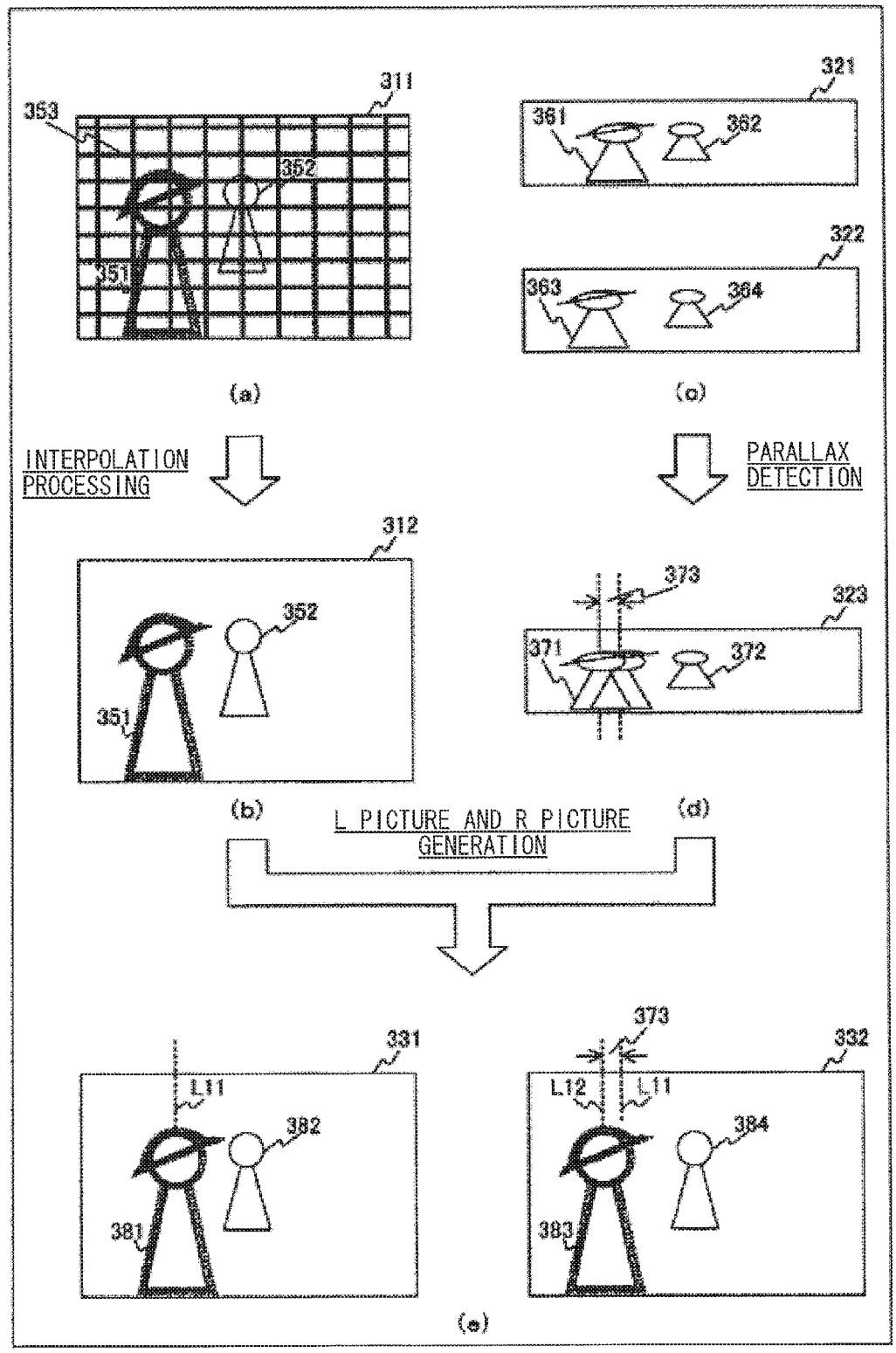

[ FIG. 10 ]
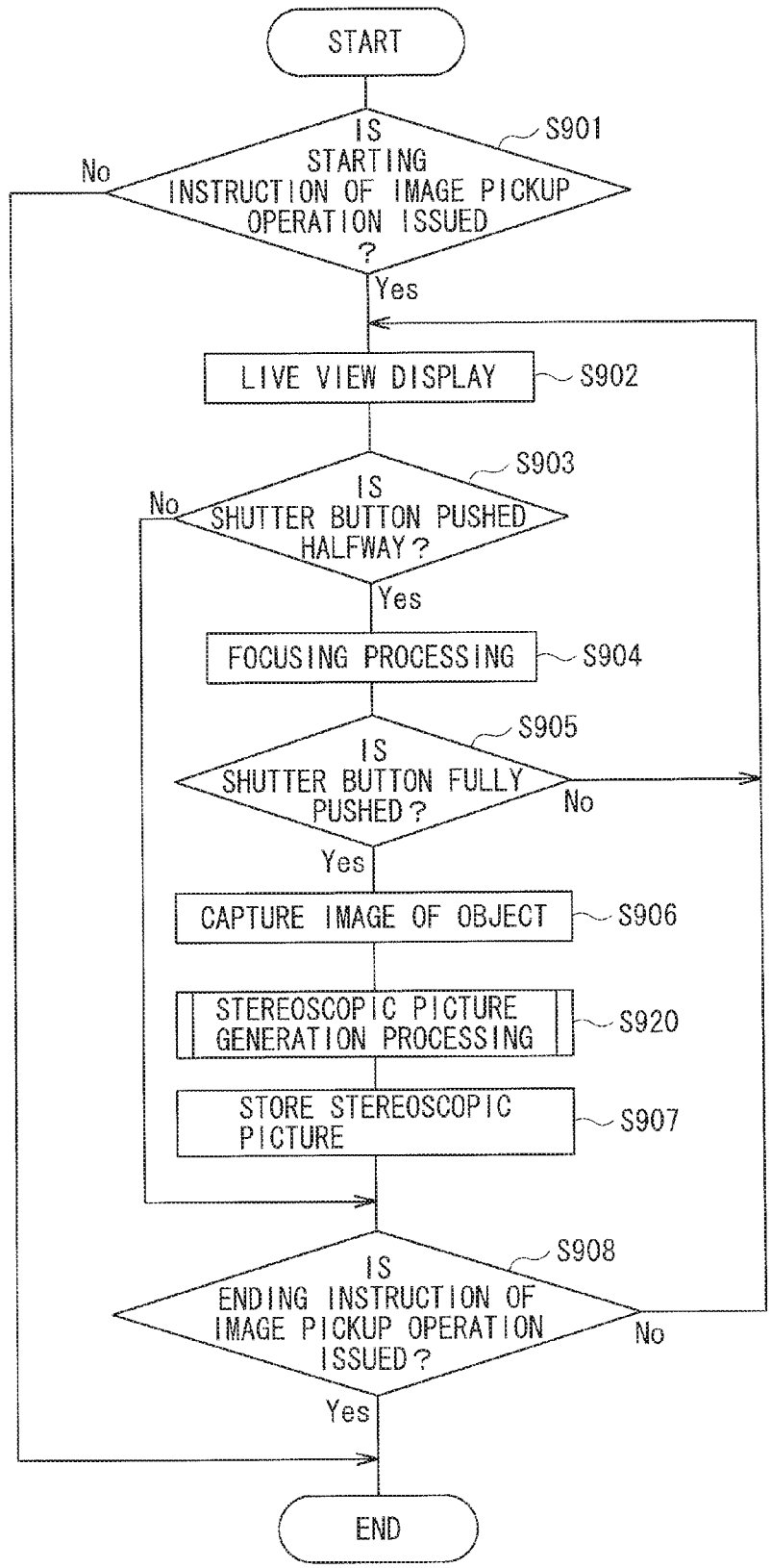

[ FIG. 11 ]
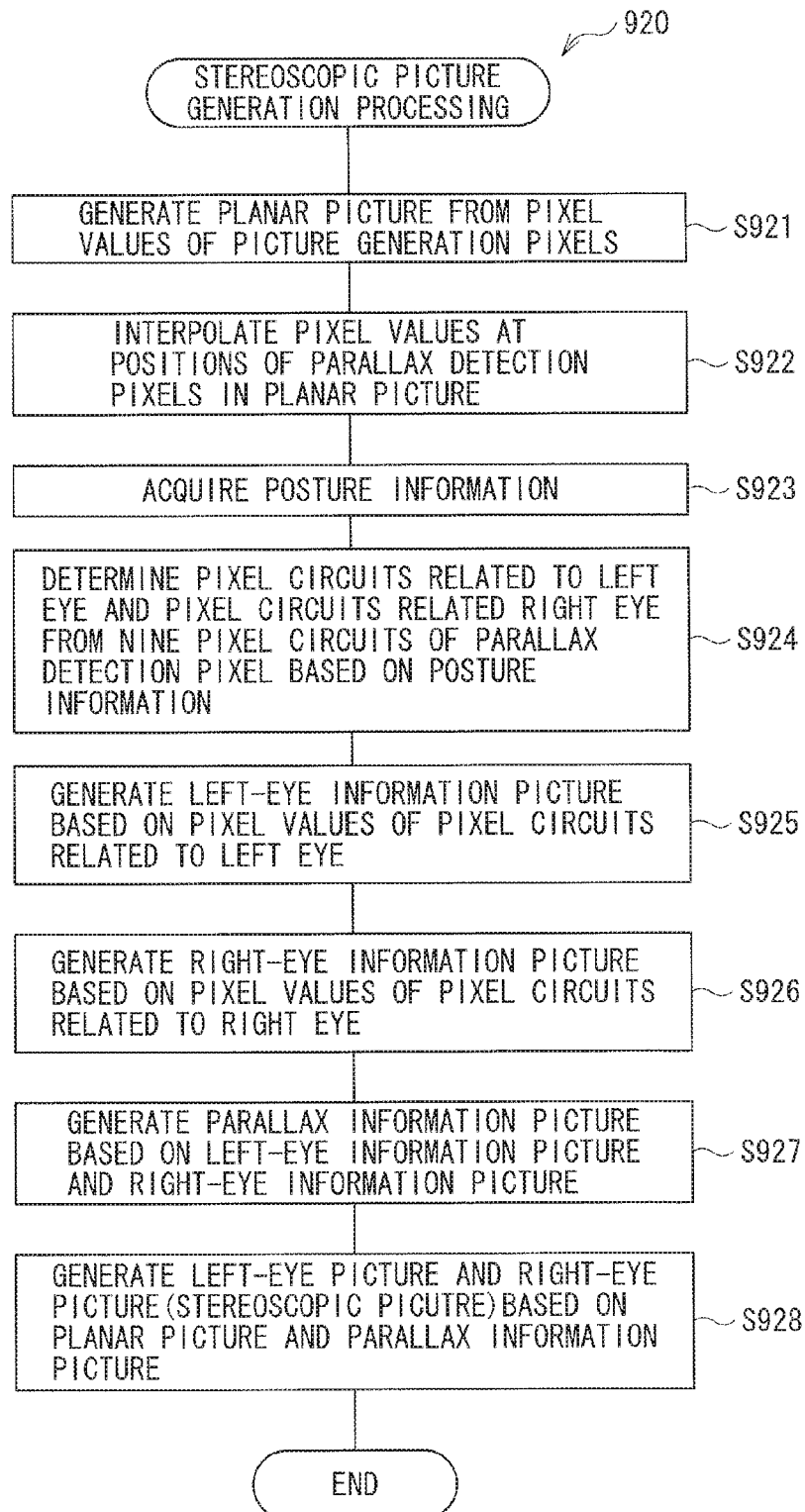

[ FIG. 12 ]
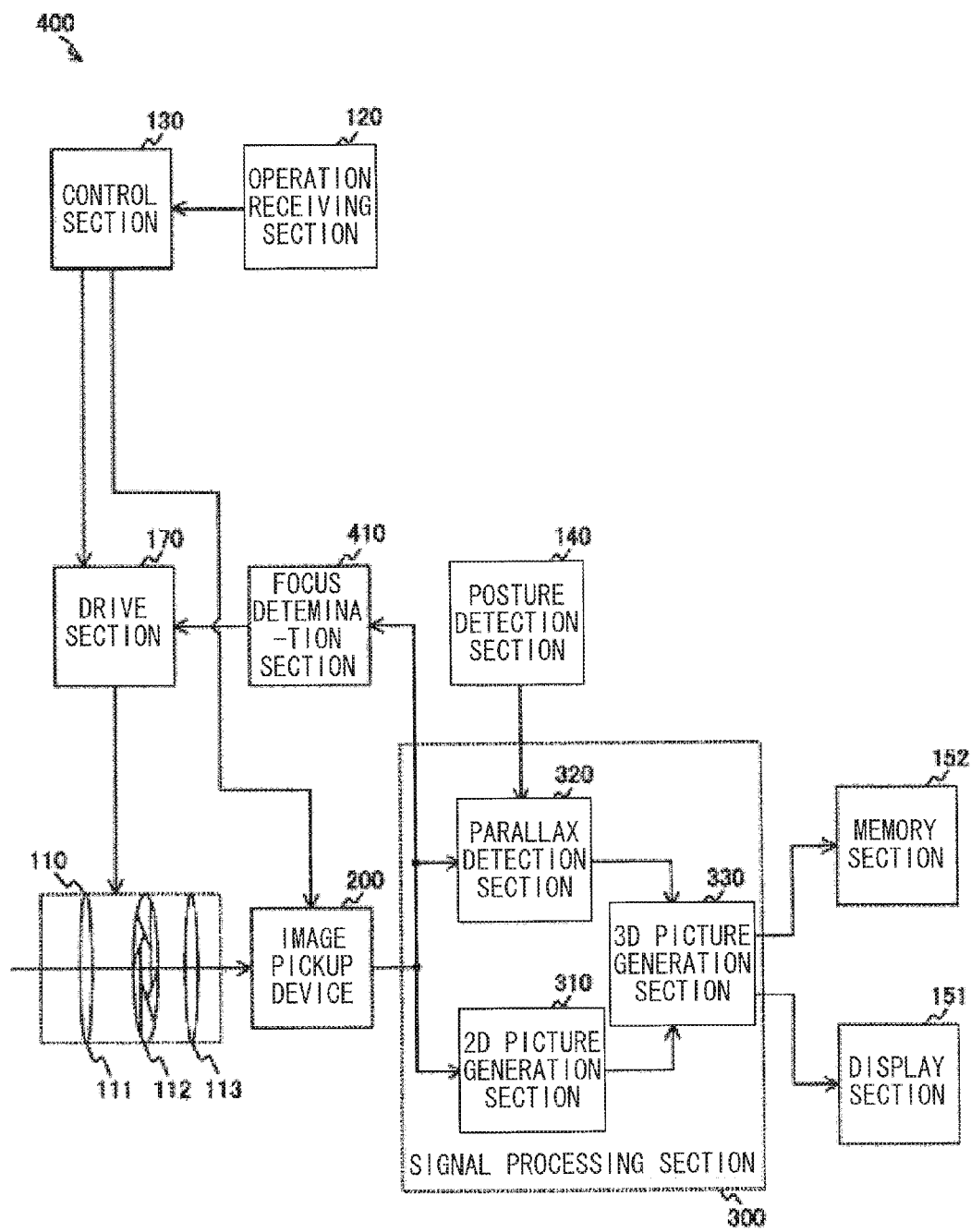

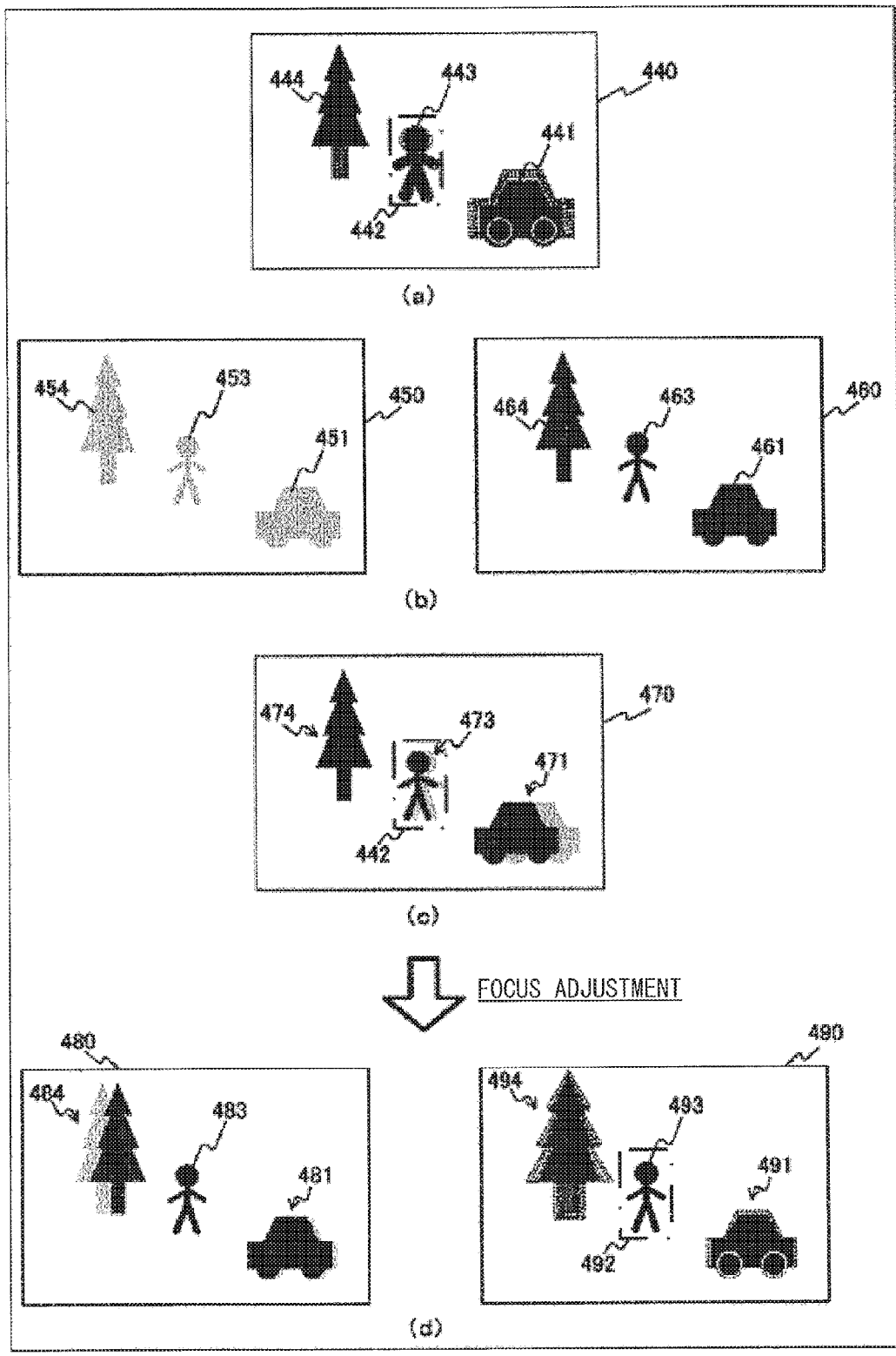
[FIG. 13]

[ FIG. 14 ]
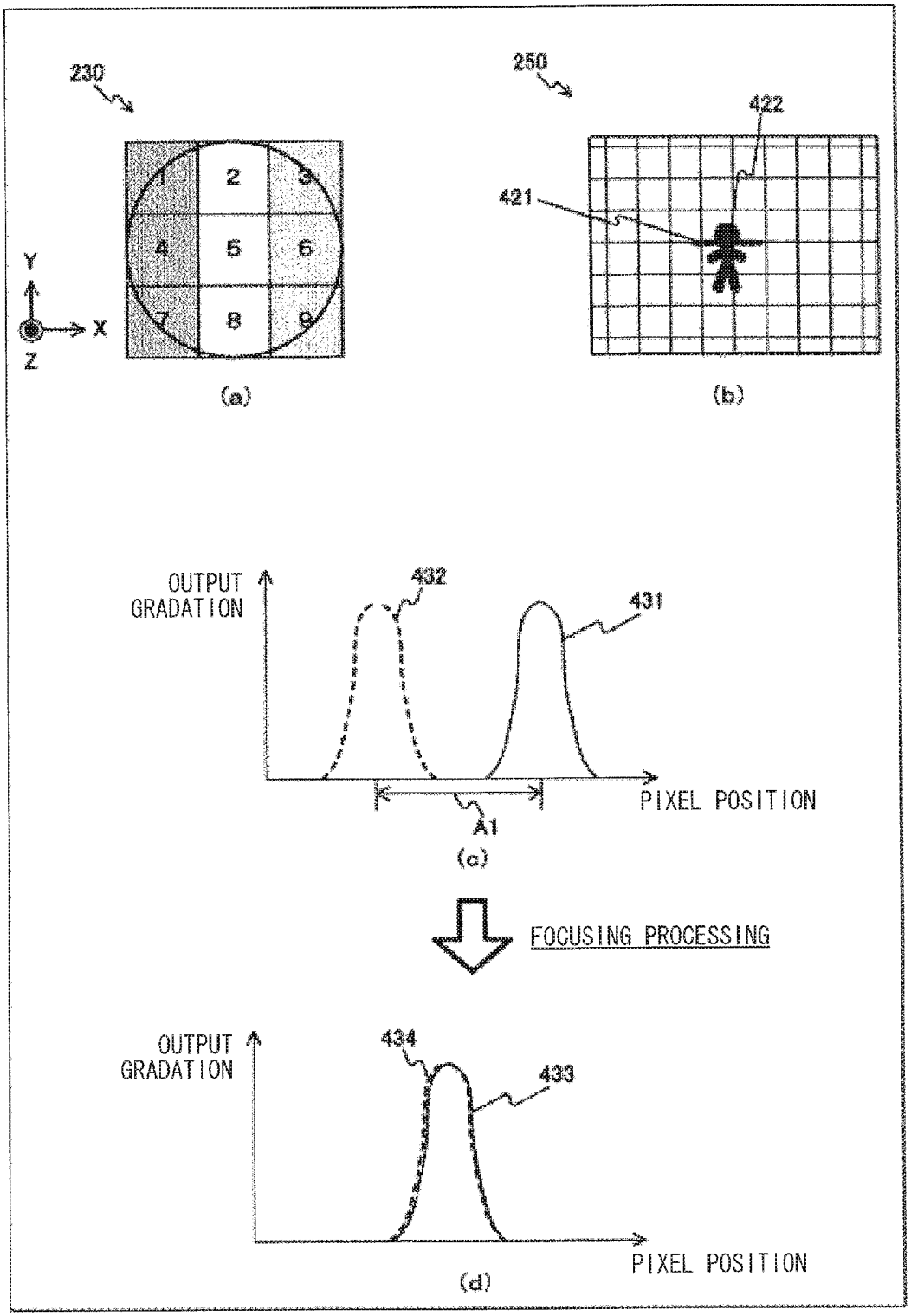

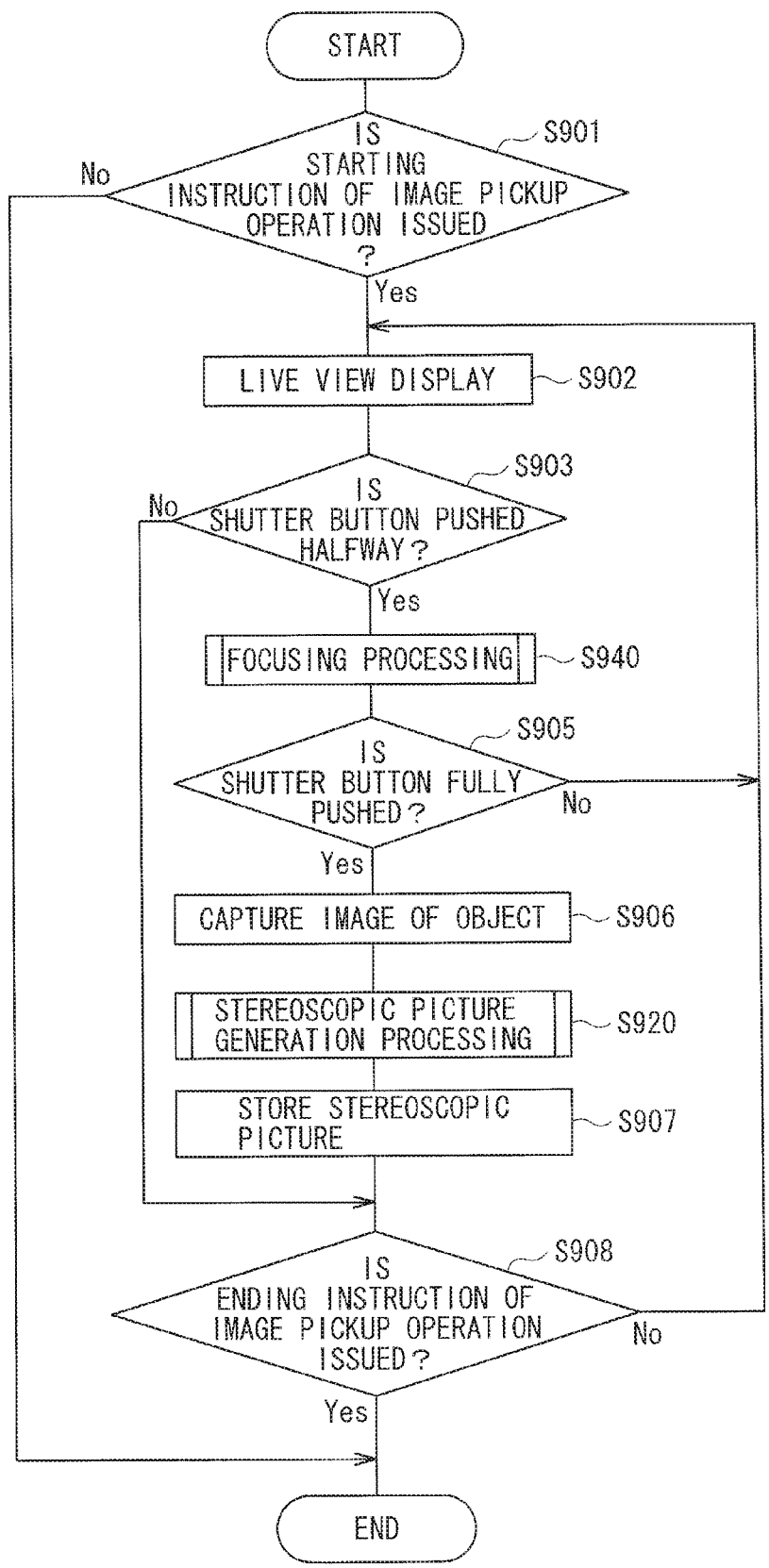
[FIG. 15]

[ FIG. 16 ]
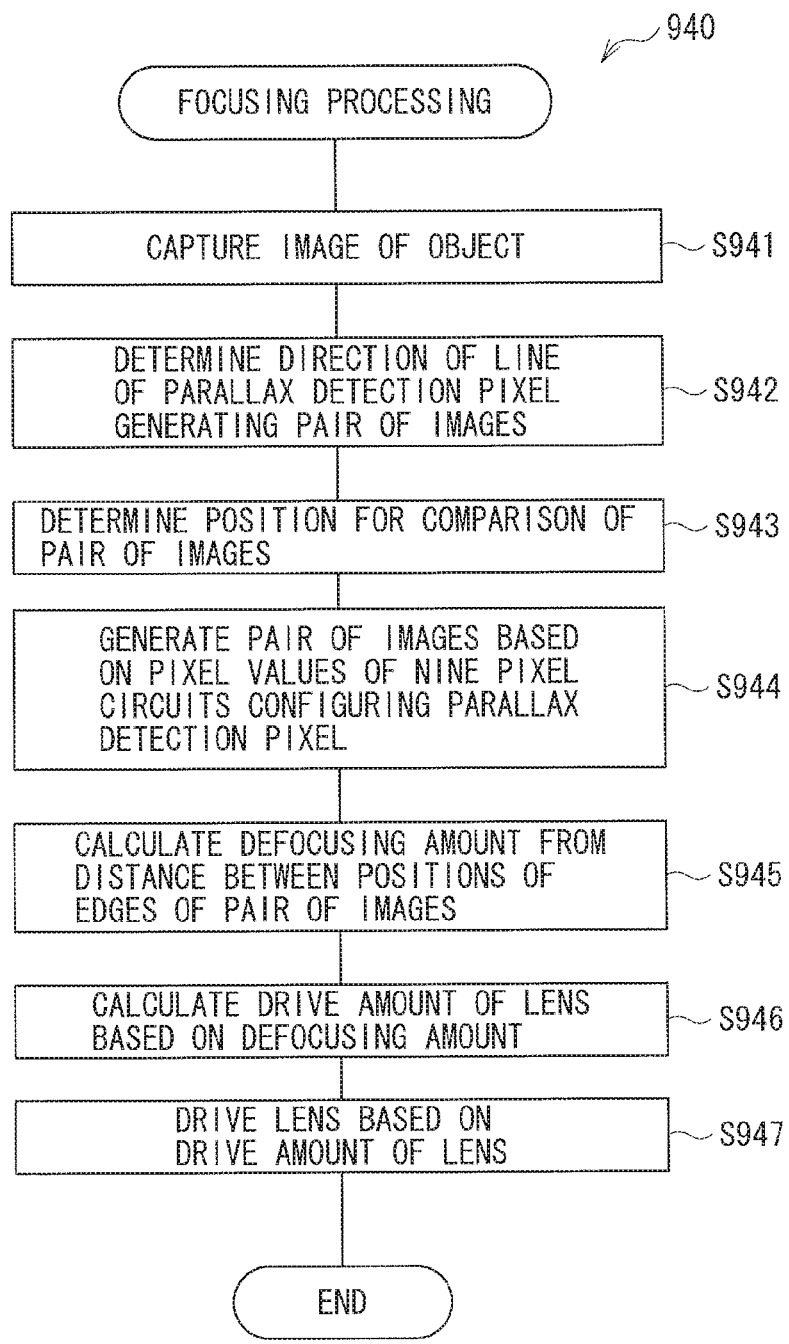

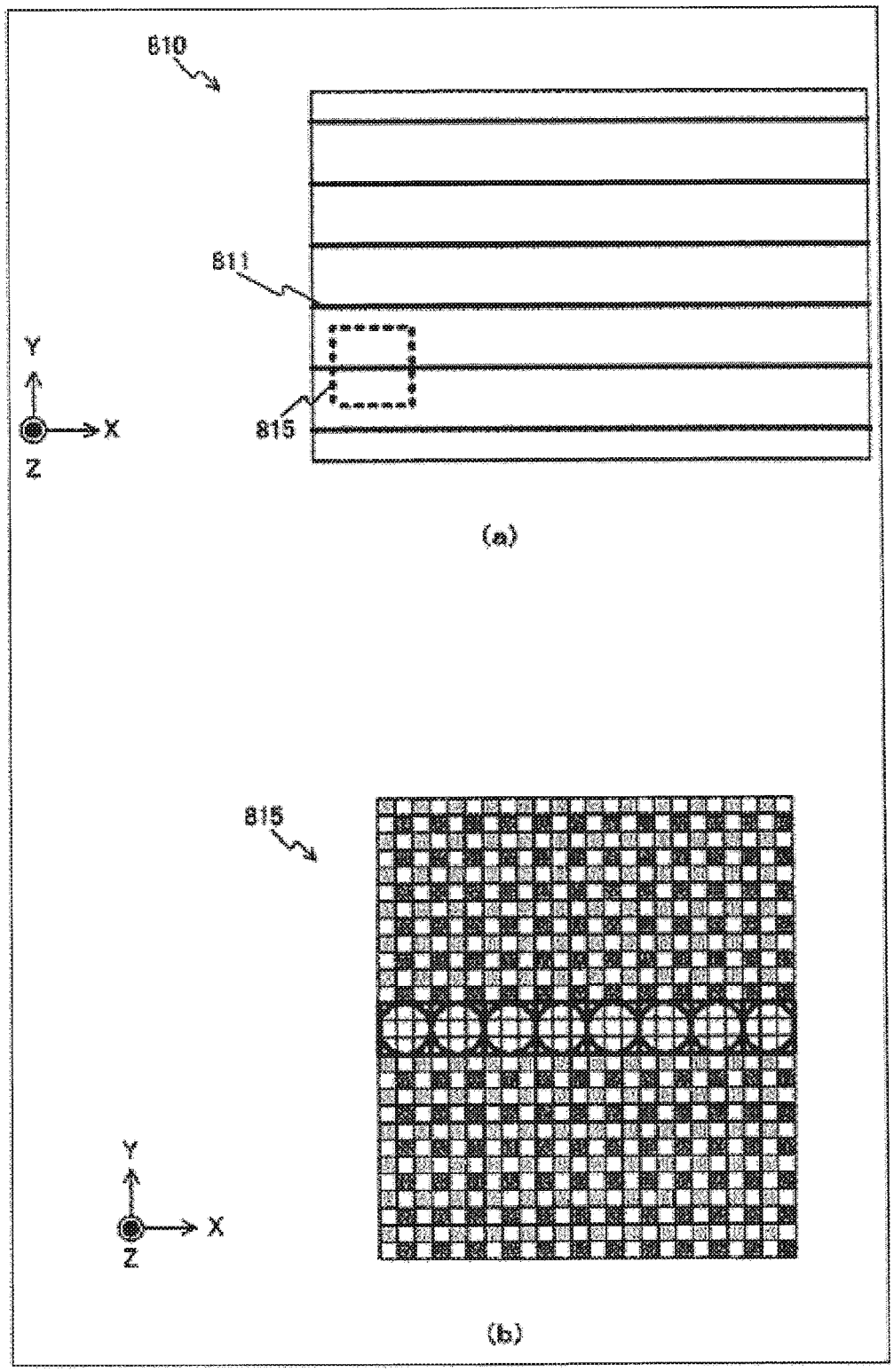
[FIG. 17]

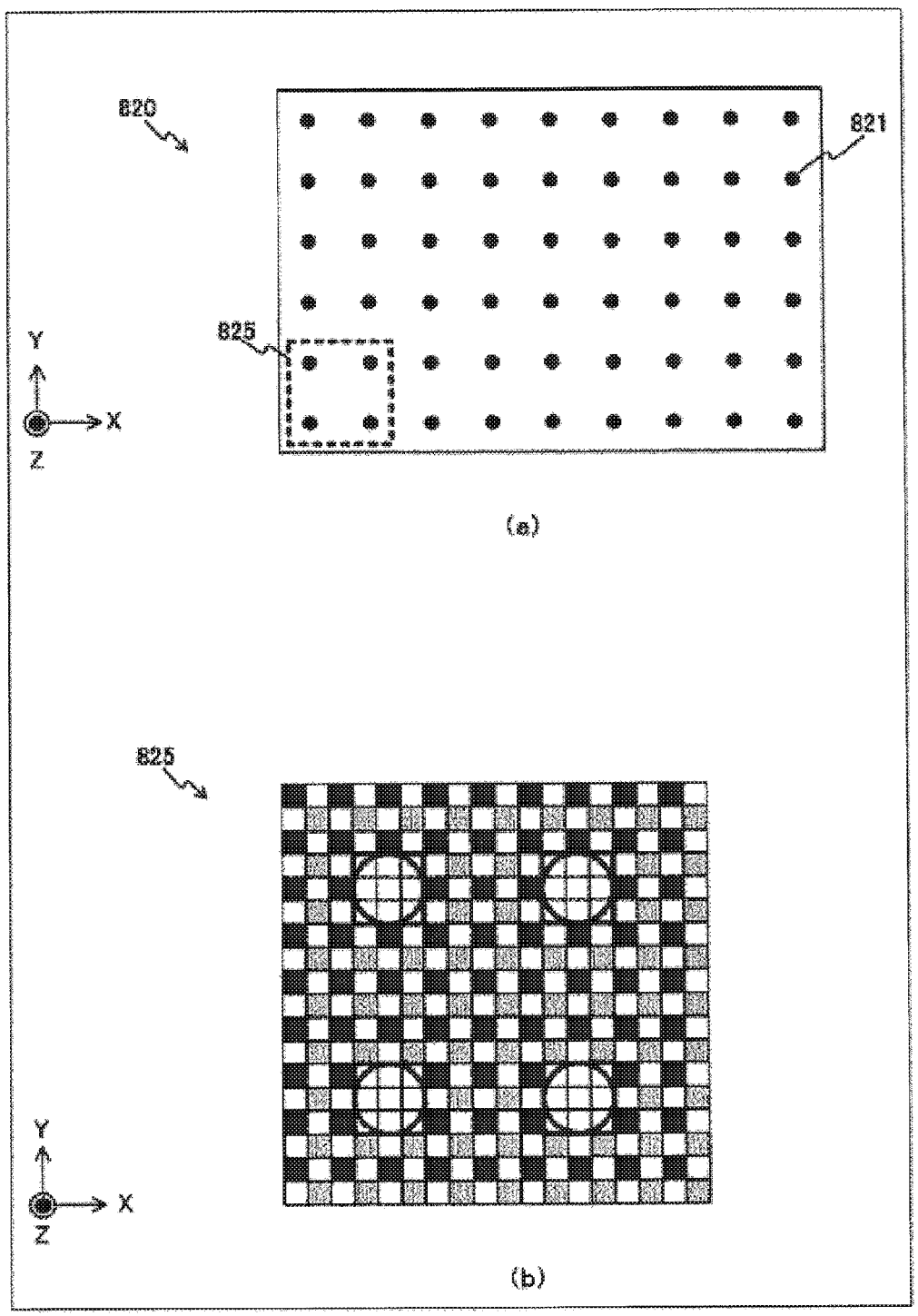
[FIG. 18]

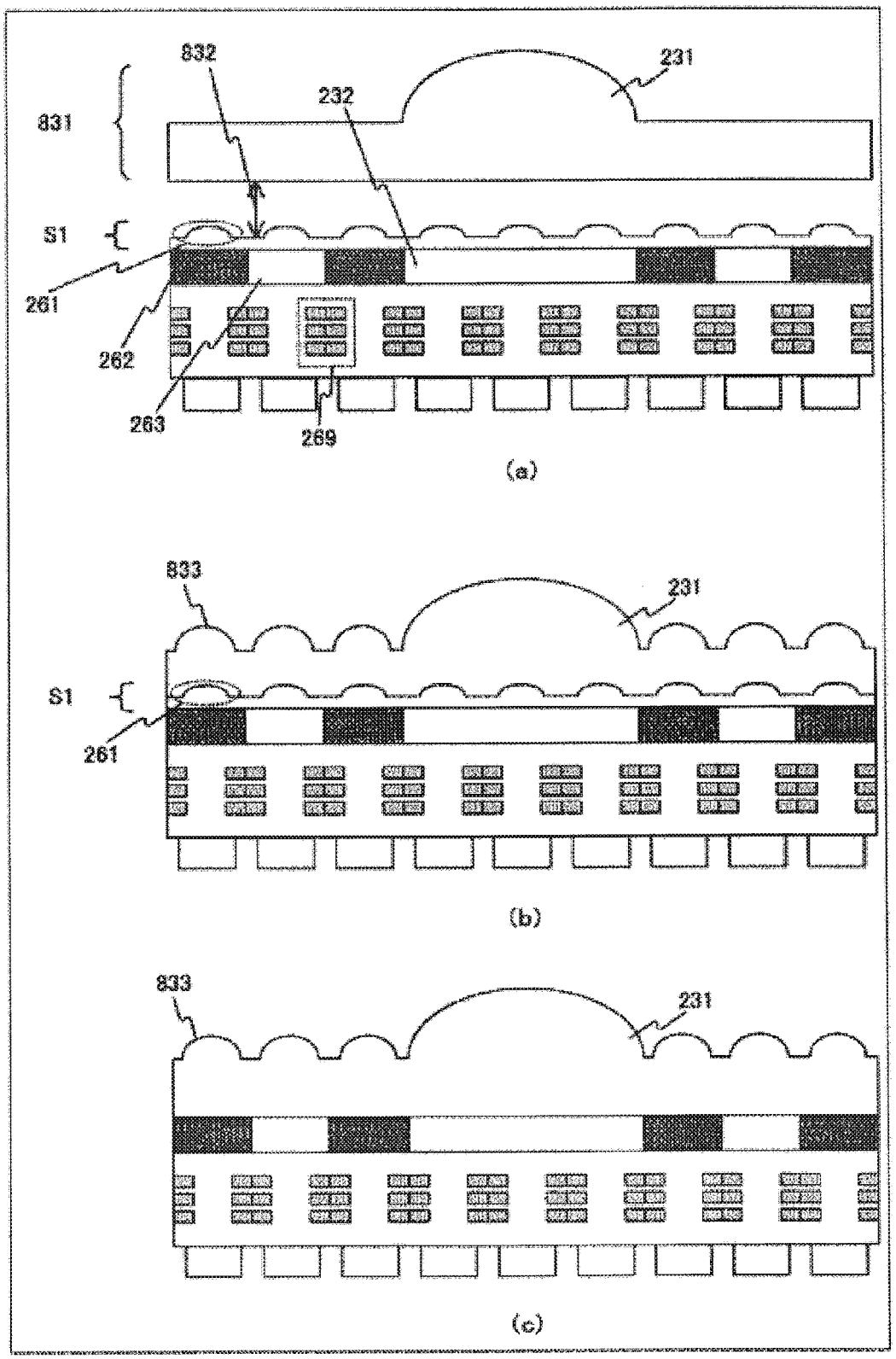
[FIG. 19]

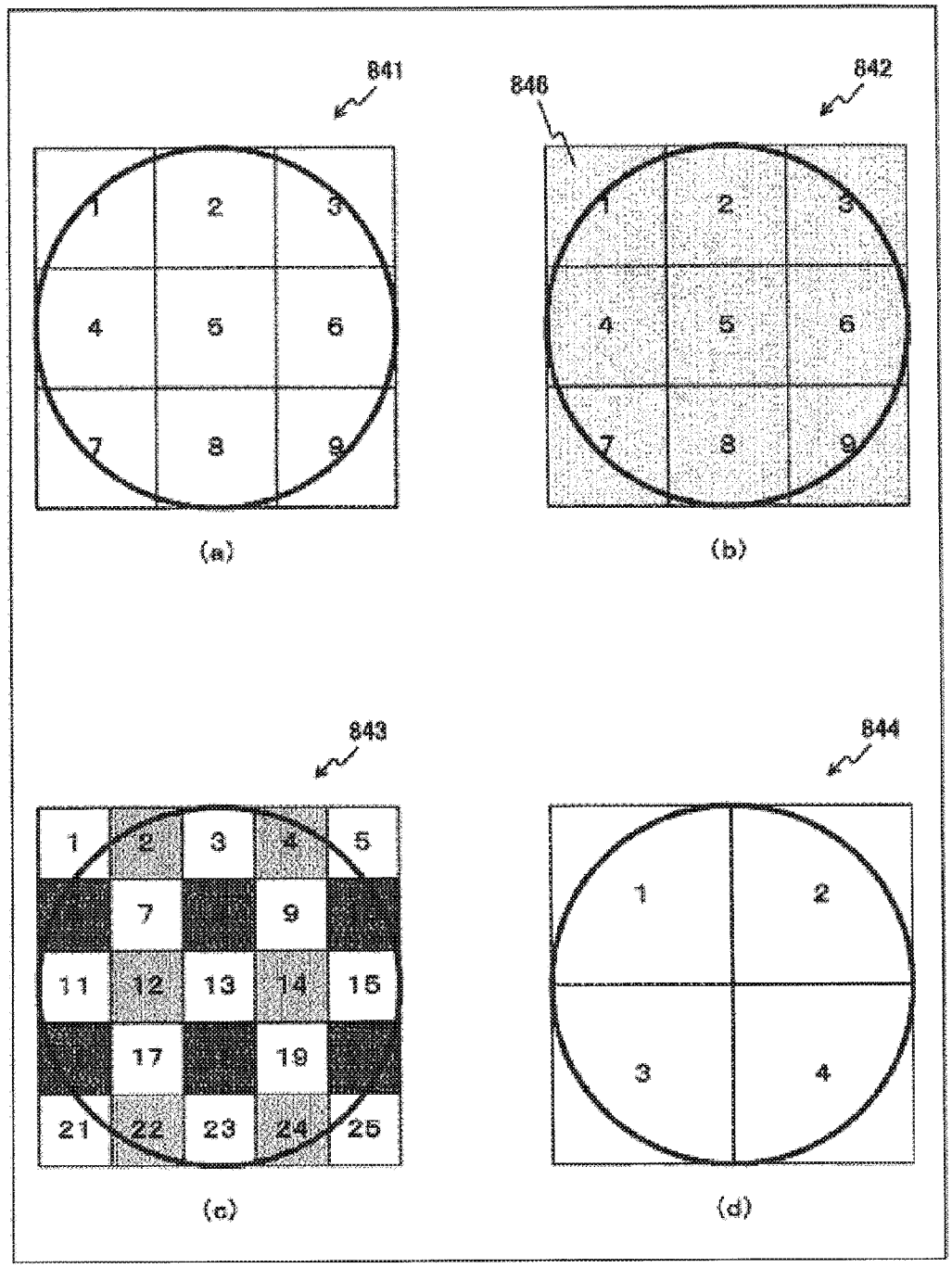

[ FIG. 21 ]
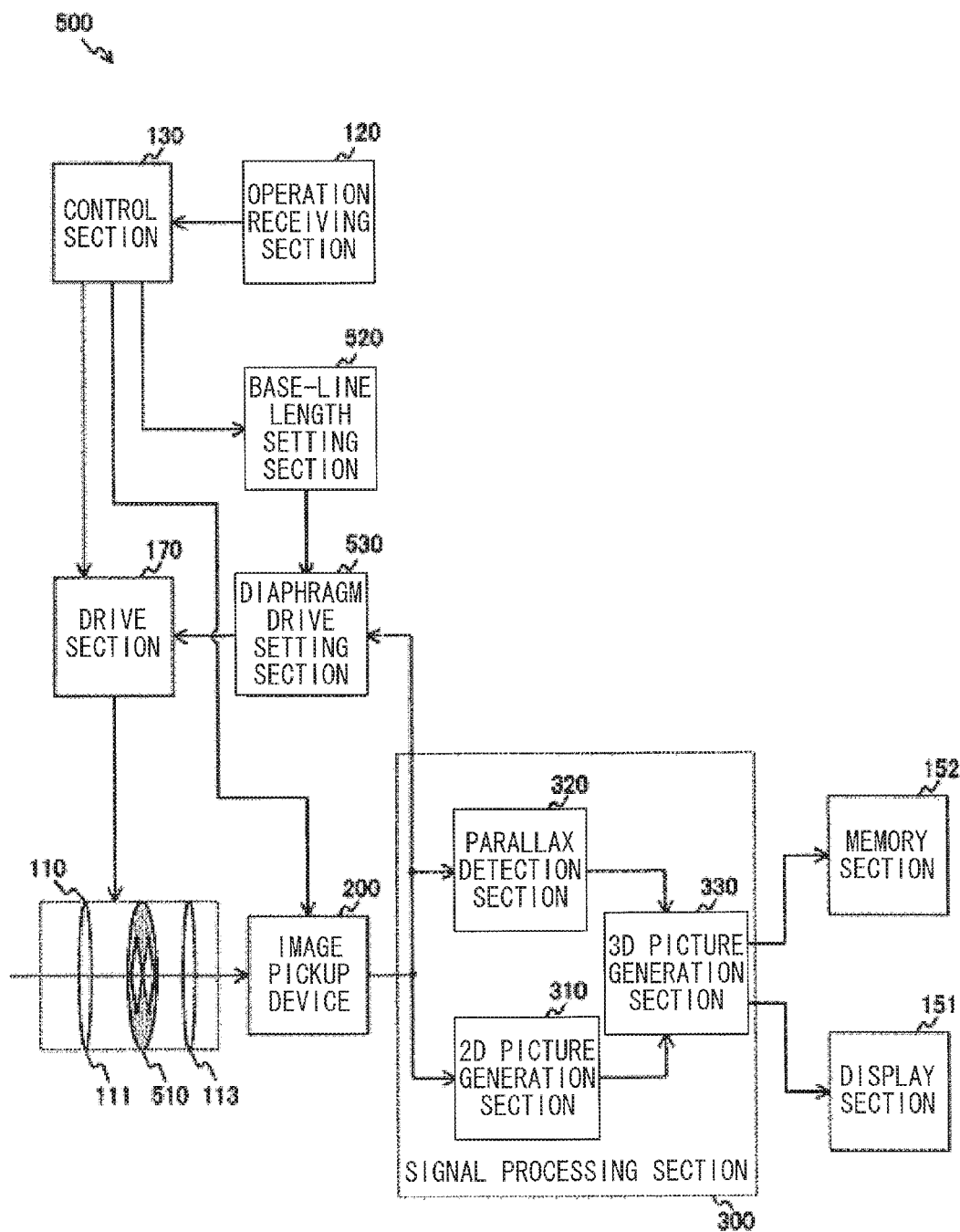

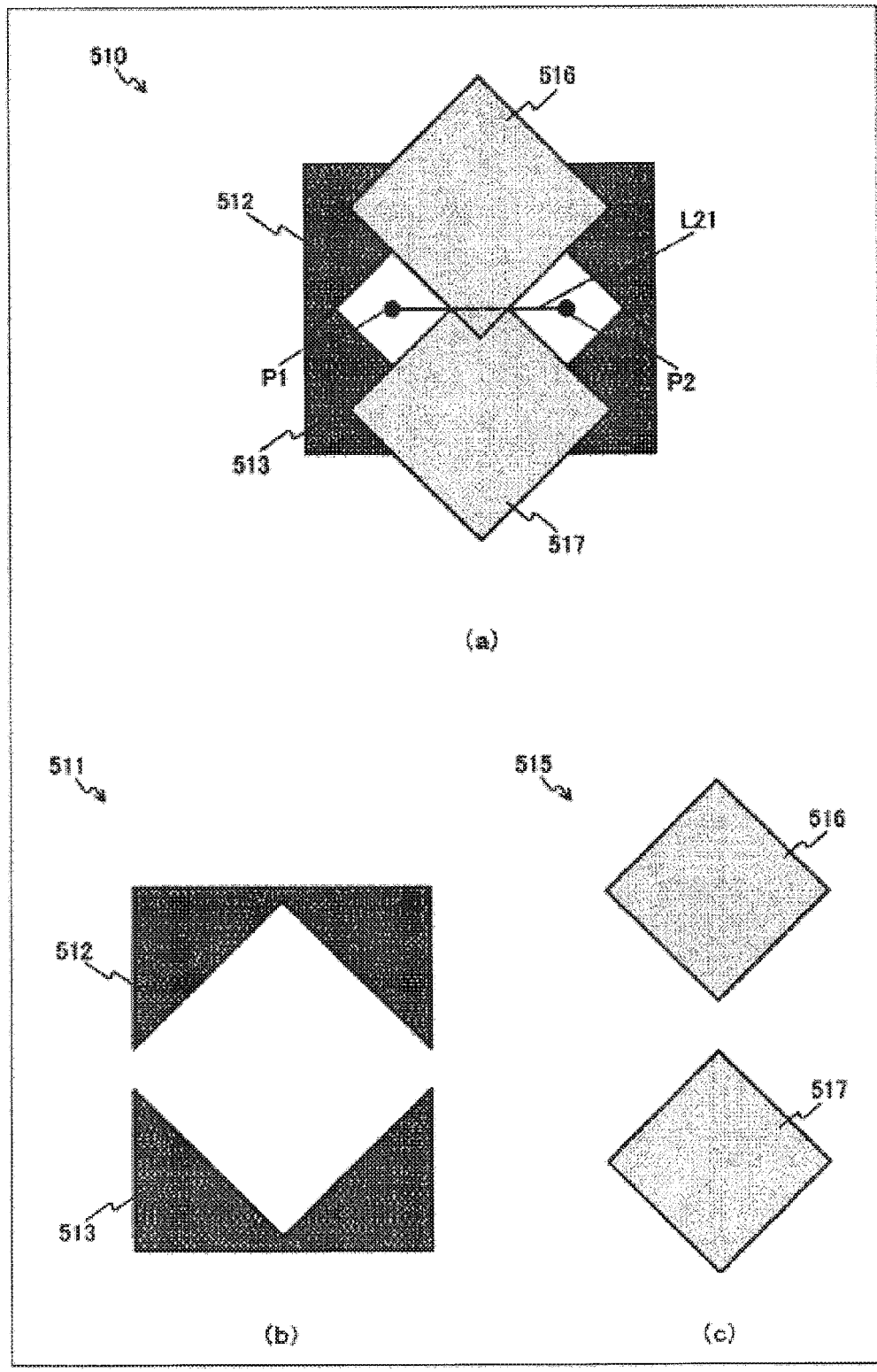
[FIG. 22]

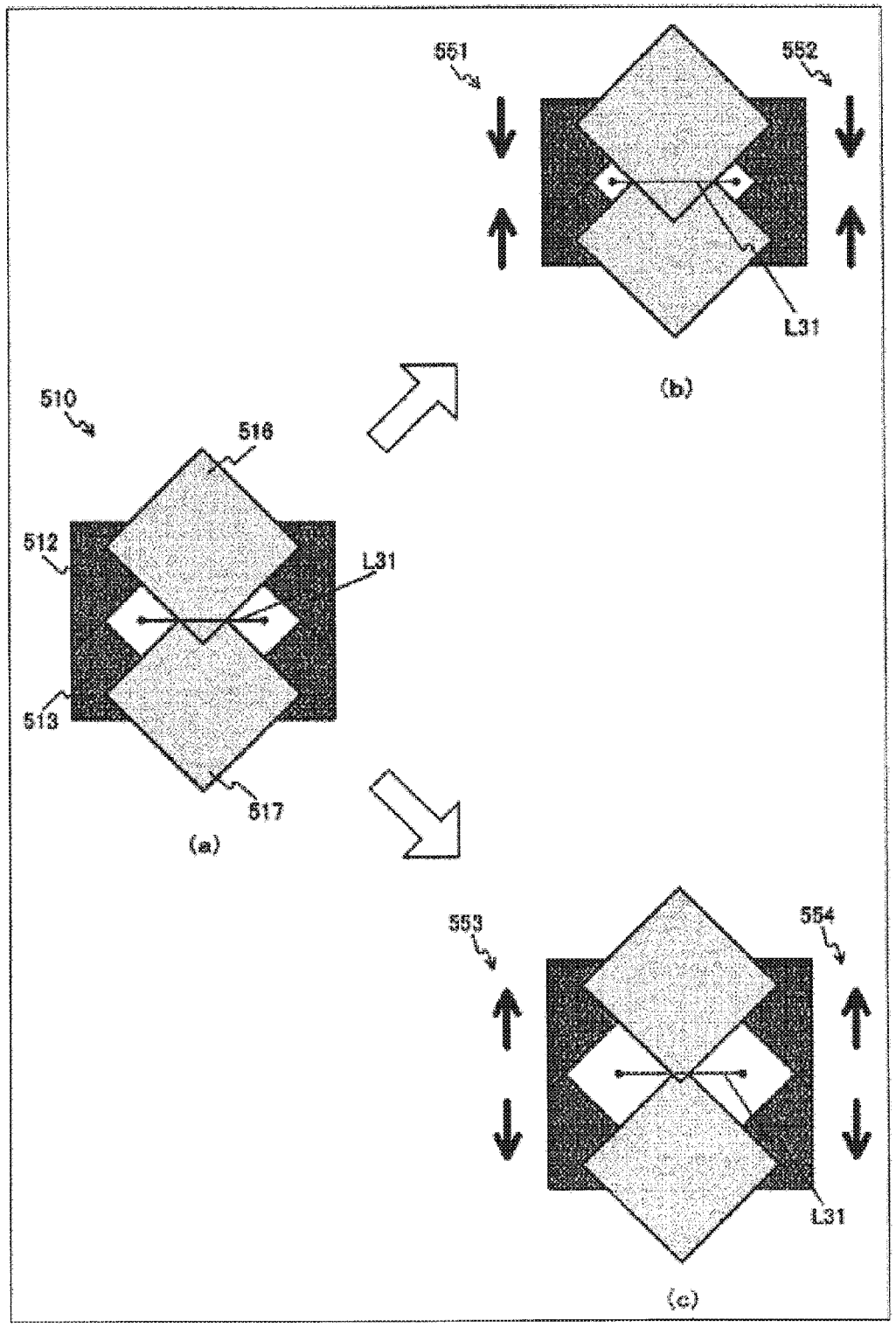
[FIG. 23]

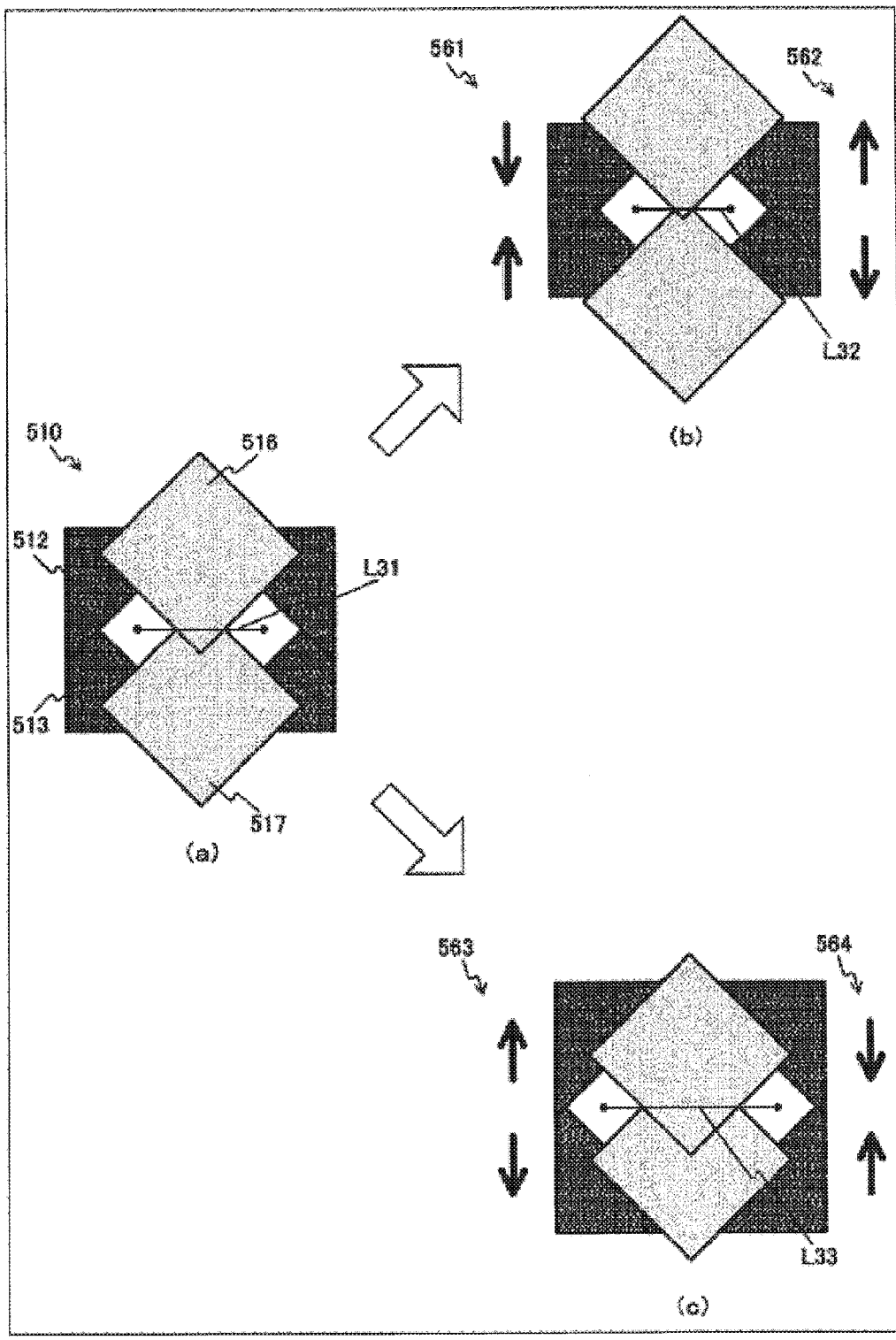
[FIG. 24]

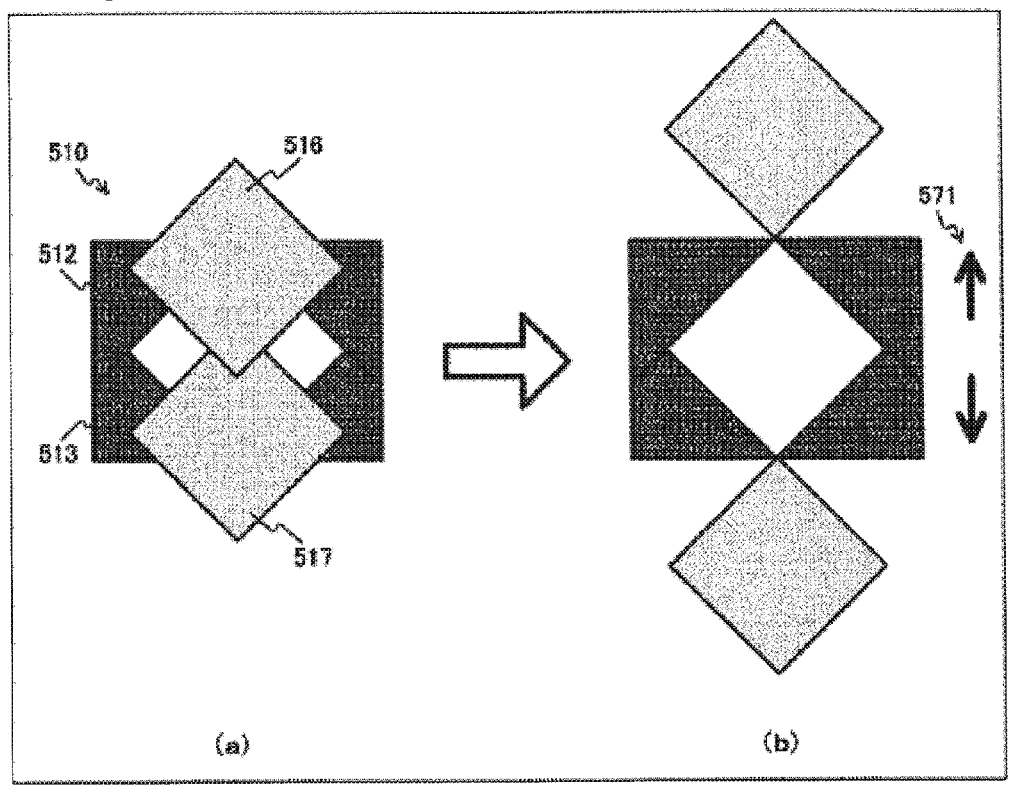
[FIG. 25]

[FIG. 26]
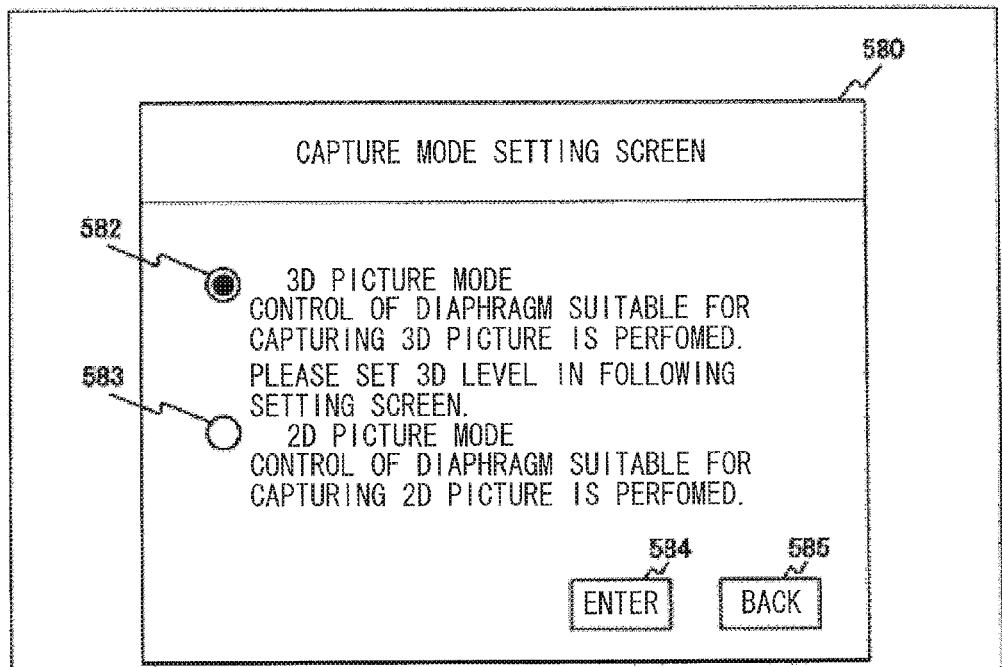
(a)
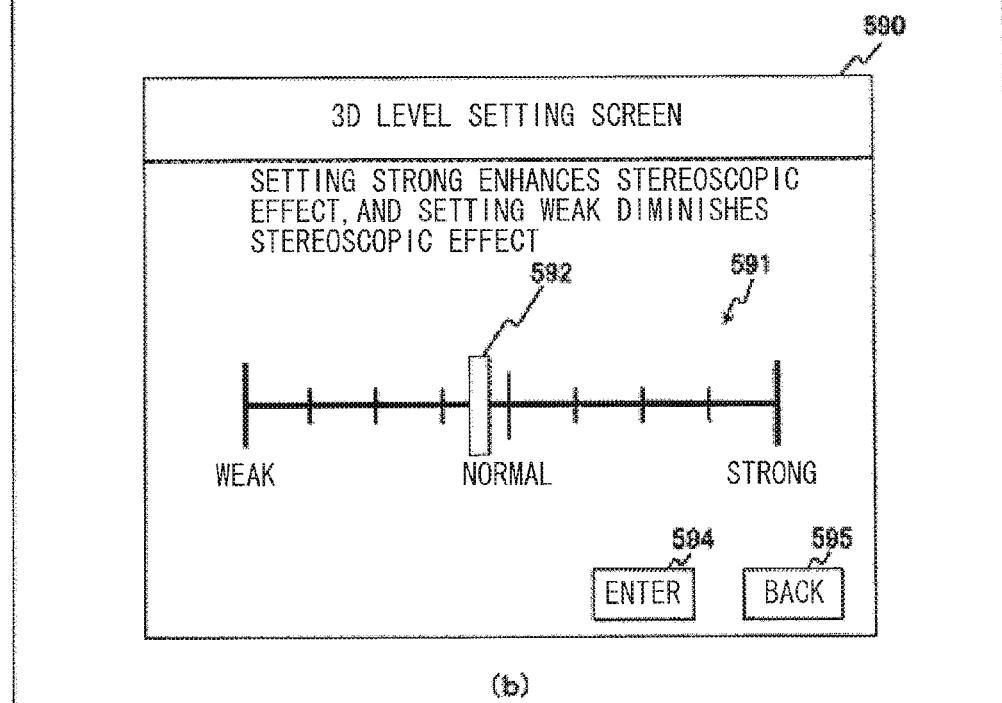
(b)

[FIG. 27]
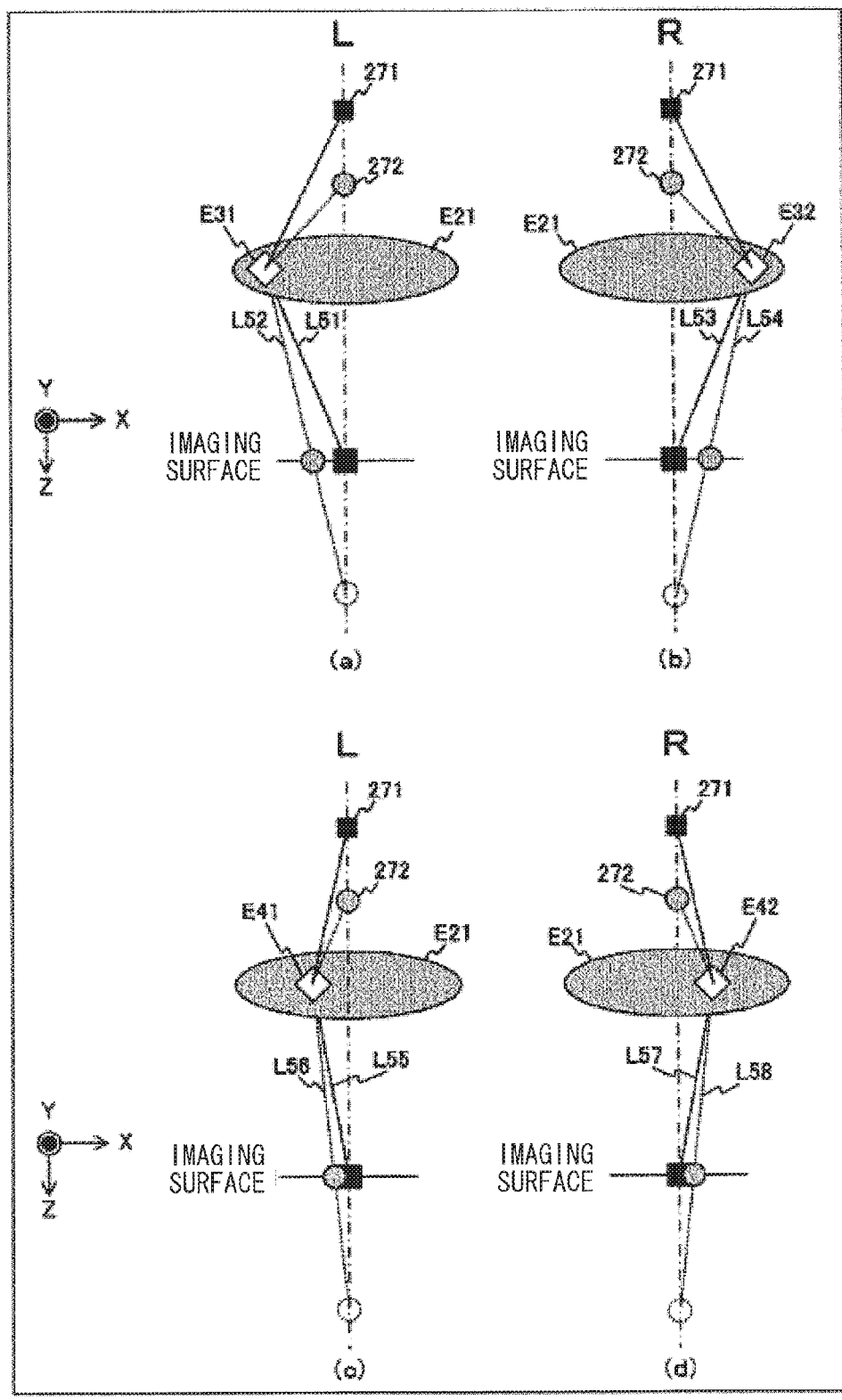

[FIG. 28]
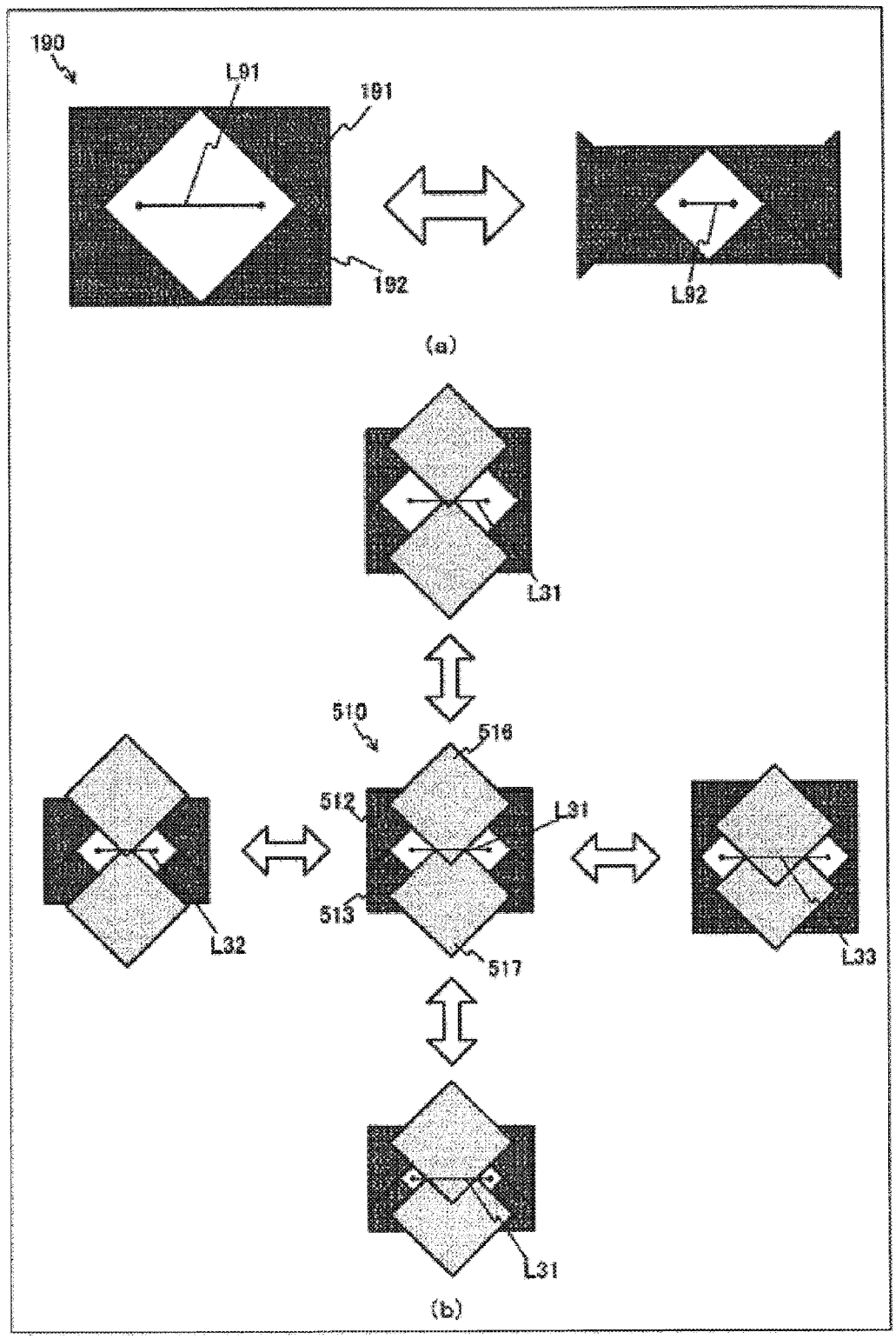

[FIG. 29]
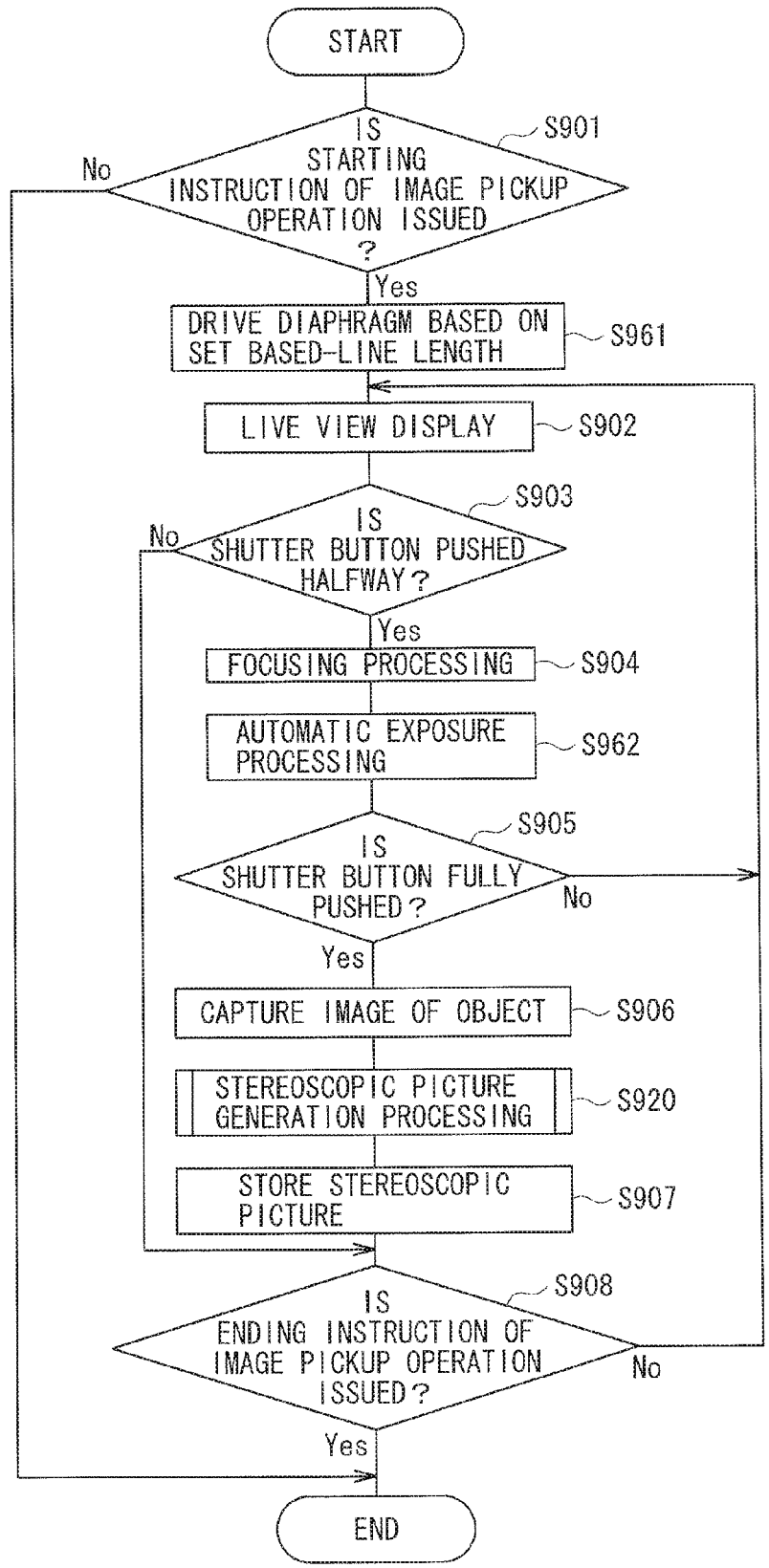

[FIG. 30]
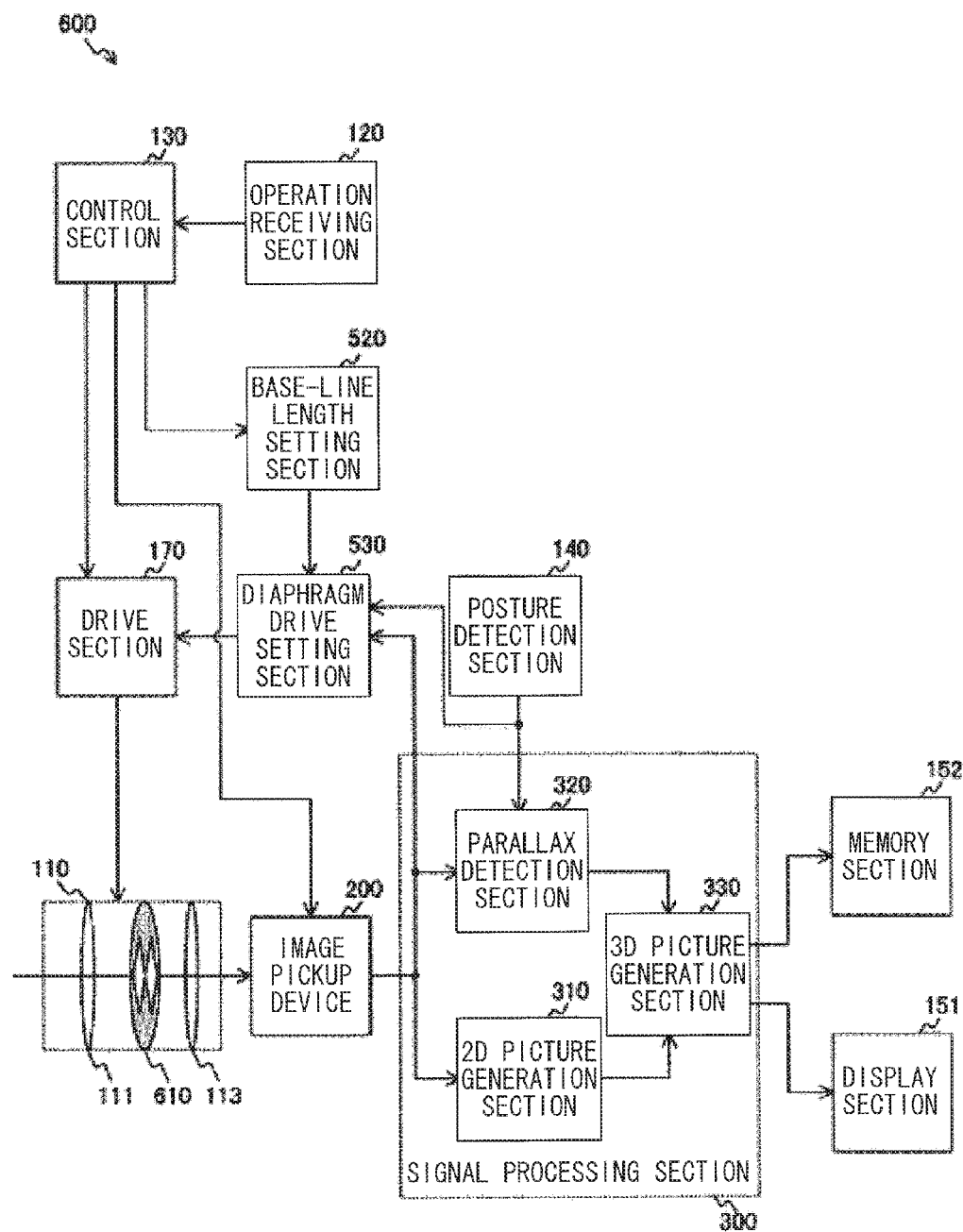

[FIG. 31]
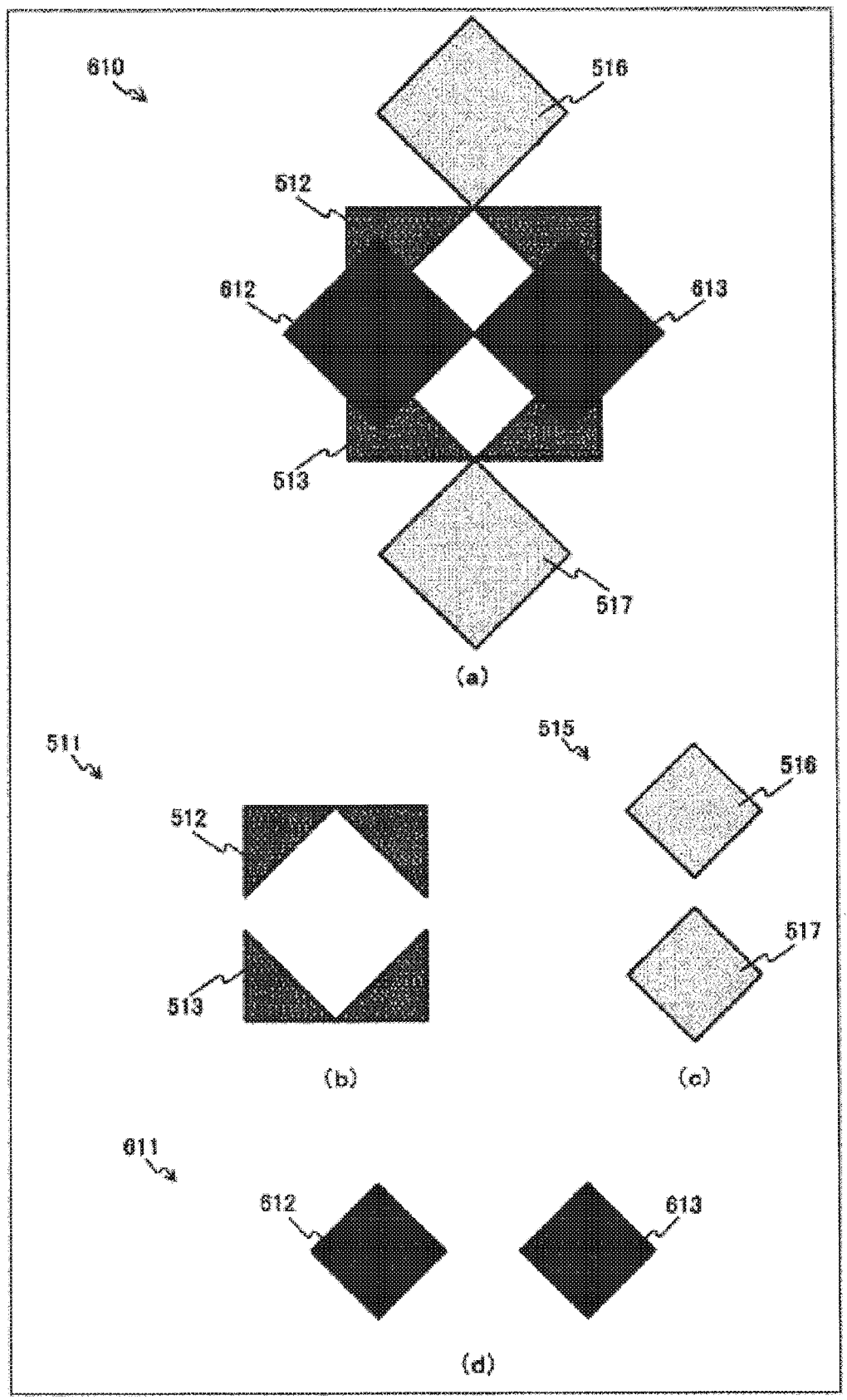

[FIG. 32]
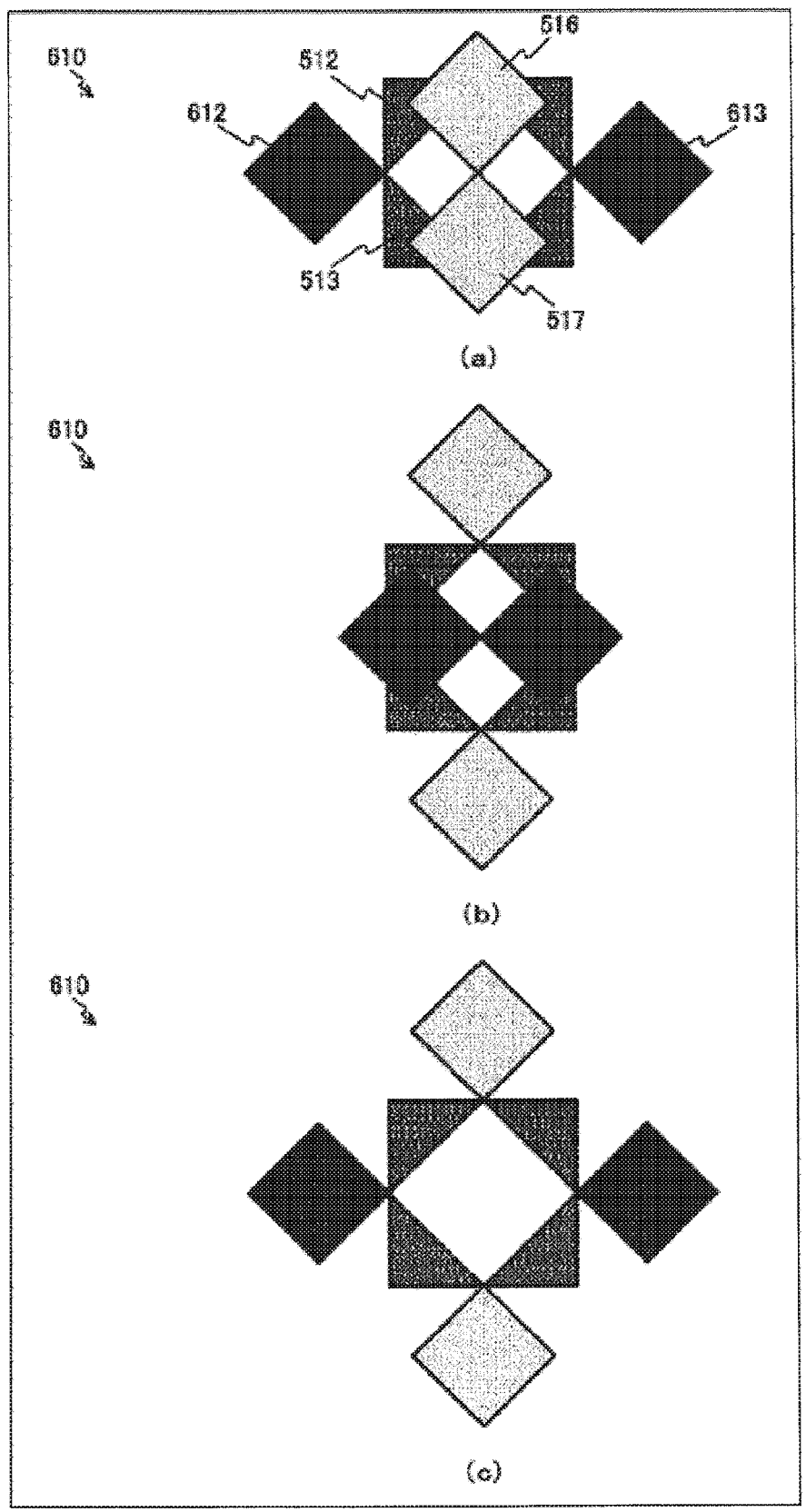

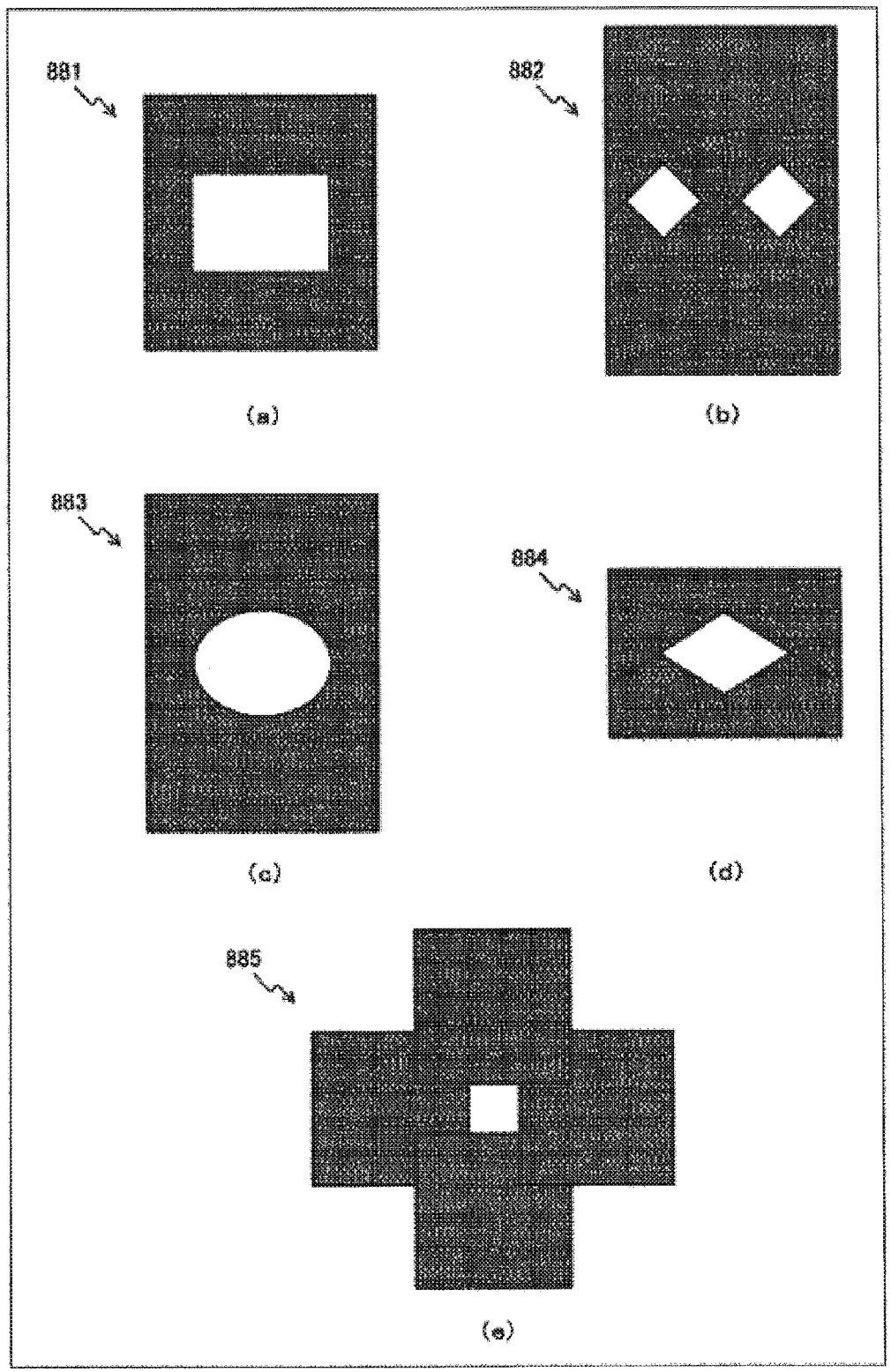
[FIG. 33]

STEREOSCOPIC IMAGE PICKUP UNIT, IMAGE PICKUP DEVICE, PICTURE PROCESSING METHOD, CONTROL METHOD, AND PROGRAM UTILIZING DIAPHRAGM TO FORM PAIR OF APERTURES

CROSS REFERENCE TO RELATED APPLICATIONS

The present application is a Continuation of application Ser. No. 14/002,028, filed Aug. 28, 2013, which is a National Stage of PCT/JP2012-057332, filed Mar. 22, 2013, which claims the benefit of Japanese Priority Patent Application(s) JP 2011-071605 and JP 2011-071606, both filed Mar. 29, 2011, the entire contents of which are incorporated herein by reference.

TECHNICAL FIELD

The present technology relates to an image pickup unit, and in particular, to an image pickup unit that generates a stereoscopic picture, an image pickup device, a picture processing method, and a diaphragm control method, and a program that causes a computer to execute the methods.

BACKGROUND ART

In the past, there have been proposed image pickup units such as a digital still camera and a digital video camera (camera-integrated recorder) that generate picture data used for stereoscopic picture display that provides stereoscopic viewing with use of parallax between right and left eyes.

For example, an image pickup unit that includes two lenses and one image pickup device and generates two pictures (a left-eye picture and a right-eye picture) for stereoscopic picture display has been proposed (for example, see PTL 1).

CITATION LIST

Patent Literature

PTL 1: Japanese Unexamined Patent Application Publication No. 2004-309868

SUMMARY OF INVENTION

Technical Problem

According to the above-described existing technology, the two pictures (the left-eye picture and the right-eye picture) are generated with use of the two lenses and the one image pickup device. However, the image pickup unit uses a polarization filter, and therefore light amount may be decreased. In addition, it is possibly difficult to receive object light containing specific polarization (for example, reflected light from glass and reflected light from a water surface).

Moreover, the two lenses provided cause a complicate optical system. Therefore, an image pickup unit that generates a stereoscopic picture with use of one lens has also been proposed. In such an image pickup unit, however, object light is divided into left light and right light by the one lens, and thus if adjustment of brightness is prioritized while a diaphragm is stopped down, stereoscopic effect is diminished. In other words, to improve the quality of a stereoscopic picture, it is necessary to adjust brightness without diminishing stereoscopic effect.

The technology is made in view of the above circumstances, and it is an object of the technology to suppress deterioration in quality of a stereoscopic picture, and to improve picture quality.

Solution to Problem

The technology is provided to dissolve the above-described issue, and a first aspect thereof is an image pickup unit, a picture processing method, and a program causing a computer to execute the method. The image pickup unit includes: an image pickup device including parallax detection pixels and picture generation pixels, each of the parallax detection pixels receiving object light by a plurality of photodetectors covered by one microlens, to generate a signal used for detecting parallax, and each of the picture generation pixels receiving the object light to generate a signal used for generating a planar picture; and a stereoscopic picture generation section detecting the parallax based on the signal generated by the parallax detection pixels, generating the planar picture based on the signal generated by the picture generation pixels, and adjusting a position of each object image included in the generated planar picture, based on the detected parallax, to generate a stereoscopic picture. With this configuration, there is provided a function of: detecting parallax based on a signal generated by parallax detection pixels; generating a planar picture based on a signal generated by picture generation pixels; and adjusting a position of each object image included in the planar picture based on the detected parallax, to generate a stereoscopic picture.

In addition, in the first aspect, a posture detection section detecting a posture of the image pickup unit may be further included, the parallax detection pixels may be arranged on a line in a row direction of the image pickup device and on a line in a column direction thereof, the stereoscopic picture generation section may determine a detection direction of the parallax from the row direction and the column direction of the image pickup device, based on the posture detected by the posture detection section, and may generate information related to the parallax, based on the signal generated by the parallax detection pixels arranged in the determined direction. With this configuration, there is provided a function of determining a detection direction of parallax based on a posture detected by a posture detection section, and generating information related to the parallax, based on a signal generated by parallax detection pixels arranged in the determined direction.

Moreover, in the first aspect, a focus determination section that performs focus determination on an object to be focused, based on the signal generated by the parallax detection pixels may be further included. With this configuration, there is provided a function of performing focus determination on an object to be focused, based on a signal generated by parallax detection pixels.

Moreover, in the first aspect, the parallax detection pixels in the image pickup device may be arranged to be adjacent to one another on a line in a specific direction. With this configuration, there is provided a function that parallax detection pixels are arranged to be adjacent to one another on a line in a specific direction.

Moreover, in the first aspect, the parallax detection pixels in the image pickup device may be arranged with predetermined intervals on a line in a specific direction. With this configuration, there is provided a function that parallax detection pixels are arranged in an island shape.

Moreover, in the first aspect, a control section that moves the one microlens covering the plurality of photodetectors in the parallax detection pixel, in an optical axis direction of the microlens, based on a relationship between the image pickup device and a size of the exit pupil may be further provided. With this configuration, there is provided a function of detecting parallax with respect to a plurality of exit pupils with different sizes.

Moreover, in the first aspect, the plurality of photodetectors in the parallax detection pixel may be covered with one color filter. As a result, there is provided a function of allowing a plurality of photodetectors in a parallax detection pixel to have the same spectral characteristics. In addition, in this case, the plurality of photodetectors in the parallax detection pixel may be covered with a green filter that shields light other than light within a wavelength range showing green. With this configuration, there is provided a function of providing a green filter as a color filter for a plurality of photodetectors in a parallax detection pixel.

Furthermore, in this case, the plurality of photodetectors in the parallax detection pixel may be covered with a white filter or a transparent layer, the white filter and the transparent layer allowing light within a visible light range to pass therethrough. With this configuration, there is provided a function of providing a white filter or a transparent layer as a color filter for a plurality of photodetectors in a parallax detection pixel.

Moreover, in the first aspect, the picture generation pixel may include one photodetector on a pixel basis. With this configuration, there is provided a function of generating a planar picture based on a signal generated by a picture generation pixel including one photodetector on a pixel basis.

Moreover, in the first aspect, a microlens that is for collecting the object light on a position of each of the plurality of photodetectors may cover the plurality of photodetectors on the plurality of photodetectors basis, the object light being collected by the one microlens covering the plurality of photodetectors in the parallax detection pixel. With this configuration, there is provided a function that a parallax detection pixel is provided with one microlens covering a plurality of photodetectors and a microlens for collecting object light collected by the one microlens, on a position of each of the plurality of photodetectors.

Moreover, in the first aspect, the microlenses each covering the photodetector in the picture generation pixel may be arranged on one surface orthogonal to an optical axis direction of the microlens covering the plurality of photodetectors in the parallax detection pixel on the plurality of photodetectors basis. With this configuration, there is provided a function that a microlens covering each of a plurality of photodetectors in a parallax detection pixel and a microlens in a picture generation pixel are provided in the same layer.

Moreover, in the first aspect, the microlenses each covering the photodetector in the picture generation pixel may be arranged on one surface orthogonal to an optical axis of the one microlens covering the plurality of photodetectors in the parallax detection pixel. With this configuration, there is provided a function that one microlens covering a plurality of photodetectors in a parallax detection pixel and a microlens of a picture generation pixel are provided in the same layer.

Moreover, according to a second aspect of the technology, there is provided an image pickup device including parallax detection pixels each receiving object light by a plurality of photodetectors covered by one microlens, to generate a signal used for detecting parallax, the parallax being used for generating a stereoscopic picture; and picture generation pixels each receiving the object light by a photodetector covered, on a pixel basis, with a microlens smaller in size than the microlens, to generate a signal used for generating a planar picture, the planar picture being used for generating the stereoscopic picture using the parallax. As a result, there is provided a function of allowing an image pickup device to include parallax detection pixels each including a plurality of photodetectors covered with one microlens and picture generation pixels each including a photodetector covered by a small microlens on a pixel basis.

Moreover, in the second aspect, the parallax may be information related to a displacement amount of a position of each object image in the planar picture at a time when the position of each object image is adjusted in the parallax direction to generate the stereoscopic picture, and the parallax detection pixels may be arranged on a line in the parallax direction. With this configuration, there is provided a function that a signal from parallax detection pixels arranged on a line in a parallax direction is used to calculate displacement amount of a position of each object image in a planar picture.

Furthermore, according to a third aspect of the technology, there are provided an image pickup unit, a diaphragm control method related to the image pickup unit, and program causing a computer to execute the method. The image pickup unit includes: a diaphragm forming a pair of apertures for generating a stereoscopic picture; an image pickup device receiving object light that passes through each of the pair of apertures, to generate signals used for generating the stereoscopic picture; and a control section independently controlling a distance between centroids of the pair of apertures, and increase and decrease of light amount of the object light passing through the pair of apertures. With this configuration, there is provided a function of receiving object light that passes through a diaphragm forming a pair of apertures for generating a stereoscopic picture and generating a stereoscopic picture.

Moreover, in the third aspect, the pair of apertures may be formed, in the diaphragm, to be adjacent to each other in a parallax direction of the stereoscopic picture, and the control section may change and control, of peripheral edges of the pair of apertures, positions of end parts of the peripheral edges corresponding to both ends in the parallax direction and positions of closed parts of the peripheral edges that are close to each other between the pair of apertures. With this configuration, there is provided a function of: forming a pair of apertures adjacent to each other in a parallax direction of a stereoscopic picture; and changing and controlling positions of end parts of peripheral edges corresponding to both ends in the parallax direction and positions of closed parts of the peripheral edges that are close to each other between the pair of apertures.

Moreover, in the third aspect, when the light amount is increased or decreased, the control section may vary a length between the end part of the peripheral edge corresponding to the end of one of the pair of apertures and the closed part of the peripheral edge thereof, and a length between the end part of the peripheral edge corresponding to the end of the other of the pair of apertures and the closed part of the peripheral edge thereof, in a state where the distance between the centroids is fixed. With this configuration, there is provided a function of, when a light amount is increased or decreased, varying a length between an end part of a peripheral edge corresponding to an end of one of a pair of apertures and a closed part of the peripheral edge thereof, and a length between an end part of a peripheral edge corresponding to an end of the other of the pair of apertures and a closed part of the peripheral edge thereof, in a state where a distance between centroids is fixed.

Moreover, in the third aspect, the length between the end part of the peripheral edge corresponding to the end of the one of the pair of apertures and the closed part of the peripheral edge thereof may be equal to the length between the end part of the peripheral edge corresponding to the end of the other of the pair of apertures and the closed part of the peripheral edge thereof. With this configuration, there is provided a function of allowing length between an end part of a peripheral edge corresponding to an end of one of a pair of apertures and a closed part of the peripheral edge thereof to be equal to a length between an end part of a peripheral edge corresponding to an end of the other of the pair of apertures and a closed part of the peripheral edge thereof.

Moreover, in the third aspect, when the distance between the centroids is varied, the control section may vary the distance between the centroids in a state where the length between the end part of the peripheral edge corresponding to the end of the one of the pair of apertures and the closed part of the peripheral edge thereof is fixed. With this configuration, there is provided a function of, when a distance between centroids is varied, varying the distance between the centroids in a state where a length between an end part of a peripheral edge corresponding to an end of one of a pair of apertures and a closed part of the peripheral edge thereof is fixed.

Moreover, in the third aspect, an adjusting section adjusting the distance between the centroids may be further provided, and the control section may control the pair of apertures to allow the distance between the centroids to be a distance adjusted by the adjusting section. With this configuration, there is provided a function that a pair of apertures is controlled so as to allow a distance between centroids to be a distance adjusted by an adjusting section that adjusts the distance between the centroids.

Moreover, in the third aspect, the diaphragm may include a first member that includes a pair of members each having a cutout and a second member that includes a pair of members each having a projection, the pair of members of the first member being disposed to allow the cutouts to face each other, and the pair of members of the second member being disposed to allow the projections to face each other. With this configuration, there is provided a function that a diaphragm is configured of a first member that includes a pair of members each having a cutout and a second member that includes a pair of members each having a projection, the pair of members of the first member being disposed to allow the cutouts to face each other, and the pair of members of the second member being disposed to allow the projections to face each other.

Moreover, in the third aspect, the first member and the second member may be driven in an orthogonal direction orthogonal to the parallax direction. With this configuration, there is provided a function of driving a first member and a second member in an orthogonal direction orthogonal to a parallax direction.

Moreover, in the third aspect, the cutout may have a concave shape in which an apex of a mountain shape is located on a straight line that passes through a midpoint of the distance between the centroids and is parallel to a driving direction of the first member, and the projection may have a convex shape in which an apex of a mountain shape is located on a straight line that passes through the midpoint of the distance between the centroids and is parallel to a driving direction of the second member. With this configuration, there is provided a function of driving a first member having a cutout of a concave shape in which an apex of a mountain shape is located on a straight line that passes through a midpoint of a distance between centroids and is parallel to a driving direction of the first member and a second member having a projection of a convex shape in which an apex of a mountain shape is located on a straight line that passes through the midpoint of the distance between the centroids and is parallel to a driving direction of the second member.

Moreover, in the third aspect, a posture detection section detecting a posture of the image pickup unit may be further included. In addition, in the third aspect, the diaphragm may include a first member, a second member shielding part of the object light in a horizontal shooting, and a third member shielding part of the object light in a vertical shooting, the first member having a pair of members each having a cutout, the pair of members of the first member being disposed to allow the cutouts to face each other, the second member having a pair of members each having a projection, the pair of members of the second member being disposed to allow the projections to face each other, the third member having a pair of members each having a projection, and the pair of the members of the third member being disposed to allow the projections to face each other. In addition, in the third aspect, a driving direction of the second member may be orthogonal to a driving direction of the third member. In addition, in the third aspect, the control section may determine, based on the detected posture, whether the horizontal shooting or the vertical shooting is performed, and then controls the pair of apertures. With this configuration, there is provided a function of forming a pair of apertures in a parallax direction both in horizontal shooting and in vertical shooting.

Moreover, in the third aspect, the diaphragm may be disposed on an optical path of the object light that is collected by a monocular lens system. With this configuration, there is provided a function of allowing a diaphragm to be disposed on an optical path of object light that is collected by a monocular lens system.

Furthermore, according to a fourth aspect of the technology, there is provided an image pickup unit including: a diaphragm configured of a pair of members each having a pair of cutouts that are adjacent to each other in a parallax direction of a stereoscopic picture, the cutouts of the respective members facing to each other to form a pair of apertures; an image pickup device receiving object light that passes through each of the pair of apertures to generate a signal used for generating the stereoscopic picture; and a control section driving each of the pair of members in an orthogonal direction orthogonal to the parallax direction and controlling the diaphragm to allow a distance between centroids of the pair of apertures to be fixed. With this configuration, there is provided a function of receiving object light that passes through a pair of apertures of a diaphragm that is configured of a pair of members each including a pair of cutouts adjacent to each other in a parallax direction of a stereoscopic picture to generate a stereoscopic picture.

Furthermore, according to a fifth aspect of the technology, there is provided an image pickup unit including: a diaphragm forming an aperture, a longitudinal direction of the aperture being a parallax direction in a stereoscopic picture; an image pickup device receiving object light that passes through the aperture, to generate a signal used for generating the stereoscopic picture; and a control section controlling the diaphragm to allow a length of the aperture in the parallax direction to be larger than a length of the aperture in an orthogonal direction orthogonal to the parallax direction. With this configuration, there is provided a function of receiving object light that passes through an aperture of a diaphragm that forms the aperture whose longitudinal direction is a parallax direction of a stereoscopic picture and accordingly generating the stereoscopic picture.

Moreover, in the fifth aspect, the diaphragm may include a pair of members each having a cutout, the cutouts facing to each other to form the aperture, and the control section may drive each of the pair of members in the orthogonal direction to control the diaphragm. With this configuration, there is provided a function of receiving object light that passes through an aperture formed by facing the pair of members each having a cutout and accordingly generating a stereoscopic picture.

Moreover, in the fifth aspect, the cutout may have one of a rectangular shape having a long side extending in the parallax direction, a triangular shape having a base extending in the parallax direction, and a semicircular shape having one side extending in the parallax direction. With this configuration, there is provided a function of receiving object light, which passes through an aperture formed of a cutout having one of a rectangular shape having a long side extending in a parallax direction, a triangular shape having a base extending in the parallax direction, and a semicircular shape having one side extending in the parallax direction, and accordingly generating a stereoscopic picture.

Moreover, in the fifth aspect, the diaphragm may form the aperture with use of a pair of first members and a pair of second members, the first members each having a side parallel to the parallax direction, the sides of the respective first members facing to each other, the second members each having a side parallel to the orthogonal direction, and the sides of the respective second members facing to each other. With this configuration, there is provided a function of receiving object light, which passes through an aperture formed by a pair of first members and a pair of second members, and accordingly generating a stereoscopic picture, the first members each having a side parallel to the parallax direction, the sides of the respective first members facing to each other, the second members each having a side parallel to the orthogonal direction, and the sides of the respective second members facing to each other.

Advantageous Effects of Invention

According to the technology, it is possible to provide effects of suppressing deterioration in picture quality of a stereoscopic picture, and improving the picture quality.

BRIEF DESCRIPTION OF DRAWINGS

FIG. 1 is a block diagram illustrating an example of a functional configuration of an image pickup unit 100 according to a first embodiment of the technology.

FIG. 2 is a schematic diagram illustrating an example of an arrangement of pixels provided in an image pickup device 200 according to the first embodiment of the technology.

FIG. 3 is a schematic diagram illustrating an example of a picture generation pixel and a parallax detection pixel that are provided in the image pickup device 200 according to the first embodiment of the technology.

FIG. 4 is a schematic diagram illustrating an example of a cross-sectional structure of the picture generation pixel and the parallax detection pixel according to the first embodiment of the technology.

FIG. 5 is a diagram schematically illustrating object light received by the parallax detection pixel according to the first embodiment of the technology.

FIG. 6 is a diagram schematically illustrating a principle of parallax detection by a parallax detection pixel 230 according to the first embodiment of the technology.

FIG. 7 is a diagram schematically illustrating an example of a direction of the parallax detection by the parallax detection pixel 230 in the case where horizontal shooting is performed using the image pickup unit 100 according to the first embodiment of the technology.

FIG. 8 is a diagram schematically illustrating an example of the direction of the parallax detection by the parallax detection pixel 230 in the case where vertical shooting is performed using the image pickup unit 100 according to the first embodiment of the technology.

FIG. 9 is a schematic diagram illustrating a generation example of a 3D picture by the image pickup unit 100 according to the first embodiment of the technology.

FIG. 10 is a flowchart illustrating an example of an image pickup processing procedure when a stereoscopic picture is captured by the image pickup unit 100 according to the first embodiment of the technology.

FIG. 11 is a flowchart illustrating an example of a processing procedure of a stereoscopic picture generating processing (step S920) in the image pickup processing procedure according to the first embodiment of the technology.

FIG. 12 is a block diagram illustrating an example of a functional configuration of an image pickup unit 400 according to a second embodiment of the technology.

FIG. 13 is a diagram schematically illustrating a concept of automatic focus using pixel values of nine pixel circuits in the parallax detection pixel 230 according to the second embodiment of the technology.

FIG. 14 is a diagram schematically illustrating focus determination by phase difference detection by a focus determination section 410 according to the second embodiment of the technology.

FIG. 15 is a flowchart illustrating an example of an image pickup processing procedure when a stereoscopic picture is captured by the image pickup unit 400 according to the second embodiment of the technology.

FIG. 16 is a flowchart illustrating an example of a processing procedure of focus processing (step S940) in the image pickup processing procedure according to the second embodiment of the technology.

FIG. 17 is a diagram schematically illustrating an example of an image pickup device in which parallax detection pixels are arranged in line only in a row direction, as a first modification of the first and second embodiments of the technology.

FIG. 18 is a diagram schematically illustrating an example of an image pickup device in which parallax detection pixels are arranged with predetermined intervals (arranged in an island shape) in a row direction and a column direction, as a second modification of the technology.

FIG. 19 is a diagram schematically illustrating modifications of the cross-sectional structure of the picture generation pixel and the parallax detection pixel, as third to fifth modifications of the technology.

FIG. 20 is a schematic diagram illustrating modifications of the parallax detection pixel, as sixth to ninth modifications of the technology.

FIG. 21 is a block diagram illustrating an example of a functional configuration of an image pickup unit 500 according to a third embodiment of the technology.

FIG. 22 is a diagram schematically illustrating an example of a diaphragm 510 according to the third embodiment of the technology.

FIG. 23 is a diagram schematically illustrating driving directions of a first diaphragm 511 and a second diaphragm 515 in the case where the diaphragm 510 according to the third embodiment of the technology is driven so that only an aperture area is varied while a base-line length is fixed.

FIG. 24 is a diagram schematically illustrating the driving directions of the first diaphragm 511 and the second diaphragm 515 in the case where the diaphragm 510 according to the third embodiment of the technology is driven so that only the base-line length is varied while the aperture area is fixed.

FIG. 25 is a diagram schematically illustrating the case where an aperture part of the diaphragm 510 according to the third embodiment of the technology is formed into a shape suitable for capturing a planar picture.

FIG. 26 is a diagram schematically illustrating a setting screen of a picture to be captured and a setting screen of a 3D intensity that are displayed on a display section 151 according to the third embodiment of the technology.

FIG. 27 is a diagram schematically illustrating change of an image by the variation of the base-line length by the diaphragm 510 according to the third embodiment of the technology.

FIG. 28 is a diagram schematically illustrating a difference between an aperture plane of the diaphragm 510 according to the third embodiment of the technology and an aperture plane of an existing diaphragm.

FIG. 29 is a flowchart illustrating an example of an image pickup processing procedure when a stereoscopic picture is captured by the image pickup unit 500 according to the third embodiment of the technology.

FIG. 30 is a block diagram illustrating an example of a functional configuration of an image pickup unit 600 according to a fourth embodiment of the technology.

FIG. 31 is a diagram schematically illustrating an example of a diaphragm 610 according to the fourth embodiment of the technology.

FIG. 32 is a diagram schematically illustrating an example of a shape of an aperture part formed by the diaphragm 610 according to the fourth embodiment of the technology.

FIG. 33 is a diagram schematically illustrating an example of a diaphragm having a simple configuration suitable for capturing a 3D picture, as modifications of the third and fourth embodiments of the technology.

DESCRIPTION OF EMBODIMENTS

Preferred embodiments for carrying out the technology (hereinafter, referred to as embodiments) will be described below. The description will be given in the following order.
1. First embodiment (image pickup control: an example in which parallax is detected by parallax detection pixels and a 3D picture is generated)
2. Second embodiment (image pickup control: an example in which pixel values of parallax detection pixels are used to detect a phase difference)
3. Modifications
4. Third embodiment (diaphragm control: an example in which brightness and a base-line length are independently controlled in horizontal shooting)
5. Fourth embodiment (diaphragm control: an example in which brightness and a base-line length are independently controlled both in horizontal shooting and vertical shooting)
6. Modifications 1. First Embodiment Example of Functional Configuration of Image Pickup Unit FIG. 1 is a block diagram illustrating an example of a functional configuration of an image pickup unit 100 according to a first embodiment of the technology. The image pickup unit 100 is an image pickup unit generating 3D picture by a single lens. The image pickup unit 100 captures an image of an object to generate picture data (a captured picture), and records the generated picture data as 2D picture contents or 3D picture contents (still picture contents or moving picture contents). Note that, in the following description, an example in which still picture contents (still picture file) are recorded as picture contents (picture file) will be described mainly.

The image pickup unit 100 includes a lens section 110, an operation receiving section 120, a control section 130, an image pickup device 200, a signal processing section 300, a posture detection section 140, a display section 151, a memory section 152, and a drive section 170.

The lens section 110 collects light from an object (object light). The lens section 110 includes a zoom lens 111, a diaphragm 112, and a focus lens 113.

The zoom lens 111 is driven by the drive section 170, and accordingly moves in an optical axis direction to vary a focal length, thereby adjusting a magnification of an object included in the captured picture.

The diaphragm 112 is a shielding component that varies degree of an aperture by drive of the drive section 170, and accordingly adjusts a light amount of object light entering the image pickup device 200.

The focus lens 113 is driven by the drive section 170, and accordingly moves in the optical axis direction, thereby adjusting focus.

The operation receiving section 120 receives operation from a user. For example, when a shutter button (not illustrated) is pushed, the operation receiving section 120 supplies a signal related to the push as an operation signal to the control section 130.

The control section 130 controls operation of each section in the image pickup unit 100. Note that, in FIG. 1, only main signal lines are illustrated and other signal lines are omitted. For example, when the shutter button is pushed and the control section 130 receives an operation signal for starting still picture recording, the control section 130 supplies a signal related to execution of the still picture recording to the signal processing section 300.

The image pickup device 200 is an image sensor performing photoelectric conversion of the received object light into an electrical signal. For example, the image pickup device 200 is configured of an x-y address type sensor such as complementary metal oxide semiconductor (CMOS) sensor, a charge coupled device (CCD) sensor, or the like. In the image pickup device 200, pixels generating a signal for generating a captured picture based on the received object light (picture generation pixels) and pixels detecting parallax for generating a 3D picture (parallax detection pixels) are arranged. Incidentally, the image pickup device 200 will be described with reference to FIG. 2. In addition, the picture generation pixel and the parallax detection pixel will be described with reference to FIG. 3 to FIG. 6. The image pickup device 200 supplies the electrical signal (a picture signal) generated by the photoelectric conversion, to the signal processing section 300 for each frame (picture data).

The signal processing section 300 performs predetermined signal processing on the electrical signal supplied from the image pickup device 200. For example, the signal processing section 300 converts the electrical signal supplied from the image pickup device 200 into a digital electrical signal (a pixel value), and then performs black level correction, defect correction, shading correction, mixed-color correction, and the like. Moreover, the signal processing section 300 generates a 3D picture (a stereoscopic picture), based on the electrical signal subjected to the correction. The signal processing section 300 includes, as a functional configuration for generating a 3D picture, a 2D picture generation section 310, a parallax detection section 320, and a 3D picture generation section 330. Note that the signal processing section 300 is an example of a stereoscopic picture generation section described in claims.

The 2D picture generation section 310 generates a 2D picture (a planar picture), based on the electrical signal (the pixel value) of the picture generation pixel. The 2D picture generation section 310 interpolates the electrical signal (the pixel value) corresponding to a position of the parallax detection pixel, based on the electrical signal (the pixel value) of the picture generation pixel, and performs demosaic processing to generate a planar picture. The 2D picture generation section 310 supplies the generated planar picture to the 3D picture generation section 330.

The parallax detection section 320 generates a parallax information picture, based on the electrical signal (the pixel value) of the parallax detection pixel. In this case, the parallax information picture is a picture including information (parallax information) related to difference (parallax) between a left-eye picture and a right-eye picture. The parallax detection section 320 supplies the generated parallax information picture to the 3D picture generation section 330.

The 3D picture generation section 330 generates a 3D picture (a stereoscopic picture), based on the parallax information picture and the 2D picture. The 3D picture generation section 330 generates a left-eye picture and a right-eye picture as the 3D picture. For example, the 3D picture generation section 330 generates the 3D picture by displacing a position of a captured image of each object in the 2D picture, based on the parallax information indicated by the parallax information picture. The 3D picture generation section 330 stores, as stereoscopic picture contents, data of the generated left-eye picture (left-eye picture data) and data of the generated right-eye picture (right-eye picture data) in the memory section 152. In addition, the 3D picture generation section 330 allows the display section 151 to display the left-eye picture data and the right-eye picture data as the stereoscopic picture contents.

The posture detection section 140 detects a posture (inclination) of the image pickup unit 100. For example, the posture detection section 140 is configured of a gyroscope or an acceleration sensor. The posture detection section 140 supplies information (posture information) related to the detected posture of the image pickup unit 100 to the parallax detection section 320.

The display section 151 displays a picture based on the stereoscopic picture contents supplied from the 3D picture generation section 330. For example, the display section 151 is configured of a color liquid crystal panel.

The memory section 152 holds the stereoscopic picture contents supplied from the 3D picture generation section 330. For example, removable recording media (one or more recording media) including disks such as a digital versatile disk (DVD), semiconductor memories such as a memory card, and the like are used as the memory section 152. In addition, such recording media may be incorporated in the image pickup unit 100, or may be detachable from the image pickup unit 100.

The drive section 170 drives the zoom lens 111, the diaphragm 112, and the focus lens 113. For example when an instruction for moving the focus lens 113 is supplied from the control section 130, the drive section 170 moves the focus lens 113 based on the instruction.

[Arrangement Example of Pixels in Image Pickup Device]

FIG. 2 is a schematic diagram illustrating an example of an arrangement of pixels provided in the image pickup device 200 according to the first embodiment of the technology. Note that, in the embodiment of the technology, in the case where a pixel arrangement on a light receiving surface of the image pickup device is described (for example, FIG. 2, FIG. 3, and FIG. 7), the case where the arrangement is viewed from a backside of the light receiving surface of the image pickup device is described with schematic illustration, for convenience of description.

The description is made with the assumption of XY-axis in which a vertical direction is referred to as a Y-axis, and a lateral direction is referred to as an X-axis in the figure. In addition, in the figure, it is assumed that a lower left corner is referred to as an origin of the XY-axis, a direction from bottom to top is referred to as a plus side of the Y-axis, and a direction from left to right is referred to as a plus side of the X-axis. Note that, in the figure, a specific direction (a direction corresponding to the horizontal direction (the lateral direction) of the captured picture) in the image pickup device 200 is referred to as the X-axis direction, and an orthogonal direction (a direction corresponding to the vertical direction of the captured picture) orthogonal to the specific direction is referred to as the Y-axis direction. Moreover, in the figure, a direction from back to front is referred to as a plus side of the Z-axis. Note that the Z-axis is an axis parallel to an optical axis, and the plus direction of the Z-axis is a traveling direction of object light from the object toward the image pickup device. In addition, a reading direction of a signal in the image pickup device 200 is the X-axis direction (read line by line), and a long side direction of the image pickup device 200 is the X-axis direction, and a short side direction thereof is the Y-axis direction.

In (a) of the figure, for convenience of description, the pixel arrangement is described with use of a region (region 210) for a part of pixels configuring the image pickup device 200. Note that the arrangement of the pixels in the image pickup device 200 is an arrangement in which a pixel arrangement illustrated in the region 210 is used as one unit, and a pixel arrangement corresponding to the unit (the pixel arrangement corresponding to the region 210) is repeated in the X-axis direction and the Y-axis direction. Note that, in (b) of the figure, a region (a region 250) in which the pixel arrangement illustrated in the region 210 is repeated in the X-axis direction and the Y-axis direction is schematically illustrated.

In (a) of the figure, the pixel arrangement of the picture generation pixels and the parallax detection pixels in a partial region (the region 210) of the image pickup device 200.

In the figure, one pixel circuit is indicated by one square (a smallest square in (a) of the figure). Incidentally, in the first embodiment of the technology, as for the picture generation pixel, one square indicates one picture generation pixel because one pixel circuit configures one pixel.

In the image pickup device 200, as the picture generation pixels, a pixel (R pixel) receiving red (R) light by a color filter that allows red light to pass therethrough, a pixel (G pixel) receiving green (G) light by a color filter that allows green light to pass therethrough are arranged. Moreover, in the image pickup device 200, in addition to the R pixel and the G pixel, a pixel (B pixel) receiving blue (B) light by a color filter that allows blue light to pass therethrough is arranged as the picture generation pixel. In the region 210, the R pixel, the G pixel, and the B pixel are indicated by a dotted square, a white square, and a gray square, respectively (for example, see the pixels in a region 220).

The parallax detection pixel 230 is a pixel detecting parallax for generating a 3D picture. The parallax detection pixel 230 is configured of nine pixel circuits. The parallax detection pixel 230 is provided with one microlens covering the nine pixel circuits. Incidentally, the picture generation pixel is not provided with a microlens covering the nine pixels. In the parallax detection pixel 230, the nines pixel circuits are uniformly covered with a color filter that allows green (G) light to pass therethrough. In the region 210, the parallax detection pixel 230 is indicated in such a manner that the nine pixel circuits (nine smallest squares) are enclosed by a heavy-line square, and one heavy-line circle (indicating a microlens) is added in the heavy-line square. In other words, the parallax detection pixels 230 are arranged in three rows in the middle of rows of the pixel circuits in the region 210 (a row R1 in (a) of the figure) and in three columns in the middle of columns of the pixel circuits (see a column C1 in (a) of the figure).

Incidentally, the picture generation pixel will be described using a region 225 in (a) of the figure with reference to (a) of FIG. 3. In addition, the parallax detection pixel will be described with reference to (b) of FIG. 3. Moreover, the cross-sectional structure of the picture generation pixel and the parallax detection pixel will be described with reference to (b) of FIG. 4.

In (b) of FIG. 2, a region in which the region 210 illustrated in (a) of the figure is repeated in the X-axis direction and the Y-axis direction is illustrated. The pixel arrangement in the image pickup device 200 is formed by repeating the region illustrated in (a) of the figure in the X-axis direction and the Y-axis direction. Therefore, as illustrated by heavy lines (parallax detection pixel lines 234) in the region 250 in (b) of the figure, the parallax detection pixels 230 are arranged in line in the row direction and the column direction (in a lattice) of the image pickup device 200 in an arbitrary pixel cycle.

[Example of Picture Generation Pixel and Parallax Detection Pixel]

FIG. 3 is a schematic diagram illustrating an example of the picture generation pixel and the parallax detection pixel that are provided in the image pickup device 200 according to the first embodiment of the technology.

In (a) of the figure, the nine picture generation pixels in the region 225 in (a) of FIG. 2 are illustrated. In (a) of the figure, the picture generation pixels (the R pixel, the G pixel, and the B pixel) are indicated with symbols (R, G, and B) and patterns (the R pixel is indicated as a gray region, the G pixel is indicated as a white region, and the B pixel is indicated as a dotted region). Incidentally, as for the G pixel, the G pixel in a row (line) including the R pixel (an R pixel 226) is indicated as a Gr pixel 227, and the G pixel in a row (line) including the B pixel (a B pixel 229) is indicated as a Gb pixel 228.

In addition, in (a) of the figure, the microlens (a micro lens 261) arranged for each picture generation pixel is indicated by a dashed circle. The image pickup device 200 is provided with two microlens layers for forming two types of microlenses, and the microlens 261 is formed of a microlens layer close to a color filter layer. Note that a sectional diagram of the picture generation pixel is described with reference to (b) of FIG. 4, and thus the detailed description thereof is omitted here.

As illustrated in the region 225 (see also (a) of FIG. 2), the picture generation pixels are arranged based on Bayer arrangement. In addition, each picture generation pixel is provided with one microlens and is covered therewith.

(b) of FIG. 3 illustrates the parallax detection pixel (the parallax detection pixel 230). In the parallax detection pixel 230 illustrated in (b) of FIG. 3, the nine pixel circuits in the parallax detection pixel 230 are indicated by squares with numbers of 1 to 9 (referred to as pixel circuits 1 to 9). All of the pixel circuits 1 to 9 are uniformly covered with the color filter that allows green (G) light to pass therethrough.

In addition, in the parallax detection pixel 230, the microlens (the microlens 261) provided for each pixel circuit is indicated by a dashed circle. The microlens 261 in the parallax detection pixel 230 is similar to the microlens (the microlens 261) of the picture generation pixel, and is formed of a microlens layer close to a color filter layer.

Further, the parallax detection pixel 230 is provided with one large microlens that covers all of the nine microlenses 261 of the parallax detection pixel 230 (covers all of the pixel circuits 1 to 9). In (b) of the figure, the large microlens (a parallax-detection-use microlens 231) is indicated by a heavy-line circle.

As illustrated in (b) of the figure, in the parallax detection pixel 230, one large microlens is arranged so as to cover the nine pixel circuits. In addition, in the parallax detection pixel 230, the color filter that allows green (G) light to pass therethrough uniformly covers the nine pixel circuits.

[Example of Cross-Sectional Structure of Picture Generation Pixel and Parallax Detection Pixel]

FIG. 4 is a schematic diagram illustrating an example of a cross-sectional structure of the picture generation pixel and the parallax detection pixel according to the first embodiment of the technology.

In (a) of the figure, to describe a position of a cross-sectional surface in the cross-sectional structure illustrated in (b) of the figure, a pixel circuit of three rows and nine columns viewed from the backside of the light receiving surface of the image pickup device 200 and a position of the cross-sectional surface (a-b line) in (b) of the figure are illustrated. In (b) of the figure, as illustrated in (a) of the figure, description will be given on the assumption that the pixel circuits arranged in three columns in the middle of the pixel circuits of three rows and nine columns are the parallax detection pixels.

In (b) of the figure, a cross-sectional structure taken along the a-b line in (a) of the figure is illustrated. In (b) of the figure, the microlenses 261, R filters 262, G filters 263, photodetectors 264, wirings 269, the parallax detection pixel 230, the parallax-detection-use microlens 231, and a G filter 232 are illustrated. In addition, in (b) of the figure, a microlens layer S1 and a parallax-detection-use microlens layer S2 are illustrated.

The microlens 261 is a lens collecting object light in the photodetector. The microlens 261 is provided for each pixel circuit. Moreover, the microlens 261 is provided on the microlens layer S1 (a layer close to the photodetector 264) of the two microlens layers (the microlens layer S1 and the parallax-detection-use microlens layer S2) provided in the image pickup device.

The photodetector 264 converts the received light into an electrical signal (photoelectric conversion), thereby generating an electrical signal having an intensity corresponding to an amount of the received light. For example, the photodetector 264 is configured of a photo diode (PD). The photodetector 264 is provided for each pixel circuit. In other words, nine photodetectors are provided in the parallax detection pixel 230 that is configured of the nine pixel circuits.

The R filter 262, the G filter 263, and the G filter 232 are color filters allowing light with a specific wavelength range to pass therethrough. The R filter 262 is a color filter allowing light within a wavelength range showing red (R) to pass therethrough, and allows the photodetector of the R pixel to receive light within a wavelength range showing red. In addition, the G filter 263 and the G filter 232 are color filters allowing light within a wavelength range showing green (G) to pass therethrough. The G filter 263 allows the photodetector of the G pixel to receive light within a wavelength range showing green, and the G filter 232 allows the photodetector of the parallax detection pixel 230 to receive light within a wavelength range showing green. In the picture generation pixel, a color filter (the R filter 262, the G filter 263, or the B filter) corresponding to light within a wavelength range (R, G, or B) that is received by the picture generation pixel is provided. Moreover, in the parallax detection pixel, the G filter 263 covers all of the nine pixel circuits of the parallax detection pixel.

The wiring 269 connects each circuit in each pixel circuit. For example, the wiring connecting each circuit is arranged in such a manner that three wirings are layered with respect to the optical axis, as with the wiring 269 illustrated in (b) of the figure. In addition, the wiring 269 is formed of a metal, and thus functions as a light shielding layer that shields object light leaking into adjacent pixels. Moreover, the wiring 269 is arranged at an end of each pixel circuit so as not to block light entering the photodetector.

The parallax-detection-use microlens 231 is a lens collecting object light to detect parallax. The parallax-detection-use microlens 231 is formed in a layer (the parallax-detection-use microlens layer S2) farther from the photodetector of the two microlens layers. In other words, in the parallax detection pixel 230, the parallax-detection-use microlens 231 is provided on the microlens (the microlens 261) of the parallax detection pixel 230 (on a minus side in the Z-axis direction) so as to cover the microlenses 261. Note that a microlens is not provided at a position of the picture generation pixel in the parallax-detection-use microlens layer S2, and the surface is flat not blocking passing light.

Next, a relationship between the pixel circuit and the object light entering the parallax-detection-use microlens in the parallax detection pixel will be described with reference to FIG. 5.

[Example of Object Light Entering Parallax Detection Pixel]

FIG. 5 is a diagram schematically illustrating object light that is received by the parallax detection pixel according to the first embodiment of the technology.

In the figure, a cross-sectional structure of the parallax detection pixel 230 is illustrated in (b) of the figure, and an exit pupil (an exit pupil E1) that is a shape of a diaphragm viewed from the parallax detection pixel 230 is schematically illustrated in (a) of the figure. Note that the exit pupil essentially has a substantially circular shape, however in (a) of the figure, the exit pupil having a short length in the Y-axis direction (elliptical shape) is illustrated for convenience of description. In addition, the exit pupil viewed from the image pickup device 200 side is illustrated.

Incidentally, the cross-sectional structure of the parallax detection pixel 230 illustrated in (b) of the figure is the same as the cross-sectional structure of the parallax detection pixel 230 illustrated in (b) of FIG. 4. In addition, in (b) of FIG. 4, the photodetector of the pixel circuit 4 (see (b) of FIG. 3) is indicated as a photodetector (4) 291, the photodetector of the pixel circuit 5 is indicated as a photodetector (5) 292, and the photodetector of the pixel circuit 6 is indicated as a photodetector (6) 293.

Furthermore, in (b) of the figure, part of the object light received by the photodetector (4) 291 is indicated as a region (a region R23) with a lot of dots. In addition, part of the object light received by the photodetector (5) 292 is indicated as a gray region (a region R22). Further, part of the object light received by the photodetector (6) 293 is indicated as a region (a region R21) with small number of dots.

Moreover, in the exit pupil E1 illustrated in (a) of the figure, a region indicated as a region 21 in (b) of the figure, where the object light (the object light to be received by the pixel circuit 6) passes, is indicated as a region (a region R11) with small number of dots in the exit pupil E1. Likewise, a region indicated as a region 22, where the object light (the object light to be received by the pixel circuit 5) passes, is indicated as a gray region (a region R12) in the exit pupil E1. A region indicated as a region 23, where the object light (the object light to be received by the pixel circuit 4) passes, is indicated as a region (a region R13) with a lot of dots in the exit pupil E1. Further, in the exit pupil E1, regions where the object light to be received by other pixel circuits passes, are indicated by regions 14 to 19.

A relationship between the object light received by the photodetector (4) 291 to the photodetector (6) 293 and the regions R11 to R13 in the exit pupil E1 is described now. The parallax-detection-use microlens 231 functions to collect the object light so that the object light that has passed through the specific regions (the regions corresponding to the respective photodetectors) in the exit pupil E1 is received by the respective photodetectors of the pixel circuits 1 to 9. As a result, the photodetector of the pixel circuit 4 (the photodetector (4) 291) receives the object light that has passed through the region R13. The photodetector of the pixel circuit 5 (the photodetector (5) 292) receives the object light that has passed through the region R12. In addition, the photodetector of the pixel circuit 6 (the photodetector (6) 293) receives the object light that has passed through the region R11. Note that the same applies to the not-illustrated pixel circuits 1 to 3 and the not-illustrated pixel circuits 7 to 9. The photodetector of the pixel circuit 1 receives the object light that has passed through the region 19, the photodetector of the pixel circuit 2 receives the object light that has passed through the region 18, and the photodetector of the pixel circuit 3 receives the object light that has passed through the region 17. Moreover, the photodetector of the pixel circuit 7 receives the object light that has passed through the region 16, the photodetector of the pixel circuit 8 receives the object light that has passed through the region 15, and the photodetector of the pixel circuit 9 receives the object light that has passed through the region 14.

[Example of Principle of Parallax Detection by Parallax Detection Pixel]

FIG. 6 is a diagram schematically illustrating a principle of parallax detection by the parallax detection pixel 230 according to the first embodiment of the technology.

In (a) and (c) of the figure, an imaging position on an imaging surface of the object light (corresponding to the object light received by a left eye of a user) that passes through the left side of the exit pupil (the exit pupil E1) is schematically illustrated. In addition, in (b) and (d) of the figure, an imaging position on the imaging surface of the object light (corresponding to the object light received by a right eye of the user) that passes through the right side of the exit pupil (the exit pupil E1) is schematically illustrated.

In (a) and (b) of the figure, an object that is focused on (a focused object) is indicated by a black rectangle (a focused object 271) located above the exit pupil E1 (on the minus side than the exit pupil E1 in the Z-axis direction). In addition, an object (a close positioned object) located closer to the image pickup unit 100 compared with the focused object 271 is indicated by a dotted circle (a close positioned object 272) located at a position above the exit pupil E1 and lower than the focused object 271. Note that, it is assumed that the focused object 271 and the close positioned object 272 are located on a line (a chained line in (a) and (b) of the figure) that passes through the center of the exit pupil E1 and is parallel to the optical axis of the lens, for convenience of description.

Moreover, an optical path of the light from the focused object 271 and the close positioned object 272 is indicated by a line (a solid line (a line L1 or a line L3) for the focused object 271, and a dashed line (a line L2 or a line L4) for the close positioned object 272) that passes through the exit pupil E1 and extends to the imaging surface. Then, the imaging positions on the imaging surface of the focused object 271 and the close positioned object 272 are indicated by the black rectangle and the dotted circle, respectively, that are located at positions where the lines L1 to L4 and the imaging surface are intersected with each other. Note that, as for the light from the close positioned object 272, the imaging position in the case of the assumption that the light is focused on the close positioned object 272 is schematically illustrated by a dashed circle located at a position where the dashed line (the line L2 or the line L4) and the chained line are intersected with each other.

In addition, (c) and (d) of FIG. 6 schematically illustrate images (pictures 281 and the 282) when the imaging surfaces illustrated in (a) and (b) of the figure are viewed from the backside (on a side opposite to the light receiving surface of the image pickup device 200). In the picture 281, the black rectangle and the dotted circle are illustrated, and a distance ($-\Delta X$) between the black rectangle and the dotted circle is also illustrated. Likewise, in the picture 282, the black rectangle, the dotted circle, and a distance ($+\Delta X$) therebetween are illustrated.

The imaging position of the object light that passes through the left side of the exit pupil E1 and the imaging position of the object light that passes through the right side thereof are described now with reference to (a) to (d) of the figure.

First, the optical path (the line L1 and the line L3) of the light from the focused object 271, which illustrates the optical path in the case where focus is adjusted (focusing) is described. In the case where the object to be captured is focused, the object light that has passed through the exit pupil E1 enters (is collected to) the position of the imaging surface corresponding to the position of the object, irrespective of the position in the exit pupil E1 where the object light passes. In other words, the imaging position of the light from the focused object 271 that passes through the left side of the exit pupil E1, is the same as the imaging position of the light from the focused object 271 that passes through the right side of the exit pupil E1.

On the other hand, when the object to be captured is out of focus, the light-entering position on the imaging surface differ depending on difference of the position in the exit pupil E1 where the object light passes. Since light that is originally collected on a surface different from an imaging surface (light-collected position is indicated by a dashed circle below the imaging surface in (a) and (b) of the figure) is received by the imaging surface, the light-entering position on the imaging surface is deviated depending on the degree of deviation of the focus. As illustrated by the close positioned object 272, the line L2, and the line L4 in (a) and (b) of the figure, when the object to be captured is located on a side closer to the lens than the front focusing surface (the surface at which the focused object 271 is located), the back focusing surface (the surface at which the dashed circle is located) is located behind the imaging surface (on the plus side in the Z-axis direction). In other words, the light (the line L2) that is from the close positioned object 272 and enters the imaging surface through the left side of the exit pupil E1, enters the imaging surface at the position shifted to the left from the position where the light from the focused object 271 enters (see (a) of the figure). In addition, the light (the line L4) that is from the close positioned object 272 and enters the imaging surface through the right side of the exit pupil E1, enters the imaging surface at the position shifted to the right from the position where the light from the focused object 271 enters (see (b) of the figure).

In this way, when the object that is out of focus is captured, the entering position on the imaging surface is different between the light from the object that has passed through the left side of the exit pupil and the light from the object that has passed through the right side thereof, depending on the degree of deviation of the focus. The deviation causes defocusing, thereby resulting in blur in the picture generated from the signal of the picture generation pixel. On the other hand, in the parallax detection pixel 230, the light that has passed through the left side of the exit pupil is received by the photodetectors of the pixel circuits in the right column (the pixel circuits 3, 6, and 9 in (b) of FIG. 3) of (the nine pieces of) the pixel circuits of three rows and three columns. In addition, the light that has passed through the right side of the exit pupil is received by the photodetectors of the pixel circuits in the left column (the pixel circuits 1, 4, and 6 in (b) of FIG. 3).

In other words, the information of the left-eye image is allowed to be generated by the signals from the pixel circuits in the right column (third column) in the parallax detection pixel 230, as illustrated in (a) and (c) of the figure. In addition, the information of the right-eye image is allowed to be generated by the signals from the pixel circuits in the left column (first column) in the parallax detection pixel 230, as illustrated in (b) and (d) of the figure. As described above, when the pictures are generated based on the signals from the parallax detection pixel 230, two pictures in which images are displaced depending on the distance of the object are allowed to be generated as illustrated in the pictures 281 and 282.

[Example of Parallax Detection Direction in Horizontal Shooting]

FIG. 7 is a diagram schematically illustrating an example of a direction of the parallax detection by the parallax detection pixels 230 when the image pickup unit 100 according to the first embodiment of the technology is used to perform the horizontal shooting.

(a) of the figure illustrates a posture of the image pickup unit 100 assumed in the figure. In the figure, as illustrated in (a) of the figure, it is assumed that the image pickup unit 100 is used sideways (the lateral direction corresponds to the X-axis direction, and the vertical direction corresponds to the Y-axis direction) to perform shooting (the horizontal shooting) so that the long side of the picture corresponds to the horizontal direction and the short side thereof corresponds to the vertical direction.

Note that the case where the image pickup unit 100 is rotated by 90 degrees in a counterclockwise direction and the shooting (the vertical shooting) is performed using the image pickup unit 100 lengthwise will be described with reference to FIG. 8.

(b) of the figure illustrates the posture of the image pickup device 200 in the case of the horizontal shooting and lines (parallax detection lines (row direction) 235) indicating the parallax detection pixels 230 used in the parallax detection in the posture. Note that in (b) of the figure, the region 250 illustrated in (b) of FIG. 2 is illustrated as it is so as to illustrate arrangement of the pixels in the image pickup device 200.

In (b) of the figure, the image pickup device 200 in which the long side direction (the X-axis direction) corresponds to the lateral (horizontal) direction, and the short side direction (the Y-axis direction) corresponds to the vertical direction is illustrated. In addition, in the image pickup unit 200, lines in which the parallax detection pixels 230 used in the parallax detection in the horizontal shooting, out of the parallax detection pixels 230 arranged in lines in the row direction and the column direction are indicated by thick solid lines (parallax detection pixel lines (row direction) 235).

As illustrated in (b) of the figure, in the case of the horizontal shooting, the parallax detection pixels 230 arranged in lines in the row direction of the image pickup device 200 are used to detect parallax. Accordingly, the parallax in the horizontal (lateral) direction is allowed to be detected.

In (c) of the figure, the posture of the parallax detection pixel 230 in the case of the horizontal shooting is illustrated. Moreover, in the parallax detection pixel 230, the pixel circuits generating signals related to a right eye are indicated by rectangles with a lot of dots (the pixel circuits 1, 4, and 7). Likewise, the pixel circuits generating information related to a left eye are indicated by rectangles with small number of dots (the pixel circuits 3, 6, and 9). Incidentally, in (c) of the figure, the dashed circle (the microlens 261) illustrated in (b) of FIG. 3 is omitted for convenience of description.

As illustrated in (c) of FIG. 7, in the case of the horizontal shooting, the parallax detection pixels 230 arranged in the row direction of the image pickup device 200 are used to detect parallax.

[Example of Parallax Detection Direction in Vertical Shooting]

FIG. 8 is a diagram schematically illustrating an example of a direction of the parallax detection by the parallax detection pixels 230 when the image pickup unit 100 according to the first embodiment of the technology is used to perform the vertical shooting.

(a) of the figure illustrates a posture of the image pickup unit 100 assumed in the figure. The image pickup unit 100 in (a) of the figure is in a posture in which the image pickup unit 100 in (a) of FIG. 7 is rotated by 90 degrees in a counterclockwise direction. As described above, in FIG. 8, it is assumed that the shooting (the vertical shooting) is performed while the image pickup unit 100 is used lengthwise (the lateral direction corresponds to the Y-axis direction, and the vertical direction corresponds to the X-axis direction) as illustrated in (a) of the figure.

(b) of the figure illustrates the posture of the image pickup device 200 in the case of the vertical shooting and lines (parallax detection lines (column direction) 236) indicating the parallax detection pixels 230 used in the posture.

In (b) of the figure, the image pickup device 200 in which the long side direction (the X-axis direction) corresponds to the vertical direction, and the short side direction (the X-axis direction) corresponds to the lateral (horizontal) direction is illustrated. The image pickup unit 200 in (b) of the figure is in a state where the image pickup device 200 in (b) of FIG. 7 is rotated by 90 degrees in a counterclockwise direction. In addition, in the image pickup unit 200 in (b) of FIG. 8, lines in which the parallax detection pixels 230 used in the parallax detection in the vertical shooting, out of the parallax detection pixels 230 arranged in lines in the row direction and the column direction are indicated by thick solid lines (parallax detection pixel lines (column direction) 236).

As illustrated in (b) of the figure, in the case of the vertical shooting, the parallax detection pixels 230 arranged in lines in the column direction of the image pickup device 200 are used to detect parallax. Accordingly, the parallax in the horizontal (lateral) direction is allowed to be detected even in the case where the image pickup unit 100 is used lengthwise (the long side of the picture corresponds to the vertical direction, and the short side thereof corresponds to the lateral direction).

In (c) of the figure, the posture of the parallax detection pixel 230 in the case of the vertical shooting is illustrated. The parallax detection pixel 230 in (c) of the figure is in a state where the parallax detection pixel 230 in (c) of FIG. 7 is rotated by 90 degrees in the counterclockwise direction. Moreover, in the parallax detection pixel 230 in (c) of FIG. 8, the pixel circuits generating signals related to the right eye are indicated by rectangles with a lot of dots (the pixel circuits 1 to 3). Likewise, the pixel circuits generating information related to the left eye are indicated by rectangles with small number of dots (the pixel circuits 7 to 9).

In this way, in the case of the vertical shooting, parallax is detected using the parallax detection pixels arranged in lines in a column direction of the image pickup device 200. Accordingly, similarly to the case of the horizontal shooting, information corresponding to the left eye and the right eye in the case where a human stands upright (information of horizontal parallax) is allowed to be generated.

[Generation Example of 3D Picture]

FIG. 9 is a schematic diagram illustrating a generation example of a 3D picture by the image pickup unit 100 according to the first embodiment of the technology.

In the figure, pictures that are generated by the 2D picture generation section 310, the parallax detection section 320, and the 3D picture generation section 330 based on the picture data generated by the image pickup device 200 capturing an image of the object are illustrated. In addition, in the figure, with use of the pictures, a flow to generate a stereoscopic picture (a left-eye picture and a right-eye picture) based on the picture data generated by the image pickup device 200 is described in order. Note that, in the figure, it is assumed that the shooting is performed by the horizontal shooting as illustrated in FIG. 7.

First, generation of the 2D picture (the planar picture) by the 2D picture generation section 310 is described with reference to (a) and (b) of the figure.

In (a) of the figure, a planar picture (a planar picture 311) that is generated by the 2D picture generation section 310 based on the signals generated by the picture generation pixels in the image pickup device 200, before interpolation of the signal of the parallax detection pixel is illustrated. In the planar picture 311, two persons (a person 351 and a person 352) as captured objects are shown. In the figure, it is assumed that the shooting was performed in a state where the person 352 was focused. In addition, in the figure, it is assumed that the person 351 is positioned closer to the lens compared with the person 352. In other words, it is assumed that the person 351 is out of focus. Dashed lines enclosing the person 351 fourfold schematically illustrate blur of the image due to defocusing.

Moreover, in the planar picture 311, absence of the signals for generating picture (absence of the pixel value) at the position where the parallax detection pixels are arranged is indicated by a plurality of gray lines (pixel value missing lines 353) that indicate absence of the data (the pixel value) in the planar picture 311.

As described above, the picture (the planar picture 311) in which the pixel values of the positions of the parallax detection pixels are missed is generated from the signals generated by the picture generation pixels. Therefore, the 2D picture generation section 310 interpolates the pixel values at the positions of the parallax detection pixels to generate a planar picture in which the missing pixel values have been interpolated.

In (b) of FIG. 9, a picture (a planar picture 312) after the 2D picture generation section 310 performs the interpolation processing on the planar picture 311 illustrated in (a) of the figure is illustrated. The 2D picture generation section 310 performs the interpolation processing on the planar picture 311 to interpolate the missing pixel values (the pixel value missing lines 353 in (a) of the figure). Further, other interpolation processing and demosaic processing are performed to generate the planar picture (the planar picture 312) as with the picture captured by an image pickup device (a typical image pickup device) that has picture generation pixels and no parallax detection pixel. Then, the generated planar picture 312 is supplied to the 3D picture generation section 330.

Next, generation of a parallax information picture by the parallax detection section 320 is described with reference to (c) and (d) of the figure.

In (c) of the figure, two pictures (a left-eye information picture 321 and a right-eye information picture 322) that are generated by the parallax detection section 320 based on the signals generated by the parallax detection pixels in the image pickup device 200 and are sources of the parallax information picture are illustrated.

The left-eye information picture 321 is a picture generated based on the signals from the pixel circuits that have received the object light corresponding to the light to be received by a left eye of a user, out of the nine pixel circuits in the parallax detection pixel. In addition, the right-eye information picture 322 is a picture generated based on the signals from the pixel circuits that have received the object light corresponding to the light to be received by a right eye of the user, out of the nine pixel circuits in the parallax detection pixel.

Moreover, in the left-eye information picture 321, persons 361 and 362 that correspond to the persons 351 and 352, respectively, shown in (a) of the figure are shown. Likewise, in the right-eye information picture 322, persons 363 and 364 that correspond to the persons 351 and 352, respectively, shown in (a) of the figure are shown.

The generation of the left-eye information picture 321 and the right-eye information picture 322 by the parallax detection section 320 is described now.

The parallax detection section 320 determines the pixel circuits that have generated the signals to be the left-eye information picture 321 and the pixel circuits that have generated the signals to be the right-eye information picture 322, based on the posture information supplied from the posture detection section 140. Since the picture is captured by the horizontal shooting in the figure, the parallax detection section 320 generates the left-eye information picture 321 from the signals of the pixel circuits in the right column (the pixel circuits 3, 6, and 9 in (b) of FIG. 7), as illustrated in FIG. 7. In addition, the parallax detection section 320 generates the right-eye information picture 322 from the signals of the pixel circuits in the left column (the pixel circuits 1, 4, and 7 in (b) of FIG. 7). Then, the parallax detection section 320 generates the parallax information picture, based on the generated pictures (the left-eye information picture 321 and the right-eye information picture 322).

In (d) of FIG. 9, the parallax information picture (a parallax information picture 323) generated based on the left-eye information picture 321 and the right-eye information picture 322 is schematically illustrated.

In the parallax information picture 323, an image (a person 371) including the parallax that is detected based on the person 361 in the left-eye information picture 321 and the person 363 in the right-eye information picture 322 is shown. Likewise, in the parallax information picture 323, an image (a person 372) including the parallax that is detected based on the person 362 in the left-eye information picture 321 and the person 364 in the right-eye information picture 322 is shown.

The parallax information picture 323 is now described focusing on the two images (the person 371 and the person 372) shown in the parallax information picture 323.

The person 371 is shown in the parallax information picture 323 in such a manner that the person 361 in the left-eye information picture 321 and the person 363 in the right-eye information picture 322 are overlapped with each other (images of the two persons are overlapped and slightly shifted to right and left). A distance (a distance 373) between two dashed lines that are extended in the vertical direction from the person 371 indicates a distance between the two images that are overlapped and slightly shifted to right and left. In the figure, the object indicated by the person 371 is out of focus (see the person 351 in (a) and (b) of the figure). In other words, the parallax occurs as illustrated in FIG. 6, and positional displacement according to the defocusing amount is generated between the person 361 in the left-eye information picture 321 and the person 363 in the right-eye information picture 322. The distance 373 in (d) of FIG. 9 schematically illustrates the positional displacement (the parallax).

On the other hand, the person 372 is shown in the parallax information picture 323 in such a manner that the person 362 in the left-eye information picture 321 and the person 364 in the right-eye information picture 322 exactly coincide with each other (like one image of a person). In the figure, since the object indicated by the person 372 (the person 362 and the person 364) is focused (see the person 352 in (a) and (b) of the figure), the parallax related to the image of the person is absent (the parallax is "zero"). Specifically, the position of the person 362 in the left-eye information picture 321 and the position of the person 364 in the right-eye information picture 322 coincide with each other. In other words, (d) of the figure illustrates absence of the information related to the parallax for the image of the person 372 in the parallax information picture 323.

The parallax information picture 323 illustrated in (d) of the figure is generated and then supplied to the 3D picture generation section 330.

Next, generation of a stereoscopic picture (the left-eye picture and the right-eye picture) by the 3D picture generation section 330 is described with reference to (e) of the figure.

In (e) of the figure, a left-eye (L) picture (a left-eye picture 331) and a right-eye (R) picture (a right-eye picture 332) that are generated by the 3D picture generation section 330, based on the planar picture 312 and the parallax information picture 323, are schematically illustrated. Incidentally, as a method of generating a stereoscopic picture based on a planar picture and a parallax information picture, various kinds of methods are considerable, and in this case, an example in which a left-eye picture and a right-eye picture are generated by displacing positions of objects in the planar picture based on the parallax information picture is described as an example.

The left-eye picture 331 is a picture to be displayed with respect to a left eye of a user viewing a captured picture. In the left-eye picture 331, a person 382 is shown at a position same as the position of the person 352 in the planar picture 312 and as the position of the person 372 in the parallax information picture 323. In addition, in the left-eye picture 331, a person 381 is shown at a position same as the right position of the person 371 in the parallax information picture 323 (as the position of the person 361 in the left-eye information picture 321). The person 381 is an image obtained by displacing the position of the person 351 in the planar picture 312. Incidentally, in (b) of the figure, a dashed line (a line L11) that extends from the center of the person 381 in the vertical direction is shown in order to schematically illustrate the position of the person 381.

The right-eye picture 332 is a picture to be displayed with respect to a right eye of the user viewing the captured picture. In the right-eye picture 332, a person 384 is shown at a position same as the position of the person 352 in the planar picture 312 and as the position of the person 372 in the parallax information picture 323. In addition, in the right-eye picture 332, a person 383 is shown at a position same as the left position of the person 371 in the parallax information picture 323 (as the position of the person 363 in the right-eye information picture 322). The person 383 is an image obtained by displacing the position of the person 351 in the planar picture 312. Incidentally, in (b) of the figure, a dashed line (a line L12) that extends from the center of the person 383 in the vertical direction is shown in order to schematically illustrate the position of the person 381, and an arrow indicating a distance (the distance 373) between the line L11 and the line L12 is also shown. In other words, the person 383 is shown at a position displaced from the person 381 in the left-eye picture 331 to left side by about the distance 373.

The 3D picture generation section 330 generates a stereoscopic picture (a 3D picture) that is configured of the left-eye picture 331 and the right-eye picture 332 illustrated in (e) of the figure, based on the planar picture 312 and the parallax information picture 323. Specifically, the 3D picture generation section 330 displaces the position of each object in the planar picture 312 according to the parallax indicated by the parallax information picture 323, thereby generating the left-eye picture 331 and the right-eye picture 332. Since there is no parallax information for the person 372 in the parallax information picture 323, the 3D picture generation section 330 generates the left-eye picture 331 and the right-eye picture 332 while maintaining the position of the person 352 in the planar picture 312 (the person 382 and the person 384). Moreover, the 3D picture generation section 330 displaces the position of the person 351 in the planar picture 312 according to the parallax indicated by the person 371 in the parallax information picture 323 (the person 381 and the person 383), thereby generating the left-eye picture 331 and the right-eye picture 332. The 3D picture generation section 330 supplies the generated stereoscopic picture (the left-eye picture 331 and the right-eye picture 332) as stereoscopic picture contents to the display section 151 and the memory section 152.

As described above, the signal processing section 300 generates the stereoscopic picture, based on the planar picture and the parallax information picture.

[Operation Example of Image Pickup Unit]

Next, an operation of the image pickup unit 100 according to the first embodiment of the technology is described with reference to figures.

FIG. 10 is a flowchart illustrating an example of an image pickup processing procedure when a stereoscopic picture is captured by the image pickup unit 100 according to the first embodiment of the technology.

First, the control section 130 determines whether a starting instruction of image pickup operation for capturing a stereoscopic picture is issued by a user (step S901). Then, when it is determined that the starting instruction of the image pickup operation for capturing the picture is not issued by the user (step S901), the image pickup processing procedure is ended.

On the other hand, when it is determined that the starting instruction of the image pickup operation for capturing the stereoscopic picture is issued by the user (step S901), a live view picture is displayed on the display section 151 in order to determine the composition of the stereoscopic picture (step S902). Subsequently, the control section 130 determines whether a shutter button is pushed halfway by the user who has determined the composition of the stereoscopic picture (step S903). Then, when it is determined that the shutter button is not pushed halfway (step S903), the procedure proceeds to step S908.

On the other hand, when it is determined that the shutter button is pushed halfway (step S903), focusing processing in which the focus lens 113 is driven to focus on a target to be focused (an object to be focused) is performed (step S904). Subsequently, the control section 130 determines whether the shutter button is fully pushed by the user (step S903). Then, when it is determined that the shutter button is not fully pushed (step S905), the procedure returns to step S902.

On the other hand, when it is determined that the shutter button is fully pushed (step S905), the image pickup device 200 captures an image of the object (step S906). Then, the signal processing section 300 performs stereoscopic picture generation processing for generating a stereoscopic picture (a 3D picture) based on the picture data of the captured image (step S920). Note that the stereoscopic picture generation processing (step S920) will be described with reference to FIG. 11.

Subsequently, the generated stereoscopic picture is stored in the memory section 152 (step S907). Then, the control section 130 determines whether the ending instruction of the image pickup operation for capturing a stereoscopic picture is issued by the user (step S908). Then, when it is determined that the ending instruction of the image pickup operation for capturing a stereoscopic picture is not issued by the user (step S908), the procedure returns to step S902.

On the other hand, when it is determined that the ending instruction of the image pickup operation for capturing a stereoscopic picture is issued by the user (step S908), the image pickup processing procedure is ended.

FIG. 11 is a flowchart illustrating an example of a processing procedure of the stereoscopic picture generation processing (step S920) in the image pickup processing procedure according to the first embodiment of the technology.

First, the 2D picture generation section 310 generates the planar picture (the 2D picture) based on the pixel values of the picture generation pixels in the picture data supplied from the image pickup device 200 (step S921). Then, 2D picture generation section 310 interpolates the pixel values at the positions of the parallax detection pixels in the generated planar picture (step S922).

Subsequently, the parallax detection section 320 acquires, from the posture detection section 140, the information (the posture information) related to the posture when the image pickup device 200 captures an image of the object (step S923). Then, the lateral direction (the horizontal direction) is detected based on the posture information, and the parallax detection section 320 determines the pixel circuits generating left-eye data and the pixel circuits generating right-eye data, out of the nine pixel circuits in the parallax detection pixel (step S924).

Subsequently, the parallax detection section 320 generates a left-eye information picture based on the pixel values of the pixel circuits generating the left-eye data out of the pixel values in the picture data supplied from the image pickup device 200 (step S925). In addition, the parallax detection section 320 generates a right-eye information picture based on the pixel values of the pixel circuits generating the right-eye data out of the pixel values in the picture data supplied from the image pickup device 200 (step S926). Then, the parallax detection section 320 generates the parallax information picture based on the generated left-eye information picture and the generated right-eye information picture (step S927). Note that steps S925, S926, and S927 are an example of the procedure of detecting parallax described in CLAIMS. In addition, steps S921 and S922 are an example of the procedure of generating a planar picture described in CLAIMS.

Subsequently, the 3D picture generation section 330 generates a left-eye picture and a right-eye picture, based on the planar picture and the parallax information picture (step S928). Then, after step S928, the stereoscopic picture generation processing procedure is ended. Note that step S928 is an example of a stereoscopic picture generation procedure described in CLAIMS.

As described above, according to the first embodiment of the technology, it is possible to generate the stereoscopic picture with high resolution by moving the position of each object in the picture that is generated by the picture generation pixels based on the parallax detected by the parallax detection pixels. In particular, according to the first embodiment of the technology, it is possible to suppress decrease in the number of effective pixels in the image pickup unit that generates a stereoscopic picture with use of the parallax detection pixels. For example, in an image pickup device in which all pixels in the image pickup device are parallax detection pixels each configured of pixel circuits of three rows and three columns, the number of effective pixels is decreased to one-ninth. In contrast thereto, in the image pickup device 200 according to the first embodiment of the technology, since the parallax detection pixels are arranged in lines in the row direction and the column direction with predetermined intervals, it is possible to suppress decrease in the number of effective pixels as the interval between lines is increased. Moreover, since the picture generation pixel in which one pixel circuit configures one pixel is arranged in the image pickup device 200, it is possible to capture the planar picture (the 2D picture), and accordingly, a stereoscopic picture or a planar picture is selectable according to the purpose of the user.

2. Second Embodiment

In the first embodiment of the technology, an example in which a stereoscopic picture is generated based on the pixel values generated by the nine pixel circuits configuring the parallax detection pixel is described. Note that, since the pixel vales generated by the nine pixel circuits in the parallax detection pixel include information related to defocusing, the pixel values may be used for focus determination by a phase difference detection system. In this case, phase difference detection is a method of detecting a focal point in which light that has passed through the image pickup lens is divided by pupil division to form a pair of images, and a distance between the formed images (a displacement amount between the images) is measured (a phase difference is detected) to detect degree of focusing.

Therefore, in a second embodiment of the technology, an example of an image pickup unit that performs focus determination by the phase difference detection with use of parallax detection pixels in addition to generation of a stereoscopic picture will be described with reference to FIG. 12 to FIG. 16.

[Example of Functional Configuration of Image Pickup Unit]

FIG. 12 is a block diagram illustrating an example of a functional configuration of an image pickup unit 400 according to the second embodiment of the technology.

The image pickup unit 400 in the figure is provided with a focus determination section 410 in addition to the components of the image pickup unit 100 illustrated in FIG. 1. The components other than the focus determination section 410 in FIG. 12 are similar to the components illustrated in FIG. 1. Therefore, the description is given focusing on the focus determination section 410.

The focus determination section 410 determines, based on the signal from the parallax detection pixel, whether focus is adjusted. The focus determination section 410 determines whether an object (an object to be focused) is focused in a region for focusing (a focus region), based on the pixel values of the nine pixel circuits in the parallax detection pixel in the captured picture data supplied from the image pickup device 200. When it is determined that the object is focused, the focus determination section 410 supplies information indicating that focus is adjusted, as focus determination result information to the drive section 170. In addition, when it is determined that the object to be focused is out of focus, the focus determination section 410 calculates an amount of defocusing (a defocusing amount), and supplies information indicating the calculated defocusing amount as the focus determination result information to the drive section 170.

Incidentally, the drive section 170 calculates a drive amount of the focus lens 113 based on the focus determination result information output from the focus determination section 410, and moves the focus lens 113 according to the calculated drive amount. When focus has been adjusted, the drive section 170 allows the focus lens 113 to be maintained at the current position. Moreover, when focus has not been adjusted, the drive section 170 calculates the drive amount (movement length) based on the focus determination result information indicating the defocusing amount and the positional information of the focal lens 113, and moves the focus lens 113 according to the drive amount.

[Concept Example of Automatic Focus using Parallax Detection Pixel]

FIG. 13 is a diagram schematically illustrating a concept of automatic focus using the pixel values of the nine pixel circuits in the parallax detection pixel 230 according to the second embodiment of the technology.

Incidentally, in the figure, it is assumed that focusing is detected by generating a pair of images in the horizontal direction (in the lateral direction in the figure) at the time when the picture is captured in the horizontal shooting.

In (a) of the figure, a planar picture (a captured planar picture 440) of picture data captured by the image pickup device 200 for focus determination is illustrated. In the captured planar picture 440, an automobile (an automobile 441), a person (a person 443), and a tree (a tree 444) are shown as objects to be captured. In addition, in the captured planar picture 440, a chained rectangle indicating a focus region (a focus region 442) is also shown. Incidentally, to schematically illustrate defocusing, the person 443 is enclosed by double dashed lines, and the automobile 441 is enclosed by fourfold dashed lines.

Note that, in the figure, the number of dashed lines enclosing the automobile 441, the person 443, and the tree 444 indicates the degree of defocusing, and the focus is largely deviated as the number of dashed lines is increased. Specifically, in the figure, it is assumed that the tree 444 is focused at the time of capturing the captured planar picture 440, and the person 443 and the automobile 441 are out of focus (the automobile 441 is defocused more than the person 443).

(b) of the figure illustrates two pictures (a left-eye information picture 450 and a right-eye information picture 460) that are schematically illustrated as a pair of pictures corresponding to the captured planar picture 440 illustrated in (a) of the figure, for a pair of images generated by the focus determination section 410. Since the parallax detection pixels 230 are arranged in lines in the row direction and the column direction in the image pickup device 200 (see FIG. 2), the images shown in the left-eye information picture 450 and the right-eye information picture 460 are not generated actually. In FIG. 9, however, the description is made with schematic illustration of the pair of images in the entire captured picture (the captured planar picture 440) for convenience of description.

The left-eye information picture 450 illustrates a picture generated based on the pixel values of the pixels corresponding to the left eye out of the nine pixel circuits in the parallax detection pixel 230. An automobile 451 corresponding to the automobile 441 in (a) of FIG. 13, a person 453 corresponding to the person 443 in (a) of the figure, and a tree 454 corresponding to the tree 444 in (a) of the figure are shown in the left-eye information picture 450.

Moreover, the right-eye information picture 460 illustrates a picture generated based on the pixel values of the pixels corresponding to the right eye out of the nine pixel circuits in the parallax detection pixel 230. An automobile 461 corresponding to the automobile 441 in (a) of FIG. 13, a person 463 corresponding to the person 443 in (a) of the figure, and a tree 464 corresponding to the tree 444 in (a) of the figure are shown in the right-eye information picture 460.

In (c) of the figure, a picture (a comparative picture 470) schematically illustrating measurement of a distance between the pair of images (displacement amount between the images) by the focus determination section 410. In the comparative picture 470, an illustrated image is like an image in which the left-eye information picture 450 and the right-eye information picture 460 illustrated in (b) of the figure are overlapped, and an automobile 471, a person 473, and a tree 474 are shown. The automobile 471 is shown as an image in which a dark automobile is present on the left of a pale automobile. In addition, the person 473 is shown as an image in which a dark person is present on the left of a pale person. On the other hand, the tree 474 is shown as an image in which a dark tree and a pale tree are coincident with each other.

As illustrated in the comparative picture 470, the focus determination section 410 compares the pair of images (in the figure, the left-eye information picture 450 and the right-eye information picture 460).

Then, the focus determination section 410 calculates the amount of defocusing (the defocusing amount) from the displacement amount of the pair of images (a distance between edges) in the object to be focused (the person 473). The focus lens 113 is driven based on the defocusing amount so that the object to be focused is focused.

In (d) of the figure, the captured picture (a captured planar picture 490 after a lens is driven) after the focus lens 113 is driven based on the comparative picture 470 in (c) of the figure, and a picture (a comparative picture 480 after the lens is driven) indicating focus determination (image comparison) performed based on the shooting are illustrated.

In the comparative picture 480 after the lens is driven, a picture schematically illustrating measurement of the distance between the pair of images after the lens is driven based on the comparative picture 470 is illustrated. A tree 484 in which a dark tree is present on the right of a pale tree, a person 483 in which a dark person is coincident with a pale person, and an automobile 481 in which a dark automobile is present on the left of a pale automobile are shown in the comparative picture 470.

In the captured planar picture 490 after the lens is driven, an automobile (an automobile 491) enclosed by a dashed line, a person (a person 493) without a dashed line, a tree (a tree 494) enclosed by fourfold dashed lines, and a focus region 492 are shown. As described in (a) of the figure, the dashed line schematically indicates the degree of defocusing. In other words, in the captured planar picture 490 after the lens is driven, the person 493 that is an object to be focused is focused.

As described above, in the image pickup unit 400, the focus lens 113 is driven so that the pair of images for an object to be focused (person) is coincide with each other, and thus automatic focus is performed.

Note that, in FIG. 13, the concept of the automatic focus using the pixel values of the nine pixel circuits in the parallax detection pixel 230 is described. Next, in FIG. 14, description is given focusing on a comparison of data at the time of focus determination performed by the focus determination section 410.

[Example of Focus Determination by Focus Determination Section]

FIG. 14 is a diagram schematically illustrating focus determination using phase difference detection by the focus determination section 410 according to the second embodiment of the technology.

Incidentally, in the figure, the focus determination by the focus determination section 410 in the case illustrated in FIG. 13 is described. Note that, in the figure, for convenience of description, the description is given assuming that the number of lines of the parallax detection pixels 230 used for forming the pair of images is one.

In (a) of the figure, the pixel circuits generating signals related to one (right eye) and the other (left eye) of the pair of images are illustrated in the parallax detection pixel 230 in the case where the pair of images are formed in the lateral direction (the horizontal direction) as illustrated in (b) of FIG. 13. In the parallax detection pixel 230, the pixel circuits generating the signals related to the one (right eye) of the images are indicated by rectangles with a lot of dots (the pixel circuits 1, 4, and 7), and the pixel circuits generating the signals related to the other (left eye) of the images are indicated by rectangles with small number of dots (the pixel circuits 3, 6, and 9).

In (b) of FIG. 14, the positions of the parallax detection pixels 230 (focus determination line 421) whose pixel values are used in the focus determination section 410 (in which the pair of images are formed from its pixel values) is illustrated in order to calculate defocusing amount with respect to a set object to be focused. The pixel values of the respective pixel circuits in the parallax detection pixels 230 on the focus determination line 421 are used as illustrated (a) of the figure, and therefore the pair of images is formed.

The determination of the direction (the lateral direction or vertical direction) in which the phase difference is detected by the focus determination section 410 is briefly described now.

The focus determination section 410 determines a direction in which the displacement between the pair of images is detected, based on the pixel values related to the parallax detection pixel 230 of the picture data supplied from the image pickup unit 200. Depending on the shape or the pattern of the object to be focused, there is a case where displacement of images is accurately detected by forming the pair of images in the lateral direction (the horizontal direction), and a case where displacement of the images is accurately detected by forming the pair of images in the vertical direction (the gravitational-force direction). Therefore, the focus determination section 410 forms a pair of images based on the pixel values of the parallax detection pixels 230 arranged in line in a direction in which displacement of images is accurately detected.

In the figure, it is assumed that the direction in which the displacement amount is accurately detected is the lateral direction (the horizontal direction). Therefore, the pair of images is formed based on the pixel values of the parallax detection pixels 230 in the line in which the object to be focused is captured, out of the parallax detection pixel lines in the row direction. Note that the defocusing amount is allowed to be calculated if the displacement of edge of the object to be focused (the person 422) is detected. Accordingly, the pair of images is formed from the pixel values of the parallax detection pixels (on the focus determination line 421) located in the vicinity of the focus region.

In (c) of the figure, a graph schematically illustrating calculation of the defocusing amount by the focus determination section 410 is illustrated. In (c) of the figure, as illustrated in FIG. 13, the description is given assuming that the object to be focused is located on a side closer to the lens than the focus surface.

(c) of FIG. 14 illustrates a graph indicating the pair of images generated by the focus determination section 410 by distribution data of pixel values, in the case where the horizontal axis indicates a pixel position of the parallax detection pixel 230 in the image pickup device 200, and the vertical axis indicates output gradation that indicates intensity of an output signal. In the graph, pixel-value distribution data (right-eye signal distribution data 431) generated based on the pixel values of the pixel circuits 1, 4, and 7 (corresponding to the right eye) illustrated in (a) of the figure is illustrated. In addition, in the graph, pixel-value distribution data (left-eye signal distribution data 432) generated based on the pixel values of the pixel circuits 3, 6, 9 (corresponding to the left eye) illustrated in (a) of the figure is illustrated.

The focus determination section 410 generates the right-eye signal distribution data 431 and the left-eye signal distribution data 432 from the pixel values of the parallax detection pixels 230 in the focus determination line 421. Then, the focus determination section 410 calculates the defocusing amount from a distance (a distance A1) between a position of a peak (an edge) of the right-eye signal distribution data 431 and a position of a peak (an edge) of the left-eye signal distribution data 432. After that, the focus determination section 410 supplies the calculated defocusing amount as the focus determination result information to the drive section 170, and drives the focus lens 113 by an amount corresponding to the defocusing amount.

(d) of the figure illustrates the distribution data (right-eye signal distribution data 433 and left-eye signal distribution data 434) in the case where the focus lens 113 is driven based on the distribution data (the pair of images) illustrated in (c) of the figure and the object to be focused is focused. As illustrated by the graph in (d) of the figure, when the object to be focused is focused, the position of the edge of the right-eye signal distribution data 433 is coincident with the position of the edge of the left-eye signal distribution data 434.

As described above, in the image pickup unit 400, the focus lens 113 is driven so that the positions of the edges of the pair of generated images (the distribution data) are coincident with each other as illustrated in (d) of the figure, and therefore, the automatic focus is performed using the pixel values of the parallax detection pixels 230. In other words, in the image pickup unit 400, a focal point detection method of phase difference detection system is achievable, and automatic focus with high accuracy at high speed is accordingly achievable.

Incidentally, in the figure, although the description is given assuming that the focus determination line is one line for convenience of description, the number of lines is not limited thereto, and a plurality of lines may be used to improve accuracy.

[Operation Example of Image Pickup Unit]

Next, operation of the image pickup unit 400 according to the second embodiment of the technology is described with reference to figures.

FIG. 15 is a flowchart illustrating an example of an image pickup processing procedure when a stereoscopic picture is captured by the image pickup unit 400 according to the second embodiment of the technology. Note that the flowchart of the example of the image pickup processing procedure illustrated in the figure is a modification of the flowchart of the example of the image pickup processing procedure according to the first embodiment of the technology illustrated in FIG. 10. A difference point therebetween is the fact that the focusing processing (step S904) illustrated in FIG. 10 is changed to focusing processing (step S940). Therefore, the processing other than the focusing processing (step S940) is illustrated with use of like numerals and description thereof will be omitted, and the focusing processing (step S940) will be described with reference to FIG. 16.

FIG. 16 is a flowchart illustrating an example of a processing procedure of the focusing processing (step S940) in the image pickup processing procedure according to the second embodiment of the technology.

First, an image of the object is captured by the image pickup device 200, and a picture used for focus determination is captured (step S941). Subsequently, the focus determination section 410 determines the direction (the row direction or the column direction) of lines of the parallax detection pixels that generates the pair of images, according to the object to be focused (step S942). Then, the position of the parallax detection pixels (for example, the focus determination line 421 in FIG. 14) that is used for comparison between the pair of images is determined according to the position of the object to be focused (the position of the focus region) (step S943).

Then, the pair of images is generated from the pixel values of the pixel circuits in the parallax detection pixels at the determined position where the pair of images is compared with each other (step S944). After that, a distance between edges of the pair of generated images is detected, and the defocusing amount is calculated from the distance (step S945). Subsequently, the drive section 170 calculates the drive amount of the focus lens 113 based on the calculated defocusing amount (step S945). Then, the focus lens 113 is driven based on the calculated drive amount (step S947), and thus the focusing processing procedure is ended.

As described above, according to the second embodiment of the technology, the focus determination by the phase difference detection is allowed to be performed based on the pixel values of the nine pixel circuits configuring the parallax detection pixel. In other words, according to the second embodiment of the technology, it is possible to realize the image pickup unit that generates a 3D picture with the high number of pixels and performs automatic focus with high accuracy at high speed by the phase difference detection.

3. Modifications

In the first and second embodiments of the technology, an example of the image pickup device 200 in which the parallax detection pixels 230 are arranged in lines in the row direction and the column direction has been described. However, the arrangement of the parallax detection pixels 230 is not limited thereto, and any other arrangement is possible as long as the parallax of the object is acquired. Therefore, examples of the arrangement of the parallax detection pixels different from the arrangement of the first and second embodiments will be described as a first modification and a second modification with reference to FIG. 17 and FIG. 18, respectively.

Moreover, in the first and second embodiments of the technology, as illustrated in (b) of FIG. 4, the case where the two microlens layers are provided and the microlens collecting light on each pixel circuit is formed in the microlens layer close to the color filter (close to the photodetector) has been described. However, the technology is not limited thereto, and various examples are conceivable in terms of arrangement of the microlenses. For example, the case where the microlens collecting light on each pixel circuit is formed in the same layer as the layer of the parallax-detection-use microlens is conceivable. In addition, by setting a distance between the parallax-detection-use microlens and the nine photodetectors of the parallax detection pixel to be variable, the image pickup unit with interchangeable image pickup lens (for example, a single-lens reflex camera) may handle image pickup lenses with various f-numbers. Therefore, examples of an arrangement of microlenses different from the arrangement of the first and second embodiments will be described as third to fifth modifications with reference to FIG. 19.

Moreover, in the first and second embodiments of the technology, the parallax detection pixel having the nine pixel circuits provided with the G-filter has been described as an example. However, this is not limitative. Examples of a parallax detection pixel different from the parallax detection pixel of the first and second embodiments will be described as sixth to ninth modifications with reference to FIG. 20.

[Modifications of Arrangement of Pixels in Image Pickup Device]

FIG. 17 is a diagram schematically illustrating an example of an image pickup device in which parallax detection pixels are arranged in lines only in a row direction, as a first modification of the first and second embodiments of the technology.

In (a) of the figure, a region (a region 810) corresponding to the region 250 in (b) of FIG. 2 is illustrated. In other words, heavy lines (parallax detection pixel lines 811) in the region 810 indicate lines in which the parallax detection pixels are arranged. As illustrated by the parallax detection pixel lines 811, the parallax detection pixels are arranged in lines only in a row direction in an arbitrarily pixel cycle in the modification.

(b) of FIG. 17 is an enlarged view of a region 815 illustrated in (a) of the figure and illustrates the region corresponds to the region 210 in (a) of FIG. 2, and illustrates the fact that the parallax detection pixels are arranged in lines only in the row direction.

In the image pickup unit (for example, a camcorder) that is rarely used for the vertical shooting, even if the parallax detection pixels are arranged in lines in a column direction, the parallax detection pixels are hardly used for parallax detection. Therefore, the number of parallax detection pixels are decreased to increase the number of picture generation pixels by arranging the line of the parallax detection pixels only in the row direction, and thus it is possible to improve the quality of the captured picture, and to lighten the interpolation processing of the pixel values at the positions of the parallax detection pixels.

FIG. 18 is a diagram schematically illustrating an example of an image pickup device in which parallax detection pixels are arranged (arranged in an island shape) in the row direction and the column direction with respective predetermined intervals as the second modification of the technology.

In (a) of the figure, a region (a region 820) corresponding to the region 250 in (b) of FIG. 2 is illustrated. In the region 820, a black spot (a spot 821) indicates a position where one parallax detection pixel is disposed. In other words, as illustrated by the spot 821, in the modification, the parallax detection pixels are arranged (arranged in an island shape) in the row direction and the column direction with predetermined intervals.

(b) of FIG. 18 is an enlarged view of a region 825 illustrated in (a) of the figure, and illustrates a region corresponding to the region 210 in (a) of FIG. 2. The figure illustrates the fact that one parallax detection pixel is arranged in an island shape in the region 825.

As illustrated in FIG. 18, the number of parallax detection pixels is decreased to be lower than that in the first modification to further increase the number of picture generation pixels by arranging the parallax detection pixels in the row direction and the column direction with predetermined intervals, and thus it is possible to improve the quality of the captured picture, and to lighten the interpolation processing of the pixel values at the positions of the parallax detection pixels.

As described above, various patterns of the arrangement of the parallax detection pixels in the image pickup device are conceivable.

[Modification of Cross-Sectional Structure of Picture Generation Pixel and Parallax Detection Pixel]

FIG. 19 is a diagram schematically illustrating a modification of a cross-sectional structure of the picture generation pixel and the parallax detection pixel as the third to fifth modifications of the technology.

(a) of the figure illustrates, as the third modification of the technology, an example of a cross-sectional structure of an image pickup device capable of varying a distance between a parallax-detection-use microlens and nine pixel circuits of a parallax detection pixel. Note that (a) of the figure is a modification of the cross-sectional structure illustrated in (b) of FIG. 4, and is different in that a microlens layer (a parallax-detection-use microlens arrangement section 831) movable in an optical axis direction of the microlens is provided in place of the parallax-detection-use microlens layer S2 in (b) of FIG. 4. Therefore, in (a) of FIG. 19, like numerals are used to designate like components in (b) of FIG. 4 to omit the description thereof, and description is given of only the parallax-detection-use microlens arrangement section 831.

The parallax-detection-use microlens arrangement section 831 is a microlens layer capable of varying the distance between the parallax-detection-use microlens 231 and the photodetectors of the pixel circuits in the parallax detection pixel by moving in the optical axis direction of the microlens. Specifically, an air layer (an air layer 832) is present between the image pickup device and the parallax-detection-use microlens arrangement section 831. In this way, by allowing the distance between the parallax-detection-use microlens 231 and the photodetectors of the pixel circuits in the parallax detection pixel to be variable, the image pickup unit may handle interchangeable lenses with different f-numbers and different focal lengths.

(b) of FIG. 19 illustrates an example of a cross-sectional structure of an image pickup device in which a microlens collecting object light on a photodetector of a picture generation pixel is provided also in a parallax-detection-use microlens layer, as the fourth modification of the technology. Configurations other than the microlens (a microlens 833) provided in the parallax-detection-use microlens layer for collecting the object light on the photodetector of the picture generation pixel are the same as those in (b) of FIG. 4, and thus description thereof is omitted in (b) of FIG. 19.

The microlens 833 is a microlens having a curvature different from that of the parallax-detection-use microlens. Even in the case where imaging by the parallax detection pixel is prioritized and focus is adjusted, the object light is appropriately collected on the microlens 261 of the picture generation pixel with the provided microlens 833. In other words, with the provided microlens 833, the microlens 261 appropriately collects the object light on the photodetector, and thus it is possible to prevent deterioration of light collection efficiency of the picture generation pixel. Accordingly, it is possible to improve the picture quality.

(c) of FIG. 19 illustrates an example of a cross-sectional structure of an image pickup device not including the microlens layer S1 of the image pickup device in (b) of the figure, as the fifth modification of the technology. When parallax is detected only by the parallax-detection-use microlens 231 as well as the object light is collected on the photodetector of the picture generation pixel only by the microlens 833, the microlens layer S1 may be omitted.

As described above, various patterns of the arrangement of the microlenses in the image pickup device are conceivable.

[Example of Parallax Detection Pixel]

FIG. 20 is a schematic diagram illustrating modifications of the parallax detection pixel as sixth to ninth modifications of the technology.

(a) of the figure illustrates a parallax detection pixel (a parallax detection pixel 841) in which components allowing light within a visible light range to pass therethrough (for example, a transparent layer and a W filter) are provided in a color filter layer, as the sixth modification of the technology.

(b) of the figure illustrates a parallax detection pixel (a parallax detection pixel 842) provided with the R filter, as the seventh modification of the technology.

It is sufficient for the parallax detection pixel to detect parallax, and thus it is only necessary to set the filter of the parallax detection pixel according to the purpose. For example, as illustrated in (a) of the figure, parallax information less depending on color is obtainable by providing components that allow all light within the visible light range to pass therethrough. In addition, when the components allow all light within the visible light range to pass therethrough, a neutral density filter may be provided to adjust exposure because the light amount is possibly too much compared with the picture generation pixel.

In addition, as illustrated in (b) of the figure, color filters other than the G filter may be provided in the parallax detection pixel.

(c) of the figure illustrates a parallax detection pixel (a parallax detection pixel 843) configured of a lot of pixel circuits, as the eighth modification of the technology. The parallax detection pixel 843 is configured of pixel circuits of five rows and five columns (pixel circuits 1 to 25). In addition, color filters of three primary colors (R filter, G filter, and B filter) are arranged based on Bayer arrangement in the pixel circuits 1 to 25.

As illustrated in (c) of the figure, one parallax detection pixel is configured of a lot of pixel circuits, and the color filters of three primary colors are arranged based on Bayer arrangement, and therefore parallax information including color information is obtainable.

(d) of the figure illustrates a parallax detection pixel (a parallax detection pixel 844) configured of pixel circuits of two rows and two columns, as the ninth modification of the technology. In this way, the parallax detection pixel 844 may be configured of pixel circuits of two rows and two columns. In this case, compared with the case where the parallax detection pixel is configured of pixel circuits of three rows and three columns, the number of pixel circuits used in one parallax detection pixel is allowed to be decreased, and the number of picture generation pixels and the number of parallax detection pixels are allowed to be increased. In other words, it is possible to improve picture quality by increasing the number of picture generation pixels, and to improve accuracy of the parallax detection by increasing the number of parallax detection pixels.

4. Third Embodiment

In the first and second embodiments of the technology, the image pickup unit that generates a stereoscopic picture with use of the parallax detection pixels arranged in lines in the image pickup device has been described. The image pickup unit described in the first and second embodiments is a monocular image pickup unit.

In the monocular image pickup unit, stereoscopic effect of the stereoscopic picture depends on a distance (base-line length) between a centroid position of a region of the exit pupil where left-eye light passes and a centroid position of a region of the exit pupil where right-eye light passes. The parallax amount increases as the base-line length is longer, and as a result, the stereoscopic effect of the stereoscopic picture is increased.

The parallax detection pixel illustrated in the first and second embodiments is configured of pixel circuits of three rows and three columns. When parallax in the lateral direction is detected, the distance between the centroid position in the exit pupil of the object light received by the left pixel circuits and the centroid position in the exit pupil of the object light received by the right pixel circuits is a base-line length. In other words, to increase the base-line length, it is necessary to provide an image pickup lens with low f-number (large exit pupil) or to provide an image pickup lens with a long focal length. The f-number is a parameter for setting brightness, and the focal length is a parameter for setting an angle of view. Therefore, these are not intended to be set freely only for the base-line length.

For example, at the time of shooting a bright scene, when the shooting is performed while the diaphragm is stopped down to increase the f-number (to decrease the size of the exit pupil), a favorable picture without halation is obtainable, whereas the base-line length is decreased and stereoscopic effect is impaired. In addition, at the time of shooting the bright scene, when the shooting is performed while the diaphragm is opened to decrease the f-number for the base-line length, the base-line length is increased and the stereoscopic effect is increased, whereas halation occurs to deteriorate the picture quality.

In other words, it is desirable to provide a monocular image pickup unit that achieves freely change both in base-line length and in brightness. Therefore, in the third embodiment of the technology, an example of a monocular image pickup unit that detects parallax in the horizontal shooting and is provided with a diaphragm capable of adjusting base-line length and brightness is described with reference to FIG. 21 to FIG. 29.

[Example of Functional Configuration of Image Pickup Unit]

FIG. 21 is a block diagram illustrating an example of a functional configuration of an image pickup unit 500 according to a third embodiment of the technology.

The image pickup unit 500 illustrated in the figure includes a diaphragm 510 in place of the diaphragm 112 of the image pickup unit 100 illustrated in FIG. 1. In addition, the image pickup unit 500 includes a base-line length setting section 520 and a diaphragm drive setting section 530 in addition to the components of the image pickup unit 100. Moreover, the image pickup unit 500 is not provided with the posture detection section 140 of the image pickup unit 100. The diaphragm 510, the base-line length setting section 520, and the diaphragm drive setting section 530 are described in FIG. 21.

Incidentally, it is assumed that the image pickup unit 500 is used only in the horizontal shooting. Therefore, it is assumed that the parallax detection pixels in the image pickup device 200 of the image pickup unit 500 are arranged in lines only in the row direction of the image pickup device 200 as illustrated in (b) of FIG. 17. Further, it is assumed that each of the parallax detection pixels in the image pickup device 200 of the image pickup unit 500 is configured of pixel circuits of two rows and two columns as illustrated in (d) of FIG. 20. In other words, it is assumed that the parallax detection pixel is capable of dividing an exit pupil into a left part and a right part.

Moreover, the diaphragm 510 described in the third embodiment is applicable to an image pickup unit that divides an exit pupil with use of any means (for example, a polarization device, a shutter, a mirror, optical vector information, or the like) into a left part and a right part to generate a stereoscopic picture. In other words, the third embodiment is not limited to the image pickup unit that generates a stereoscopic picture with use of the parallax detection pixels described in the first and second embodiments of the technology. In the third embodiment of the technology, however, description is given of the diaphragm 510 provided in the image pickup unit that generates a stereoscopic picture with use of the parallax detection pixels.

The diaphragm 510 is a shielding component that varies degree of an aperture by drive of the drive section 170 and accordingly adjusts a base-line length and a light amount of object light entering the image pickup device 200. The diaphragm 510 is capable of adjusting the position of the aperture to set the base-line length, and is capable of varying the degree of the aperture at the set base-line length to adjust the light amount of the object light. In other words, the diaphragm 510 is capable of setting increase and decrease of the light amount of the object light and the length of the base-line length independently. Note that the diaphragm 510 will be described with reference to FIG. 22 to FIG. 25.

The base-line length setting section 520 sets the base-line length adjusted by the diaphragm 510. For example, the base-line length setting section 520 calculates the base-line length according to the strength of the stereoscopic effect specified by a user through the operation receiving section 120, and supplies information related to the calculated base-line length (base-line length information) to the diaphragm drive setting section 530.

The diaphragm drive setting section 530 sets an aperture state of the diaphragm 510. For example, the diaphragm drive setting section 530 calculates an appropriate light amount (automatic exposure (AE)) based on picture data supplied from the image pickup device 200. Then, the diaphragm drive setting section 530 determines the aperture state of the diaphragm 510 based on the base-line length information supplied from the base-line setting section 520 and the calculated light amount. In other words, the diaphragm drive setting section 530 sets the aperture state of the diaphragm 510 to control increase and decrease of the light amount of the object light and the length of the base-line length independently. The diaphragm drive setting section 530 supplies information related to the determined aperture state (diaphragm aperture state information) to the drive section 170, and causes the drive section 170 to drive the diaphragm 510.

[Example of Diaphragm]

FIG. 22 is a diagram schematically illustrating an example of the diaphragm 510 according to the third embodiment of the technology.

The diaphragm 510 includes a first diaphragm that is configured of two blades forming an outer frame of an aperture of the diaphragm and a second diaphragm that shields light vertically at the center of the diaphragm and in the vicinity thereof to generate right and left apertures. In (a) of the figure, the diaphragm 510 in a state where two apertures are formed by the first diaphragm and the second diaphragm is illustrated. In addition, in (b) of the figure, only the first diaphragm (a first diaphragm 511) is illustrated to illustrate the shape of two blades of the first diaphragm. Then, in (c) of the figure, only the second diaphragm (a second diaphragm 515) is illustrated to illustrate the shape of two blades of the second diaphragm.

(a) of FIG. 22 illustrates the diaphragm 510 in a state where two apertures are formed by four blades (a first diaphragm upper blade 512, a first diaphragm lower blade 513, a second diaphragm upper blade 516, and a second diaphragm lower blade 517) configuring the diaphragm 510. In addition, (a) of the figure illustrates centroid positions (centroids P1 and P2) of the two apertures formed by the four blades and a distance between the two centroids (a base-line length L21).

(b) of the figure illustrates only the two blades (the first diaphragm upper blade 512 and the first diaphragm lower blade 513) configuring the first diaphragm (the first diaphragm 511). The first diaphragm upper blade 512 and the first diaphragm lower blade 513 are arranged so that triangular concave cutouts face to each other. Note that the triangular concave cutout is formed so that an apex of the triangular cutout is located on a line that is a straight line orthogonal to the parallax direction (the lateral direction) and passes through the stop points of the base-line length. As illustrated in (b) of the figure, each of the pair of blades (the first diaphragm upper blade 512 and the first diaphragm lower blade 513) of the first diaphragm 511 is a planar light shielding member so as to form an aperture of the diaphragm into a square rotated by 45 degrees.

In addition, (c) of the figure illustrates only the two blades (the second diaphragm upper blade 516 and the second diaphragm lower blade 517) configuring the second diaphragm (the second diaphragm 515). As illustrated in (c) of the figure, each of the pair of blades (the second diaphragm upper blade 516 and the second diaphragm lower blade 517) of the second diaphragm 515 is a planar light shielding member that projects from top and bottom to shield light at the center of the diaphragm 510 and in the vicinity thereof. The second diaphragm upper blade 516 and the second diaphragm lower blade 517 are arranged so that triangular (mountain-shaped) convex projections face to each other. Note that the triangular convex projection is formed so that an apex of the triangular cutout is located on a line that is a straight line perpendicular (orthogonal) to the parallax direction and passes through the stop points of the base-line length. The pair of blades of the second diaphragm 515 has a shape in which the light-shielding area gradually increases from the center of the diaphragm 510 toward both right and left ends while projecting. In the figure, as an example, a square light shielding member rotated by 45 degrees is illustrated.

As illustrated in (a) to (c) of the figure, the diaphragm 510 is configured of the two blades (the first diaphragm upper blade 512 and the first diaphragm lower blade 513) of the first diaphragm 511 and the two blades (the second diaphragm upper blade 516 and the second diaphragm lower blade 517) of the second diaphragm 515. Therefore, the diaphragm 510 forms a pair of apertures adjacent to each other in the parallax direction. In addition, the first diaphragm 511 forms half part of edge (a left half of the edge of the left aperture and a right half of the edge of the right aperture) corresponding to both sides (both ends) in the parallax direction of both apertures, of the edges (peripheral edges) of the pair of apertures. The second diaphragm 515 forms half part of edge (a right half of the edge of the left aperture and a left half of the edge of the right aperture) corresponding to the inside (the side where the pair of apertures is closed to each other) in the parallax direction of both apertures, of the edges of the pair of apertures. In other words, out of the peripheral edges of the pair of apertures, the first diaphragm 511 forms end parts of the peripheral edges corresponding to both ends in the parallax direction, and the second diaphragm 515 forms closed parts of the peripheral edges that are close to each other between the pair of apertures. Note that each of the cutouts of the first diaphragm 511 and the projections of the second diaphragm 515 is a triangle in which an apex thereof is located on a line that is a straight line perpendicular (orthogonal) to the parallax direction and passes through the stop points of the base-line length, and thus the shapes of the pair of the apertures are the same as each other.

Next, change in the aperture shape caused by drive of the first diaphragm 511 and the second diaphragm 515 of the diaphragm 510 is described with reference to FIG. 23 to FIG. 25.

[Example of Varying Aperture Area with Constant Base-Line Length]

FIG. 23 is a diagram schematically illustrating a driving direction of the first diaphragm 511 and the second diaphragm 515 when the diaphragm 510 according to the third embodiment of the technology is driven so that only an aperture area is varied with a constant base-line length.

(a) of the figure illustrates the diaphragm 510 before driving (referred to as a normal state).

(b) of the figure illustrates the diaphragm 510 that is driven so that the aperture area is decreased with the constant base-line length. As illustrated in (b) of the figure, the drive of the diaphragm 510 for decreasing the aperture area with the constant base-line length (the base line length L31) is performed by topping down the first diaphragm (in a first diaphragm operation direction 551) and stopping down the second diaphragm (in a second diaphragm operation direction 552).

(c) of the figure illustrates the diaphragm 510 that is driven so that the aperture area is increased with the constant base-line length. As illustrated in (c) of the figure, the drive of the diaphragm 510 for increasing the aperture area with the constant base-line length (the base-line length L31) is performed by opening the first diaphragm (in a first diaphragm operation direction 553) and opening the second diaphragm (in a second diaphragm operation direction 554).

Specifically, as illustrated in (b) and (c) of the figure, when the light amount is increased and decreased while the base-line length is fixed, according to the movement of the positions of the edges formed by the first diaphragm in the parallax direction, the positions of the edges formed by the second diaphragm in the parallax direction are moved in a direction opposite to the moving direction of the positions of the edges of the first diaphragm, by the same amount as the moving amount of the positions of the edges of the first diaphragm. Therefore, a right end of the left aperture and a left end of the left aperture are moved in opposite directions by the same amount, according to the movement of the left end of the left aperture, as well as a left end of the right aperture and a right end of the right aperture are moved in opposite directions by the same amount, according to the movement of the right end of the right aperture. The setting of the edges of the apertures is achievable by driving the first diaphragm and the second diaphragm in the same direction, as illustrated in (b) and (c) of the figure. In this way, by setting the apertures of the diaphragm 510, it is possible to increase and decrease the light amount without changing the centroid position of each of the apertures.

[Example of Varying Base-Line Length with Constant Aperture Area]

FIG. 24 is a diagram schematically illustrating a driving direction of the first diaphragm 511 and the second diaphragm 515 when the diaphragm 510 according to the third embodiment of the technology is driven so that only the base-line length is varied with a constant aperture area.

(a) of the figure illustrates the diaphragm 510 in a normal state.

(b) of the figure illustrates the diaphragm 510 that is driven so that the base-line length is decreased from the normal state (from the base-line length L31 to a base-line length L32) with the constant aperture area. As illustrated in (b) of the figure, the drive of the diaphragm 510 for decreasing the base-line length with the constant aperture area is performed by stopping down the first diaphragm (in a first diaphragm operation direction 561) and opening the second diaphragm (in a second diaphragm operation direction 562).

(c) of the figure illustrates the diaphragm 510 that is driven so that the base-line length is increased from the normal state (from the base-line length L31 to a base-line length L33) with the constant aperture area. As illustrated in (c) of the figure, the drive of the diaphragm 510 for increasing the base-line length with the constant aperture area is performed by opening the first diaphragm (in a first diaphragm operation direction 563) and stopping down the second diaphragm (in a second diaphragm operation direction 564).

Specifically, as illustrated in (b) and (c) of the figure, when the base-line length is varied while the light amount is fixed, according to the movement of the positions of the edges formed by the first diaphragm in the parallax direction, the positions of the edges formed by the second diaphragm in the parallax direction are moved in a direction same as the moving direction of the positions of the edges of the first diaphragm, by the same amount as the moving amount of the positions of the edges of the first diaphragm. Therefore, the right end of the left aperture and the left end of the left aperture are moved in the same direction by the same amount, according to the movement of the left end of the left aperture, as well as the left end of the right aperture and the right end of the right aperture are moved in the same direction by the same amount, according to the movement of the right end of the right aperture. The setting of the edges of the apertures is achievable by driving the first diaphragm and the second diaphragm in opposite directions, as illustrated in (b) and (c) of the figure. Accordingly, a length between the right end and the left end of the left aperture and a length between the right end and the left end of the right aperture are allowed to be fixed, and thus the aperture area of the aperture is allowed to be fixed. In this way, by setting the apertures of the diaphragm 510, it is possible to change the centroid position of each of the apertures without varying the aperture area.

[Example of Opening Second Diaphragm to Make One Aperture]

FIG. 25 is a diagram schematically illustrating a case where the aperture of the diaphragm 510 according to the third embodiment of the technology is formed into a shape suitable for capturing a planar picture.

(a) of the figure illustrates the diaphragm 510 in the normal state.

(b) of the figure illustrates the diaphragm 510 that is driven so as to form the aperture into a shape suitable for capturing a planar picture. As illustrated in (b) of the figure, the diaphragm 510 has one aperture similarly to an existing diaphragm, by releasing the second diaphragm (in a second diaphragm driving direction 571).

Specifically, as illustrated in FIG. 23 and FIG. 24, in the diaphragm 510, it is possible to set the aperture area (f-number) of the aperture and the base-line length (stereoscopic effect) independently by moving the first diaphragm and the second diaphragm individually. For example, in shooting an extremely bright scene, to decrease the brightness with the constant base-line length, the first diaphragm and the second diaphragm are both stopped down as illustrated in (b) of FIG. 23. Moreover, to enhance the stereoscopic effect while maintaining brightness, the first diaphragm is opened and the second diaphragm is stopped down as illustrated in (c) of FIG. 24.

Further, as illustrated in FIG. 25, in capturing not a stereoscopic picture but a planar picture, the second diaphragm is released to make one aperture, and the aperture area is controlled by the first diaphragm. As a result, the diaphragm is allowed to be used like an existing diaphragm.

As described above, the setting of the stereoscopic effect (3D intensity) is achievable by the diaphragm 510. In addition, according to the third embodiment of the technology in which the parallax detection pixels and the picture generation pixels are arranged in the image pickup device 200, a 2D picture (a planar picture) is allowed to be generated based on the pixel values of the picture generation pixels. In other words, providing the diaphragm 510 in the image pickup unit allows a user to select a picture to be captured (2D picture or 3D picture) or to set stereoscopic effect.

Therefore, an example of a setting screen (a user interface) when a user sets a picture and 3D intensity is described with reference to FIG. 26.

[Example of Setting Screen in Display Section]

FIG. 26 is a diagram schematically illustrating a setting screen of a picture to be captured and a setting screen of 3D intensity that are displayed on the display section 151 according to the third embodiment of the technology.

In (a) of the figure, a setting screen (a setting screen 580) in which a user sets whether to capture a 2D picture or a 3D picture is illustrated. In the setting screen 580, a radio button (a radio button 582) to select a 3D picture mode for capturing a 3D picture, and a radio button (a radio button 583) to select a 2D picture mode for capturing a 2D picture are illustrated. Further, a determination button (ENTER button 584) to determine a selection and a button (BACK button 585) to cancel change of the selection are also illustrated.

In the setting screen 580, when the 3D picture mode is selected by the user, the control of the diaphragm suitable for capturing a 3D picture is performed as illustrated in FIG. 23 and FIG. 24. On the other hand, when the 2D picture mode is selected by the user, the second diaphragm is released and the control of the diaphragm suitable for capturing a 2D picture (a control similar to a control of an existing diaphragm) is performed as illustrated in FIG. 25.

In this way, the image pickup unit 500 allows the user to select a 2D picture or a 3D picture as a picture to be captured.

(b) of FIG. 26 illustrates a setting screen (a setting screen 590) in which the user sets 3D intensity (3D level). In the setting screen 590, a slide bar (a slide bar 591) indicating the 3D level, a determination button (ENTER button 594) for determining a selection, and a button (BACK button 595) for canceling the change of the selection are illustrated. In addition, in the slide bar 591, a bar (a bar 592) indicating the 3D level currently set.

In the setting screen 590, the user is allowed to select the 3D level by sliding the bar 592. When the 3D level is weakened (the bar 592 is moved toward "weak" of the slide bar 591), the diaphragm 510 is controlled so that the base-line length is decreased as illustrated in (b) of FIG. 24. On the other hand, the 3D level is increased (the bar 592 is moved toward "strong" of the slide bar 591), the diaphragm 510 is controlled so that the base-line length is increased as illustrated in (c) of FIG. 24.

As described above, the image pickup unit 500 allows the user to select the 3D level.

[Modification of 3D Level by Variation of Base-Line Length]

FIG. 27 is a diagram schematically illustrating change of an image caused by variation of the base-line length in the diaphragm 510 according to the third embodiment of the technology.

(a) and (b) of the figure schematically illustrate an optical path from an object to be captured and an imaging position of the object to be captured on an imaging surface when the diaphragm 510 is controlled so that the base-line length is increased. In addition, (c) and (d) of the figure schematically illustrate an optical path from the object to be captured and an imaging position of the object to be captured on the imaging surface when the diaphragm 510 is controlled so that the base-line length is decreased.

Note that (a) and (c) of the figure correspond to (a) of FIG. 6, and illustrate an optical path of object light that passes through an aperture plane (a left-eye aperture plane) corresponding to a left eye of the diaphragm 510 of the object light from the object to be captured, and an imaging position on the imaging surface. Likewise, (b) and (d) of FIG. 27 correspond to (b) of FIG. 6, and illustrate an optical path of the object light that passes through an aperture plane (a right-eye aperture plane) corresponding to a right eye of the diaphragm 510 of the object light from the object to be captured, and an imaging position on the imaging surface. Therefore, the same components as those in (a) and (b) of FIG. 6 are attached with the same reference numerals as those of FIG. 6, and description thereof will be omitted.

A pupil E21 illustrated in (a) to (d) of FIG. 27 schematically illustrates a shape of an exit pupil (that is, a shape of an image pickup lens) when both the first diaphragm and the second diaphragm of the diaphragm 510 are released, and corresponds to the exit pupil E1 in FIG. 6. Exit pupils E31 and E32 in (a) and (b) of FIG. 27 illustrate a pair of exit pupils (the exit pupil E31 illustrates an exit pupil of the left-eye aperture plane, and the exit pupil E32 illustrates an exit pupil of the right-eye aperture plane) when the diaphragm 510 is controlled so that the base-line length is increased. Likewise, exit pupils E41 and E42 in (c) and (d) of the figure illustrate a pair of exit pupils (the exit pupil E41 illustrates an exit pupil of the left-eye aperture plane, and the exit pupil E42 illustrates an exit pupil of the right-eye aperture plane) when the diaphragm 510 is controlled so that the base-line length is decreased. In addition, in (a) to (d) of the figure, an optical path of light from the focused object 271 and an optical path of light from the close positioned object 272 are indicated by dashed lines and solid lines (lines L51 to L58) extending from respective objects.

As illustrated in (a) and (b) of FIG. 27, when the base-line length is increased (the left aperture plane and the right aperture plane are away from each other), the displacement amount of the imaging positions that are displaced according to the defocusing amount is increased, and thus stereoscopic effect is enhanced. On the other hand, as illustrated in (c) and (d) of the figure, when the base-line length is decreased (the left aperture plane and the right aperture plane are close to each other), the displacement amount of the imaging positions that are displaced according to the defocusing amount is decreased, and thus the stereoscopic effect is diminished.

As described above, providing the diaphragm 510 enables adjustment of the stereoscopic effect.

[Modification of Aperture Plane in Diaphragm]

FIG. 28 is a diagram schematically illustrating a difference between the aperture plane of the diaphragm 510 according to the third embodiment of the technology and an aperture plane of an existing diaphragm.

(a) of the figure illustrates change of the aperture plane by opening and closing a diaphragm (a diaphragm 190) provided in an existing image pickup unit. The diaphragm 190 is configured of a pair of blades (a diaphragm upper blade 191 and a diaphragm lower blade 192), and an area of the aperture plane is adjusted by moving the pair of blades (light shielding members) in opposite directions. In the existing diaphragm 190, the base-line length is long when the aperture area is large (see a base-line length L91 illustrated in (a) of the figure), whereas the base-line length is short when the aperture area is small (see a base-line length L92 in (a) of the figure).

(b) of the figure illustrates change of the aperture by opening and closing the diaphragm 510 according to the third embodiment of the technology. Note that a diagram illustrated in (b) of the figure is a diagram collecting FIG. 23 and FIG. 24. Therefore, in (b) of FIG. 28, the same reference numerals as those in FIG. 23 and FIG. 24 are attached, and detailed description is omitted here.

As illustrated in (b) of FIG. 28, the brightness (a size of the aperture area) and the base-line length (the distance between the centroids of the pair of apertures) are allowed to be independently controlled by the diaphragm 510.

[Operation Example of Image Pickup Unit]

Next, operation of the image pickup unit 500 according to the third embodiment of the technology is described with reference to the drawings.

FIG. 29 is a flowchart illustrating an example of an image pickup processing procedure when a stereoscopic picture is captured by the image pickup unit 500 according to the third embodiment of the technology. Note that the flowchart of the example of the image pickup processing procedure illustrated in the figure is a modification of the flowchart of the example of the image pickup processing procedure according to the first embodiment of the technology illustrated in FIG. 10. Therefore, like numerals are used to designate substantially like processes of the first embodiment, and the description is given of an example of an added processing procedure related to automatic exposure.

When it is determined that a starting instruction of image pickup operation of a stereoscopic picture is issued by a user (step S901), the base-line length is set based on the intensity of the stereoscopic effect specified by the user in advance, and the diaphragm 510 is driven according to the set base-line length (step S961). Then, the procedure proceeds to step S902, and display of live viewing is performed.

In addition, after the focusing processing is performed (step S904), the diaphragm drive setting section 530 adjusts exposure based on the picture captured at the time of the focusing processing, and thus automatic exposure processing in which the diaphragm 510 is controlled is performed (step S962). Then, after step S962, the procedure proceeds to step S905, and it is determined whether the shutter button is fully pushed or not.

As described above, according to the third embodiment of the technology, the brightness (the size of the aperture area) and the base-line length (the distance between the centroids of the pair of apertures) are allowed to be independently controlled. Note that, in the third embodiment of the technology, although the description is given on an assumption that the first diaphragm includes the two blades (light shielding members) and the second diaphragm includes the two blades, the configuration is not limited thereto. Any other types of a first diaphragm may be used as long as the first diaphragm is opened and closed so that an aperture area is decreased (the f-number is small) from an outer periphery of the diaphragm toward the center thereof. Increasing the number of blades changes the aperture shape from a square shape rotated by 45 degrees to a circular shape. In addition, any other types of a second diaphragm may also be used as long as the second diaphragm shields light at the center of the diaphragm and in the vicinity thereof to form a pair of apertures, and it is conceivable that using two or more blades changes the shape of each of the pair of apertures to a circular shape.

5. Fourth Embodiment

In the third embodiment of the technology, the diaphragm (the diaphragm 510) in which the brightness and the base-line length are freely set when the horizontal shooting is performed by the image pickup unit has been described. However, when the vertical shooting is performed as described in the first embodiment of the technology, it is necessary to release the second diaphragm and use only the first diaphragm (to use the diaphragm in the same way as an existing diaphragm) in order to acquire parallax in the horizontal direction by the diaphragm 510.

Therefore, in a fourth embodiment of the technology, a diaphragm in which brightness and a base-line length are allowed to be freely set both in the horizontal shooting and in the vertical shooting will be described with reference to FIG. 30 to FIG. 32.

[Example of Functional Configuration of Image Pickup Unit]

FIG. 30 is a block diagram illustrating an example of a functional configuration of an image pickup unit 600 according to the fourth embodiment of the technology.

The image pickup unit 600 illustrated in the figure includes a diaphragm 610 in place of the diaphragm 510 of the image pickup unit 500 illustrated in FIG. 21. Moreover, the image pickup unit 600 further includes the posture detection section 140 illustrated in FIG. 1 in addition to the components of the image pickup unit 500. Note that the diaphragm 610 will be described with reference to FIG. 31 and FIG. 32.

As with the posture detection section 140 illustrated in FIG. 1, the posture detection section 140 detects the posture of the image pickup unit 600, and supplies information (posture information) related to the detected posture of the image pickup unit 600 to the parallax detection section 320 and the diaphragm drive setting section 530.

Note that the diaphragm drive setting section 530 illustrated in FIG. 30 detects whether the shooting mode is the vertical shooting or the horizontal shooting (the posture of the image pickup unit 600) based on the posture information supplied from the posture detection section 140, and sets the drive of the diaphragm 610 according to the detected posture.

[Example of Diaphragm]

FIG. 31 is a diagram schematically illustrating an example of the diaphragm 610 according to the fourth embodiment of the technology.

The diaphragm 610 includes, in addition to the first diaphragm and the second diaphragm that are the same as those in the diaphragm 510 illustrated in FIG. 22, a third diaphragm that projects in the lateral direction to shield light at the center of the diaphragm and in the vicinity thereof in order to form a pair of apertures at the top and the bottom. (a) of FIG. 31 illustrates the diaphragm 610 in a state where two apertures are formed at the top and the bottom.

In addition, (b) of the figure illustrates only the first diaphragm (the first diaphragm 511) to illustrate the shape of the two blades of the first diaphragm, and (c) of the figure illustrates only the second diaphragm (the second diaphragm 515) to illustrate the shape of the two blades of the second diaphragm. In addition, (d) of the figure illustrates only the third diaphragm (a third diaphragm 611) to illustrate the shape of the two blades of the third diaphragm.

Note that (b) and (c) of the figure are similar to (b) and (c) of FIG. 22, and thus (a) and (d) of FIG. 31 are described.

(a) of the figure illustrates the diaphragm 610 in a state where the pair of apertures is formed in the vertical direction. In the diaphragm 610, the third diaphragm is provided so that a right end of a third diaphragm left blade 612 and a left end of a third diaphragm right blade 613 are in contact with each other in the vicinity of the center of the diaphragm 610. On the other hand, the second diaphragm upper blade 516 and the second diaphragm lower blade 517 are in a released state, and are arranged so as not to shield the object light. In this way, light in the vicinity of the center of the diaphragm 610 is shielded in the lateral direction by the third diaphragm 611, and thus the pair of apertures is allowed to be formed in the vertical direction of the diaphragm 610.

(d) of the figure illustrates the two blades (the third diaphragm left blade 612 and the third diaphragm right blade 613) configuring the third diaphragm (the third diaphragm 611). As illustrated in (d) of the figure, the arrangement direction of the third diaphragm 611 corresponds to the arrangement direction obtained by rotating the arrangement direction of the second diaphragm 515 (see (c) of the figure) by 90 degrees in a clockwise direction (the drive directions thereof are orthogonal to each other). In other words, the third diaphragm left blade 612 and the third diaphragm right blade 613 are arranged so that the triangular convex projections thereof face to each other. Note that the triangular convex projection is formed so that an apex of a triangular cutout is located on a line that is a straight line parallel to the parallax direction and passes through the stop points of the base-line length.

As described above, providing the third diaphragm 611 that shields light at the center of the diaphragm 610 and in the vicinity thereof in the lateral direction forms the pair of apertures in the vertical direction.

[Modification of Aperture by Diaphragm]

FIG. 32 is a diagram schematically illustrating an example of a shape of the apertures formed by the diaphragm 610 according to the fourth embodiment of the technology.

(a) of the figure schematically illustrates a position of each blade of the diaphragm 610 in the case where the horizontal shooting is performed using the image pickup unit 600. In the case of performing the horizontal shooting, the third diaphragm (the third diaphragm left blade 612 and the third diaphragm right blade 613) is put into a released state as illustrated in (a) of the figure. In addition, as illustrated in FIG. 22 to FIG. 24, the second diaphragm (the second diaphragm upper blade 516 and the second diaphragm lower blade 517) is stopped down (closed) so as to form the pair of apertures. Then, by opening and closing the second diaphragm and the first diaphragm while remaining the third diaphragm in the released state, the brightness and the base-line length are allowed to be separately controlled in the horizontal shooting similarly to the diaphragm 510 illustrated in FIG. 22 to FIG. 24.

(b) of FIG. 32 schematically illustrates a position of each blade of the diaphragm 610 in the case where the vertical shooting is performed using the image pickup unit 600. In the case of performing the vertical shooting, the second diaphragm is put into a released state and the third diaphragm is stopped down (closed) so as to form the pair of apertures as illustrated in (b) of the figure. Then, by opening and closing the third diaphragm and the first diaphragm while remaining the second diaphragm in the released state, the opening and closing of the diaphragm are performed as with (a) of the figure except that the direction of the pair of apertures is different. In other words, as illustrated in (b) of the figure, by opening and closing the third diaphragm and the first diaphragm while remaining the second diaphragm in the released state, the brightness and the base-line length are allowed to be separately controlled in the vertical shooting.

(c) of the figure schematically illustrates a position of each blade of the diaphragm 610 in the case where a 2D picture is captured using the image pickup unit 600. In the case of capturing a 2D picture, the second diaphragm and the third diaphragm are put into a released state as illustrated in (c) of the figure. In addition, only the first diaphragm is opened and closed. As a result, a 2D picture is allowed to be captured without unnecessarily shielding object light.

As described above, according to the fourth embodiment of the technology, the brightness and the base-line length are allowed to be independently controlled both in the horizontal shooting and in the vertical shooting.

6. Modification of Diaphragm

In the third and the fourth embodiments of the technology, the diaphragm in which the pair of apertures is formed and the brightness and the base-line length are allowed to be freely set has been described. Note that, in the diaphragm described in the third and fourth embodiments, the brightness and the base-line length are allowed to be freely combined. However, it may not necessary for a simple 3D image pickup unit to have such performance. In this case, a diaphragm having a simpler configuration suitable for capturing a 3D picture is demanded.

Therefore, a diaphragm having a configuration simpler than that in the third and fourth embodiments is described with reference to FIG. 33.

[Example of Diaphragm]

FIG. 33 is a diagram schematically illustrating examples of a diaphragm having a simple configuration suitable for capturing a 3D picture as modifications of the third and fourth embodiments of the technology.

(a) and (b) of the figure each illustrate a diaphragm in which brightness is allowed to be controlled while a base-line length is maintained. (a) of the figure illustrates a diaphragm in which two blades are provided and a rectangular aperture plane that is long in a parallax (lateral) direction is formed by projections at both ends (a rectangular cutout is formed inside) in the parallax detection direction. The rectangular aperture plane of the diaphragm is formed by the two blades in which rectangular cutouts each having a long side in the parallax direction face to each other. In addition, (b) of the figure illustrates a diaphragm in which two blades are provided and a pair of apertures (squares rotated by 45 degrees) is formed in the parallax (lateral) direction by notch-cut projections (having two valleys (a pair of adjacent cutouts)). By opening and closing the diaphragm illustrated in (a) and (b) of the figure in the vertical direction (in a direction perpendicular to the parallax detection direction), the brightness is allowed to be controlled while maintaining the base-line length.

(c) and (d) of the figure each illustrate a diaphragm in which a base-line length is allowed to be longer than that of an existing diaphragm. (c) of the figure illustrates a diaphragm forming an elliptical aperture that is long in the lateral direction (in the parallax detection direction) and is short in the vertical direction. The elliptical aperture of the diaphragm is formed by two blades in which semicircular cutouts each having one side (long diameter) in the parallax direction face to each other. In addition, (d) of the figure illustrates a diaphragm forming a rhomboid aperture that is long in the lateral direction (the parallax detection direction) and is short in the vertical direction. The rhomboid aperture of the diaphragm is formed by two blades in which triangular cutouts each having a base in the parallax direction face to each other. By opening and closing the diaphragm illustrated in (c) and (d) of the figure in the vertical direction, the base-line length is allowed to be increased, compared with an existing diaphragm having a circular aperture or a diaphragm having a square aperture rotated by 45 degrees.

(e) of the figure illustrates a diaphragm in which brightness and a base-line length are independently controlled as with the third and fourth embodiment of the technology. The diaphragm is controlled more easily than that of the third and fourth embodiments. In (e) of the figure, two blades closing from both ends (a left end and a right end) in the parallax detection (lateral) direction toward the center of the diaphragm, and two blades closing from both ends (an upper end and a lower end) in the vertical direction toward the center of the diaphragm are illustrated. Note that the two blades closing from the left end and the right end toward the center of the diaphragm are paired to allow respective sides parallel to the orthogonal direction orthogonal to the parallax direction to face each other. In addition, the two blades closing from the upper end and the lower end toward the center of the diaphragm are paired to allow respective sides parallel to the parallax direction to face each other. In the diaphragm illustrated in (e) of the figure, the base-line length is increased when the right and left diaphragms are opened, and the brightness is increased when the upper and lower diaphragms are opened.

Providing such a diaphragm suitable for capturing a 3D picture in an image pickup unit enables capturing of a 3D picture providing favorable stereoscopic effects.

As described above, according to the embodiments of the technology, a favorable 3D picture is allowed to be captured. Incidentally, in the embodiments of the technology, although the description is made on an assumption that an image pickup unit captures a still picture, the technology is also embodied in an image pickup unit capturing a moving picture similarly.

Note that the above-described embodiments are to illustrate examples for embodying the technology, and subject matter in the embodiments and invention-specifying subject matter in claims have correspondence relationship. Similarly, invention-specifying subject matter in claims and subject matter attached with the same name as the invention-specifying subject matter in the embodiments of the technology have correspondence relationship. Incidentally, the technology is not limited to the embodiments, and is embodied by giving various modifications to the embodiments without departing from the scope of the technology.

In addition, the processing procedures described in the above-described embodiments may be considered as a method having the series of procedures, and may be considered as program that causes a computer to execute the series of procedures or as a recording medium holding the program. As the recording medium, for example, a compact disc (CD), a mini disc (MD), a digital versatile disk (DVD), a memory card, Blu-ray disc (registered trademark) may be used.

Note that the technology may be configured as follows.

(1) An image pickup unit including:
an image pickup device including parallax detection pixels and picture generation pixels, each of the parallax detection pixels receiving object light by a plurality of photodetectors covered by one microlens, to generate a signal used for detecting parallax, and each of the picture generation pixels receiving the object light by a photodetector covered, on a pixel basis, with a microlens smaller in size than the microlens, to generate a signal used for generating a picture; and
a stereoscopic picture generation section detecting the parallax based on the signal generated by the parallax detection pixels, generating a planar picture based on the signal generated by the picture generation pixels, and adjusting a position of each object image included in the generated planar picture, based on the detected parallax, to generate a stereoscopic picture.

(2) The image pickup unit according to (1), further including a posture detection section detecting a posture of the image pickup unit, wherein
the parallax detection pixels are arranged on a line in a row direction of the image pickup device and on a line in a column direction thereof, and
the stereoscopic picture generation section determines a detection direction of the parallax from the row direction and the column direction of the image pickup device, based on the posture detected by the posture detection section, and generates information related to the parallax, based on the signal generated by the parallax detection pixels arranged in the determined direction.

(3) The image pickup unit according to (1) or (2), further including a focus determination section performing focus determination on an object to be focused, based on the signal generated by the parallax detection pixels.

(4) The image pickup unit according to any one of (1) to (3), wherein the parallax detection pixels in the image pickup device are arranged to be adjacent to one another on a line in a specific direction.

(5) The image pickup unit according to any one of (1) to (3), wherein the parallax detection pixels in the image pickup device are arranged with predetermined intervals on a line in a specific direction.

(6) The image pickup unit according to any one of (1) to (5), further including a control section that moves the one microlens covering the plurality of photodetectors in the parallax detection pixel, in an optical axis direction of the microlens, based on a relationship between the image pickup device and a size of the exit pupil.

(7) The image pickup unit according to any one of (1) to (6), wherein the plurality of photodetectors in the parallax detection pixel are covered with one color filter.

(8) The image pickup unit according to (7), wherein the plurality of photodetectors in the parallax detection pixel are covered with a green filter, the green filter shielding light other than light within a wavelength range showing green.

(9) The image pickup unit according to (7), wherein the plurality of photodetectors in the parallax detection pixel are covered with a white filter or a transparent layer, the white filter and the transparent layer allowing light within a visible light range to pass therethrough.

(10) The image pickup unit according to any one of (1) to (9), wherein the picture generation pixel includes one photodetector on the pixel basis.

(11) The image pickup unit according to any one of (1) to (10), wherein a microlens that is for collecting the object light on a position of each of the plurality of photodetectors, covers
the plurality of photodetectors on the plurality of photodetectors basis, the object light being collected by the one microlens covering the plurality of photodetectors in the parallax detection pixel.

(12) The image pickup unit according to (11), wherein the microlenses each covering the photodetector in the picture generation pixel are arranged on one surface orthogonal to an optical axis direction of the microlens covering the plurality of photodetectors in the parallax detection pixel on the plurality of photodetectors basis.

(13) The image pickup unit according to any one of (1) to (11), wherein the microlenses each covering the photodetector in the picture generation pixel are arranged on one surface orthogonal to an optical axis direction of the one microlens covering the plurality of photodetectors in the parallax detection pixel.

(14) An image pickup device including:
parallax detection pixels each receiving object light by a plurality of photodetectors covered by one microlens, to generate a signal used for detecting parallax, the parallax being used for generating a stereoscopic picture; and
picture generation pixels each receiving the object light by a photodetector covered, on a pixel basis, with a microlens smaller in size than the microlens, to generate a signal used for generating a planar picture, the planar picture being used for generating the stereoscopic picture using the parallax.

(15) The image pickup device according to (14), wherein
the parallax is information related to a displacement amount of a position of each object image in the planar picture at a time when the position of each object image is adjusted in the parallax direction to generate the stereoscopic picture, and
the parallax detection pixels are arranged on a line in the parallax direction.

(16) A picture processing method including:
a step of detecting parallax based on a signal generated by parallax detection pixels in an image pickup device, the image pickup device including the parallax detection pixels and picture generation pixels, the parallax detection pixels generating a signal used for detecting parallax by a plurality of photodetectors covered by one microlens, the picture generation pixels each receiving object light to generate a signal used for generating a planar picture;
a step of generating the planar picture based on the signal generated by the picture generation pixels in the image pickup device; and
a step of adjusting a position of each of captured objects in the planar picture, based on the detected parallax, to generate a stereoscopic picture.

(17) A program causing a computer to execute:
a step of detecting parallax based on a signal generated by parallax detection pixels in an image pickup device, the image pickup device including the parallax detection pixels and picture generation pixels, the parallax detection pixels generating a signal used for detecting parallax by a plurality of photodetectors covered by one microlens, the picture generation pixels each receiving object light to generate a signal used for generating a planar picture;
a step of generating the planar picture based on the signal generated by the picture generation pixels in the image pickup device; and
a step of adjusting a position of each of captured objects in the planar picture, based on the detected parallax, to generate a stereoscopic picture.

(18) An image pickup unit including:
a diaphragm forming a pair of apertures for generating a stereoscopic picture;
an image pickup device receiving object light that passes through each of the pair of apertures, to generate signals used for generating the stereoscopic picture; and
a control section independently controlling a distance between centroids of the pair of apertures, and increase and decrease of light amount of the object light passing through the pair of apertures.

(19) The image pickup unit according to (18), wherein
the pair of apertures is formed, in the diaphragm, to be adjacent to each other in a parallax direction of the stereoscopic picture, and
the control section changes and controls, of peripheral edges of the pair of apertures, positions of end parts of the peripheral edges corresponding to both ends in the parallax direction and positions of closed parts of the peripheral edges that are close to each other between the pair of apertures.

(20) The image pickup unit according to (19), wherein, when the light amount is increased or decreased, the control section varies a length between the end part of the peripheral edge corresponding to the end of one of the pair of apertures and the closed part of the peripheral edge thereof, and a length between the end part of the peripheral edge corresponding to the end of the other of the pair of apertures and the closed part of the peripheral edge thereof, in a state where the distance between the centroids is fixed.

(21) The image pickup unit according to (20), wherein the length between the end part of the peripheral edge corresponding to the end of the one of the pair of apertures and the closed part of the peripheral edge thereof is equal to the length between the end part of the peripheral edge corresponding to the end of the other of the pair of apertures and the closed part of the peripheral edge thereof.

(22) The image pickup unit according to any one of (19) to (21), wherein, when the distance between the centroids is varied, the control section varies the distance between the centroids in a state where the length between the end part of the peripheral edge corresponding to the end of the one of the pair of apertures and the closed part of the peripheral edge thereof is fixed.

(23) The image pickup unit according to any one of (19) to (22), further including an adjusting section adjusting the distance between the centroids, wherein
the control section controls the pair of apertures to allow the distance between the centroids to be a distance adjusted by the adjusting section.

(24) The image pickup unit according to any one of (18) to (23), wherein the diaphragm includes a first member that includes a pair of members each having a cutout and a second member that includes a pair of members each having a projection, the pair of members of the first member being disposed to allow the cutouts to face each other, and the pair of members of the second member being disposed to allow the projections to face each other.

(25) The image pickup unit according to (24), wherein the first member and the second member are driven in an orthogonal direction orthogonal to the parallax direction.

(26) The image pickup unit according to (25), wherein
the cutout has a concave shape in which an apex of a mountain shape is located on a straight line that passes through a midpoint of the distance between the centroids and is parallel to a driving direction of the first member, and
the projection has a convex shape in which an apex of a mountain shape is located on a straight line that passes through the midpoint of the distance between the centroids and is parallel to a driving direction of the second member.

(27) The image pickup unit according to any one of (18) to (23), further including a posture detection section detecting a posture of the image pickup unit, wherein
the diaphragm includes a first member, a second member shielding part of the object light in a horizontal shooting, and a third member shielding part of the object light in a vertical shooting, the first member having a pair of members each having a cutout, the pair of members of the first member being disposed to allow the cutouts to face each other, the second member having a pair of members each having a projection, the pair of members of the second member being disposed to allow the projections to face each other, the third member having a pair of members each having a projection, and the pair of the members of the third member being disposed to allow the projections to face each other,
a driving direction of the second member is orthogonal to a driving direction of the third member, and
the control section determines, based on the detected posture, whether the horizontal shooting or the vertical shooting is performed, and then controls the pair of apertures.

(28) The image pickup unit according to any one of (18) to (27), wherein the diaphragm is disposed on an optical path of the object light that is collected by a monocular lens system.

(29) An image pickup unit including:
a diaphragm configured of a pair of members each having a pair of cutouts that are adjacent to each other in a parallax direction of a stereoscopic picture, the cutouts of the respective members facing to each other to form a pair of apertures;

an image pickup device receiving object light that passes through each of the pair of apertures to generate a signal used for generating the stereoscopic picture; and a control section driving each of the pair of members in an orthogonal direction orthogonal to the parallax direction and controlling the diaphragm to allow a distance between centroids of the pair of apertures to be fixed.

(30) An image pickup unit including:

a diaphragm forming an aperture, a longitudinal direction of the aperture being a parallax direction in a stereoscopic picture;

an image pickup device receiving object light that passes through the aperture, to generate a signal used for generating the stereoscopic picture; and a control section controlling the diaphragm to allow a length of the aperture in the parallax direction to be larger than a length of the aperture in an orthogonal direction orthogonal to the parallax direction.

(31) The image pickup unit according to (30), wherein the diaphragm includes a pair of members each having a cutout, the cutouts facing to each other to form the aperture, and the control section drives each of the pair of members in the orthogonal direction to control the diaphragm.

(32) The image pickup unit according to (30), wherein the cutout has one of a rectangular shape having a long side extending in the parallax direction, a triangular shape having a base extending in the parallax direction, and a semicircular shape having one side extending in the parallax direction.

(33) The image pickup unit according to (30), wherein the diaphragm forms the aperture with use of a pair of first members and a pair of second members, the first members each having a side parallel to the parallax direction, the sides of the respective first members facing to each other, the second members each having a side parallel to the orthogonal direction, and the sides of the respective second members facing to each other.

(34) A diaphragm control method including:

a first control step of controlling a distance between centroids of a pair of apertures in a diaphragm, the diaphragm forming the pair of apertures used for generating a stereoscopic picture; and a second control step of controlling increase and decrease of a light amount of the object light that passes through the pair of apertures, independently of the distance between the centroids.

(35) A program causing a computer to execute:

a first control step of controlling a distance between centroids of a pair of apertures in a diaphragm, the diaphragm forming the pair of apertures used for generating a stereoscopic picture; and a second control step of controlling increase and decrease of a light amount of the object light that passes through the pair of apertures, independently of the distance between the centroids.

REFERENCE SIGNS LIST 100 image pickup unit
110 lens section
111 zoom lens
112 diaphragm
113 focus lens
120 operation receiving section
130 control section
140 posture detection section
151 display section
152 memory section
170 drive section
200 image pickup device
230 parallax detection pixel
300 signal processing section
310 2D picture generation section
320 parallax detection section
330 3D picture generation section
400 image pickup unit
410 focus determination section
500 image pickup unit
510 diaphragm
520 base-line length setting section
530 diaphragm drive setting section

The invention claimed is:

1. An image pickup unit comprising:

a diaphragm configured to form a pair of apertures for generating a stereoscopic picture, wherein the diaphragm includes a first member that includes a first blade and a second blade each having a cutout, and a second member that includes a third blade and a fourth blade each having a projection, the first blade and the second blade being disposed to allow the cutouts to face each other, and the third blade and the fourth blade being disposed to allow the projections to face each other, wherein the first member and the second member are driven in an orthogonal direction orthogonal to a parallax direction;

an image pickup device configured to receive object light that passes through each of the pair of apertures, to generate signals used for generating the stereoscopic picture; and a control section configured to control a distance between centroids of the pair of apertures, and an increase and decrease of a light amount of the object light passing through the pair of apertures, wherein the cutout has a concave shape in which an apex of a mountain shape is located on a straight line that passes through a midpoint of the distance between the centroids and is parallel to a driving direction of the first member, the projection has a convex shape in which an apex of a mountain shape is located on a straight line that passes through the midpoint of the distance between the centroids and is parallel to a driving direction of the second member, and the distance between the centroids and the increase and decrease of the light amount are controlled independently of one another.

2. The image pickup unit according to claim 1, wherein the pair of apertures is formed, in the diaphragm, to be adjacent to each other in a parallax direction of the stereoscopic picture, and the control section is configured to change and control, of peripheral edges of the pair of apertures, positions of end parts of the peripheral edges corresponding to both ends in the parallax direction and positions of closed parts of the peripheral edges that are close to each other between the pair of apertures.

3. The image pickup unit according to claim 2, wherein, when the light amount is increased or decreased, the control section varies a length between the end part of the peripheral edge corresponding to the end of one of the pair of apertures and the closed part of the peripheral edge thereof, and a length between the end part of the peripheral edge corresponding to the end of the other of the pair of apertures and the closed part of the peripheral edge thereof, in a state where the distance between the centroids is fixed.

4. The image pickup unit according to claim 3, wherein the length between the end part of the peripheral edge corresponding to the end of the one of the pair of apertures and the closed part of the peripheral edge thereof is equal to the length between the end part of the peripheral edge corresponding to the end of the other of the pair of apertures and the closed part of the peripheral edge thereof.

5. The image pickup unit according to claim 2, wherein, when the distance between the centroids is varied, the control section varies the distance between the centroids in a state where the length between the end part of the peripheral edge corresponding to the end of the one of the pair of apertures and the closed part of the peripheral edge thereof is fixed.

6. The image pickup unit according to claim 2, further comprising an adjusting section configured to adjust the distance between the centroids, wherein
the control section is configured to control the pair of apertures to allow the distance between the centroids to be a distance adjusted by the adjusting section.

7. An image pickup unit, comprising:
a diaphragm configured to form a pair of apertures for generating a stereoscopic picture, wherein the diaphragm includes a first member that includes a first blade and a second blade each having a cutout, and a second member that includes a third blade and a fourth blade each having a projection, the first blade and the second blade being disposed to allow the cutouts to face each other, and the third blade and the fourth blade being disposed to allow the projections to face each other, wherein the first member and the second member are driven in an orthogonal direction orthogonal to a parallax direction;
an image pickup device configured to receive object light that passes through each of the pair of apertures, to generate signals used for generating the stereoscopic picture; and
a control section configured to control a distance between centroids of the pair of apertures, and an increase and decrease of a light amount of the object light passing through the pair of apertures, wherein the cutout has a concave shape in which an apex of a mountain shape is located on a straight line that passes through a midpoint of the distance between the centroids and is parallel to a driving direction of the first member, the projection has a convex shape in which an apex of a mountain shape is located on a straight line that passes through the midpoint of the distance between the centroids and is parallel to a driving direction of the second member, and the distance between the centroids and the increase and decrease of the light amount are controlled independently of one another;
a posture detection section configured to detect a posture of the image pickup unit, wherein
the diaphragm includes a first member, a second member shielding part of the object light in a horizontal shooting, and a third member shielding part of the object light in a vertical shooting, the first member having a first blade and a second blade each having a cutout, the first blade and the second blade being disposed to allow the cutouts to face each other, the second member having a third blade and a fourth blade each having a projection, the third blade and the fourth blade being disposed to allow the projections to face each other, the third member having a fifth blade and a sixth blade each having a projection, and the fifth blade and the sixth blade being disposed to allow the projections to face each other,
a driving direction of the second member is orthogonal to a driving direction of the third member, and
the control section is configured to determine, based on the detected posture, whether the horizontal shooting or the vertical shooting is performed, and then to control the pair of apertures.

8. The image pickup unit according to claim 1, wherein the diaphragm is disposed on an optical path of the object light that is collected by a monocular lens system.

9. An image pickup unit comprising:
a diaphragm forming an aperture, a longitudinal direction of the aperture being a parallax direction in a stereoscopic picture;
an image pickup device receiving object light that passes through the aperture, to generate a signal used for generating the stereoscopic picture; and
a control section controlling the diaphragm to allow a length of the aperture in the parallax direction to be larger than a length of the aperture in an orthogonal direction orthogonal to the parallax direction.

10. The image pickup unit according to claim 9, wherein the diaphragm includes a pair of members each having a cutout, the cutouts facing to each other to form the aperture, and
the control section drives each of the pair of members in the orthogonal direction to control the diaphragm.

11. The image pickup unit according to claim 10, wherein the cutout has one of a rectangular shape having a long side extending in the parallax direction, a triangular shape having a base extending in the parallax direction, and a semicircular shape having one side extending in the parallax direction.

12. The image pickup unit according to claim 9, wherein the diaphragm forms the aperture with use of a pair of first members and a pair of second members, the first members each having a side parallel to the parallax direction, the sides of the respective first members facing to each other, the second members each having a side parallel to the orthogonal direction, and the sides of the respective second members facing to each other.

13. A diaphragm control method comprising:
controlling a distance between centroids of a pair of apertures in a diaphragm, the diaphragm forming the pair of apertures used for generating a stereoscopic picture, wherein the diaphragm includes a first member that includes a first blade and a second blade each having a cutout and a second member that includes a third blade and a fourth blade each having a projection, the first blade and the second blade being disposed to allow the cutouts to face each other, and the third blade and the fourth blade being disposed to allow the projections to face each other;
driving the first member and the second member in an orthogonal direction orthogonal to a parallax direction; and
controlling an increase and decrease of a light amount of object light that passes through the pair of apertures, independently of the distance between the centroids, wherein
the cutout has a concave shape in which an apex of a mountain shape is located on a straight line that passes through a midpoint of the distance between the centroids and is parallel to a driving direction of the first member, the projection has a convex shape in which an apex of a mountain shape is located on a straight line that passes through the midpoint of the distance between the centroids and is parallel to a driving direction of the second member, and the distance between the centroids and the increase and decrease of the light amount are controlled independently of one another.

14. A non-transitory computer-readable medium storing instructions that, when executed by a processor of a computer, cause the computer to execute operations comprising:

controlling a distance between centroids of a pair of apertures in a diaphragm, the diaphragm forming the pair of apertures used for generating a stereoscopic picture, wherein the diaphragm includes a first member that includes a first blade and a second blade each having a cutout, and a second member that includes a third blade and a fourth blade each having a projection, the first blade and the second blade being disposed to allow the cutouts to face each other, and the third blade and the fourth blade being disposed to allow the projections to face each other;

driving the first member and the second member in an orthogonal direction orthogonal to a parallax direction; and controlling an increase and decrease of a light amount of object light that passes through the pair of apertures, independently of the distance between the centroids, wherein the cutout has a concave shape in which an apex of a mountain shape is located on a straight line that passes through a midpoint of the distance between the centroids and is parallel to a driving direction of the first member, the projection has a convex shape in which an apex of a mountain shape is located on a straight line that passes through the midpoint of the distance between the centroids and is parallel to a driving direction of the second member, and the distance between the centroids and the increase and decrease of the light amount are controlled independently of one another.

* * * * *